(12) United States Patent
Taudien et al.

(10) Patent No.: US 9,163,858 B2
(45) Date of Patent: Oct. 20, 2015

(54) CONCENTRATING AND SPECTRUM SPLITTING OPTICAL DEVICE FOR SOLAR ENERGY APPLICATIONS

(76) Inventors: Jerker Taudien, Silver Spring, MD (US); Ludwig A. Kern, Arnold, MD (US)

( * ) Notice: Subject to any disclaimer, the term of this patent is extended or adjusted under 35 U.S.C. 154(b) by 722 days.

(21) Appl. No.: 13/544,856

(22) Filed: Jul. 9, 2012

(65) Prior Publication Data
US 2013/0016431 A1 Jan. 17, 2013

Related U.S. Application Data

(60) Provisional application No. 61/506,485, filed on Jul. 11, 2011.

(51) Int. Cl.
| | |
|---|---|
| G02B 5/04 | (2006.01) |
| F24J 2/08 | (2006.01) |
| H01L 31/054 | (2014.01) |
| G02B 27/10 | (2006.01) |

(52) U.S. Cl.
CPC ............ *F24J 2/085* (2013.01); *H01L 31/0543* (2014.12); *H01L 31/0549* (2014.12); *G02B 27/1013* (2013.01); *Y02E 10/43* (2013.01); *Y02E 10/52* (2013.01)

(58) Field of Classification Search
CPC .......... G02B 5/04–5/045; G02B 27/10; G02B 27/1006; G02B 27/1013; G02B 27/12–27/126; G01J 3/12; G01J 3/1208; G01J 3/14; G01J 3/18; G01J 3/2803; G01J 2003/1861; Y02E 10/40; Y02E 10/43; Y02E 10/47; Y02E 10/52; H01L 31/054; H01L 31/0543; H01L 31/0549; F24J 2/02; F24J 2/06; F24J 2/062; F24J 2/08–2/085

USPC .......... 359/615, 639–640, 741–743; 136/246, 136/259; 126/569, 573, 600, 698, 701
See application file for complete search history.

(56) References Cited

U.S. PATENT DOCUMENTS

| | | | |
|---|---|---|---|
| 4,204,881 A | 5/1980 | McGrew | |
| 4,367,366 A | 1/1983 | Bloss et al. | |
| 6,015,950 A | 1/2000 | Converse | |

(Continued)

OTHER PUBLICATIONS

Kim et al., Journal Korean Society of Precision Engineering, "Design of Spherical Aberration Free Aspherical Lens by use of ray Reverse Tracing Method" (vol. 20, Issue: 10, 2003).

*Primary Examiner* — Derek S Chapel
(74) *Attorney, Agent, or Firm* — Knobbe Martens Olson & Bear LLP

(57) ABSTRACT

An optical device capable of concentrating and spectrum splitting electromagnetic radiation for solar energy conversion systems. Two interfaces of the optical device, designed by ray tracing methods, focus the electromagnetic radiation by refraction and chromatic dispersion, such that focal areas of different wavelengths, relative to one another, are not parallel to electromagnetic radiation incident upon the optical device. Energy conversion devices, such as solar photovoltaic cells, may be placed at or near the focal areas to efficiently convert radiation of different wavelengths to other forms of energy. Interfaces may be flat or curved and may be composed of multiple discontinuous surfaces on one or both interfaces in one or two axes. Interfaces composed of multiple discontinuities may be designed such that there is no shading of electromagnetic radiation of selected wavelengths. The optical device may be composed of one material or multiple materials with different Abbe numbers.

20 Claims, 29 Drawing Sheets

(56) References Cited

U.S. PATENT DOCUMENTS

| | | |
|---|---|---|
| 6,399,874 B1 | 6/2002 | Dennehy, et al |
| 6,469,241 B1 | 10/2002 | Penn |
| 7,072,109 B2 | 7/2006 | Goto et al. |
| 7,206,142 B1 | 4/2007 | Wagner |
| 7,558,452 B2 | 7/2009 | Ho |
| 2005/0279095 A1 | 12/2005 | Goldman |
| 2007/0012041 A1 | 1/2007 | Goldman |
| 2007/0084208 A1 | 4/2007 | Goldman |
| 2007/0153358 A1 | 7/2007 | Duston et al. |
| 2007/0157614 A1 | 7/2007 | Goldman |
| 2007/0157924 A1 | 7/2007 | Duston et al. |
| 2008/0048102 A1 | 2/2008 | Kurtz et al. |
| 2008/0149162 A1 | 6/2008 | Martinelli et al. |
| 2008/0314436 A1 | 12/2008 | O'Connell et al. |
| 2009/0114266 A1 | 5/2009 | Biles et al. |
| 2009/0250096 A1 | 10/2009 | Pan |
| 2009/0250097 A1 | 10/2009 | Pan |
| 2009/0250098 A1 | 10/2009 | Pan |
| 2009/0250099 A1 | 10/2009 | Pan |
| 2010/0095999 A1 | 4/2010 | Menon |
| 2010/0126556 A1 | 5/2010 | Benitez et al. |
| 2010/0147381 A1 | 6/2010 | Haney et al. |
| 2010/0170559 A1 | 7/2010 | McGlynn et al. |
| 2010/0186818 A1 | 7/2010 | Okorogu et al. |
| 2010/0200044 A1 | 8/2010 | Zaban et al. |
| 2010/0319755 A1 | 12/2010 | O'Connell et al. |
| 2011/0079271 A1 | 4/2011 | Dets |
| 2011/0083741 A1 | 4/2011 | Munro |
| 2011/0083742 A1 | 4/2011 | Munro | ns # CONCENTRATING AND SPECTRUM SPLITTING OPTICAL DEVICE FOR SOLAR ENERGY APPLICATIONS

RELATED APPLICATIONS

This application claims priority benefit under 35 U.S.C. §119(e) to:

U.S. Provisional Patent Application 61/506,485 entitled "CONCENTRATING AND SPECTRUM SPLITTING OPTICAL DEVICE" filed on Jul. 11, 2011, the disclosure of which is hereby incorporated by reference in its entirety.

BACKGROUND

There are conventional designs that use an optical device to concentrate electromagnetic radiation onto an electromagnetic radiation energy conversion device. However, these devices are limited from widespread use by their conversion efficiency and cost.

Some conventional designs concentrate electromagnetic radiation onto a single electromagnetic radiation energy conversion device, such as a solar cell. Such designs are limited by the conversion efficiency of the electromagnetic radiation energy conversion device. The electromagnetic radiation energy conversion device may be efficient in converting electromagnetic radiation to energy of another form over some portion of the electromagnetic spectrum. However, the overall efficiency of the system may be limited by the fact that a single electromagnetic radiation energy conversion device may be unable to achieve a high conversion efficiency from electromagnetic radiation to another form of energy over the entire electromagnetic spectrum or large portions of the electromagnetic spectrum.

Other conventional designs use multiple electromagnetic energy conversion devices in tandem or in layers, such as multi junction cells. Such designs improve the overall conversion efficiency of the system by using multiple electromagnetic energy conversion devices to efficiently convert multiple portions of the electromagnetic radiation spectrum into other forms of energy. However, the efficiency of such systems may be limited by the fact that there are reflective losses introduced by each electromagnetic radiation device, interface, or layer that is added. These reflective losses reduce the amount of electromagnetic radiation reaching some of the electromagnetic radiation energy conversion devices or layers. These reflective losses also reduce the overall conversion efficiency from electromagnetic radiation to another form of energy.

Some conventional designs use an optical device or optical devices to concentrate and disperse electromagnetic radiation onto multiple electromagnetic radiation energy conversion devices that are not in tandem or layers, but are placed next to one another in order to improve efficiency. Such designs use multiple electromagnetic radiation energy conversion devices to convert multiple portions of the electromagnetic radiation spectrum into other forms of energy. Such designs also reduce some of the reflective losses that plague designs, which use multiple electromagnetic radiation energy conversion devices in tandem or in layers, since the electromagnetic radiation, after concentration and dispersion, reaches each electromagnetic radiation energy conversion device without passing through other devices, layers, or interfaces. However, these designs may be limited by the design of the concentrating and dispersing optical device or devices. The design of the optical device or devices in the conventional systems may use multiple optical devices to disperse and concentrate electromagnetic radiation onto electromagnetic radiation energy conversion devices. Reflection and absorption losses may be increased by using multiple optical devices, reducing the overall efficiency of the system, for such designs.

The design of the optics according to some conventional designs may use a single optical device to concentrate and disperse electromagnetic radiation onto electromagnetic radiation energy conversion devices. Such conventional optical device designs, such as Fresnel lenses, focus each wavelength of electromagnetic radiation onto the optical axis of the optical device, as shown in FIG. 1A. In such conventional optical device designs the optical axis of the optical device is parallel to the electromagnetic radiation that is incident upon the optical device. FIG. 1A illustrates ray tracing of a conventional system, including the focal points 122, 124, and 126 of three wavelengths of electromagnetic radiation 116, 118, and 120 that are dispersed and concentrated. The optical axis of a conventional optical device is represented by a vertical line 140 in FIG. 1A. The ray trace of the three wavelengths 116, 118, and 120 of electromagnetic radiation shown in FIG. 1A shows that the focal points 122, 124, and 126 for the three wavelengths 116, 118, and 120 of electromagnetic radiation fall along the optical axis 140 of the optical device, which is parallel to the electromagnetic radiation that is incident upon the conventional optical device. The focal points 122, 124, and 126 of three different wavelengths, 116, 118, and 120 of electromagnetic radiation, relative to one another, are parallel to the electromagnetic radiation that is incident upon the conventional optical device. The positioning of the focal points 122, 124, and 126 for the three wavelengths 116, 118, and 120 along the optical axis 140 of the optical device may limit the conversion efficiency of the system. If electromagnetic radiation energy conversion devices are positioned at or near the focal points 122, 124, and 126 of the three wavelengths 116, 118, and 120 along the optical axis 140, the off-normal incident angle of the electromagnetic radiation on the electromagnetic radiation energy conversion devices may be large. A large off-normal incident angle of electromagnetic radiation on the electromagnetic radiation energy conversion devices may result in large reflection losses at the surface of the electromagnetic radiation energy conversion devices. If the electromagnetic radiation energy conversion devices are angled away from the optical axis to reduce the reflection losses caused by the large off-normal incident angle of the electromagnetic radiation on the electromagnetic radiation energy conversion devices, the electromagnetic radiation energy conversion devices are no longer positioned at or near the focal point for each wavelength of electromagnetic radiation. If the electromagnetic radiation energy conversion devices are not at or near the focal point of each wavelength of electromagnetic radiation, a blurring effect of the dispersed wavelengths will occur. If the dispersed wavelengths suffer from a blurring effect or decreased spectral separation, the overall efficiency of the system may decrease because all of the electromagnetic radiation of a given wavelength will not reach the electromagnetic radiation energy conversion device that is most efficient in converting that wavelength of electromagnetic radiation to another form of energy.

Conventional designs that use an optical device to concentrate electromagnetic radiation onto electromagnetic radiation energy conversion devices may suffer from limited efficiency due to the use of a single electromagnetic radiation energy conversion device, multiple electromagnetic radiation energy conversion devices positioned in tandem, multiple optical devices, or an optical device, which concentrates and disperses electromagnetic radiation such that the focal point for each wavelength of electromagnetic radiation is positioned along the optical axis of the optical device.

Conventional designs that use multiple discontinuous surfaces to reduce the thickness and the amount of material needed to produce an optical device may experience shading losses due to electromagnetic radiation being reflected and absorbed by draft surfaces, which connect the multiple discontinuous surfaces, and the corner sections where the draft surfaces meet the discontinuous surfaces. These losses may reduce the performance of the optical device and are especially significant for conventional designs that concentrate electromagnetic radiation in two axes.

Conventional designs that use a negative draft angle to reduce the absorption and reflection of electromagnetic radiation at the draft surfaces of an optical device with multiple discontinuous surfaces may face financial and design limitations. Producing negative draft angles for the draft surfaces of an optical device with multiple discontinuous surfaces may require the use of multiple mold pieces, which may add to the cost of the optical device. Conventional designs may have negative draft angles for the draft surfaces of an optical device with multiple discontinuous surfaces without using multiple mold pieces. It may be difficult to produce these negative draft angles without using multiple mold pieces, using injection molding techniques, with a curvature that is symmetric about the optical axis, which may be desirable. Machining negative draft angles for the draft surfaces of an optical device with multiple discontinuous surfaces may be expensive.

Producing negative draft angles for the draft surfaces of an optical device with multiple discontinuous surfaces without the expense of using multiple mold pieces may limit the curvature of the optical device that has multiple discontinuous surfaces. Limiting the curvature of the optical device may limit the size and concentration that can be achieved by the optical device, which may have a negative financial and performance impact.

SUMMARY

An object is to provide an optical device that may be used as part of a solar energy system to improve efficiency in collecting and converting solar radiation into other forms of energy, such as electricity. Another object of the optical device is to use refractive electromagnetic radiation concentration with spectrum splitting.

Yet another object of the optical device is to provide a low-cost solution to optics that concentrate and disperse electromagnetic radiation used as part of a system to improve efficiency in collecting and converting electromagnetic radiation, such as solar radiation, into other forms of energy, such as electricity.

According to some aspects, an optical device is disclosed. The optical device includes a first interface configured to disperse electromagnetic radiation or disperse and concentrate electromagnetic radiation based on wavelength, and a second interface configured to disperse and concentrate electromagnetic radiation such that the optical device focuses the electromagnetic radiation so that the focal areas of different wavelengths, relative to one another, are not parallel to the electromagnetic radiation that is incident upon the first interface of the optical device.

According to another aspect, an optical device including a first interface that may have a single flat surface, multiple flat surfaces, a curved surface in one axis, a curved surface in two axes, or a surface that has flat regions and curved regions, which disperses electromagnetic radiation is disclosed.

According to another aspect, an optical device, including two interfaces, that concentrates electromagnetic radiation in one axis or two axes is disclosed.

According to another aspect, an optical device including a plurality of areas formed of optical materials with different Abbe numbers and a first interface configured to disperse electromagnetic radiation or disperse and concentrate electromagnetic radiation based on wavelength, and a second interface configured to disperse and concentrate different wavelengths of electromagnetic radiation is disclosed.

According to another aspect, an optical device that has a second interface including a plurality of discontinuous surfaces, connected by draft surfaces, wherein the draft angles of the draft surfaces are configured such that substantially no electromagnetic radiation of selected wavelengths is incident upon the draft surfaces is disclosed.

According to another aspect, an optical device that has a first interface, configured to refract electromagnetic radiation at some locations on the first interface in a direction away from an optical axis and along a first axis, and a second interface, configured to concentrate electromagnetic radiation is disclosed. The second interface includes a plurality of discontinuous surfaces, connected by draft surfaces, wherein the draft angles of the draft surfaces are configured such that substantially no electromagnetic radiation of selected wavelengths is incident upon the draft surfaces, and wherein the draft surfaces are parallel with the optical axis along the first axis, or wherein the draft surfaces have positive draft angles along the first axis.

According to another aspect, an optical device that may be used in combination with electromagnetic radiation energy conversion devices to convert electromagnetic radiation to other forms of energy by concentrating and spectrum splitting the electromagnetic radiation is disclosed. The optical device may be used to concentrate the dispersed electromagnetic radiation onto multiple electromagnetic radiation conversion devices with each wavelength of electromagnetic radiation being focused onto an electromagnetic radiation conversion device that is efficient in converting the incident wavelength of electromagnetic radiation into another form of energy.

DETAILED DESCRIPTION

According to some embodiments, an optical device that may be used as part of a solar energy conversion system is disclosed. The system may include an optical device, electromagnetic radiation energy conversion devices, such as photovoltaic cells, and a tracking system. The optical device concentrates electromagnetic radiation and disperses the spectrum of electromagnetic radiation according to wavelength using chromatic aberration such that portions of the spectrum, each made up of a range of wavelengths, are focused onto electromagnetic radiation energy conversion devices. Each energy conversion device is efficient in converting the electromagnetic radiation to another form of energy over the range of wavelengths that are focused on each energy conversion device. The electromagnetic radiation energy conversion system may be used as a solar energy system to convert solar radiation into other forms of energy, such as electricity. The electromagnetic radiation energy conversion system may be configured to achieve a higher efficiency and may be produced at a lower cost than conventional designs.

In order to provide a clearer understanding of some of the disclosed embodiments, the concept of reverse ray tracing will be initially described.

A spherical lens has one or more concave or convex surfaces that are parts of spheres. A disadvantage with a spherical lens is the unavoidable spherical aberration, resulting from the spherical shape of the lens. The shape of an aspheric lens is designed to reduce spherical aberration, such that spherical aberration is reduced in aspheric lenses relative to spherical lenses. Reverse ray tracing is one approach to finding a close approximation of a lens curve that produces no spherical aberration. Reverse ray tracing is an iterative approach that solves for the coordinates of the lens curve, one at a time. A cross-section of the lens is divided up into a number of piecewise linear sections which are adjacent to one another, and the coordinate of each section is determined iteratively. The error of the approximation is inversely proportional to the number of piecewise linear sections of the lens curve. Reverse ray tracing may be used to derive the lens curves of all embodiments described in this patent.

Figure 1A:
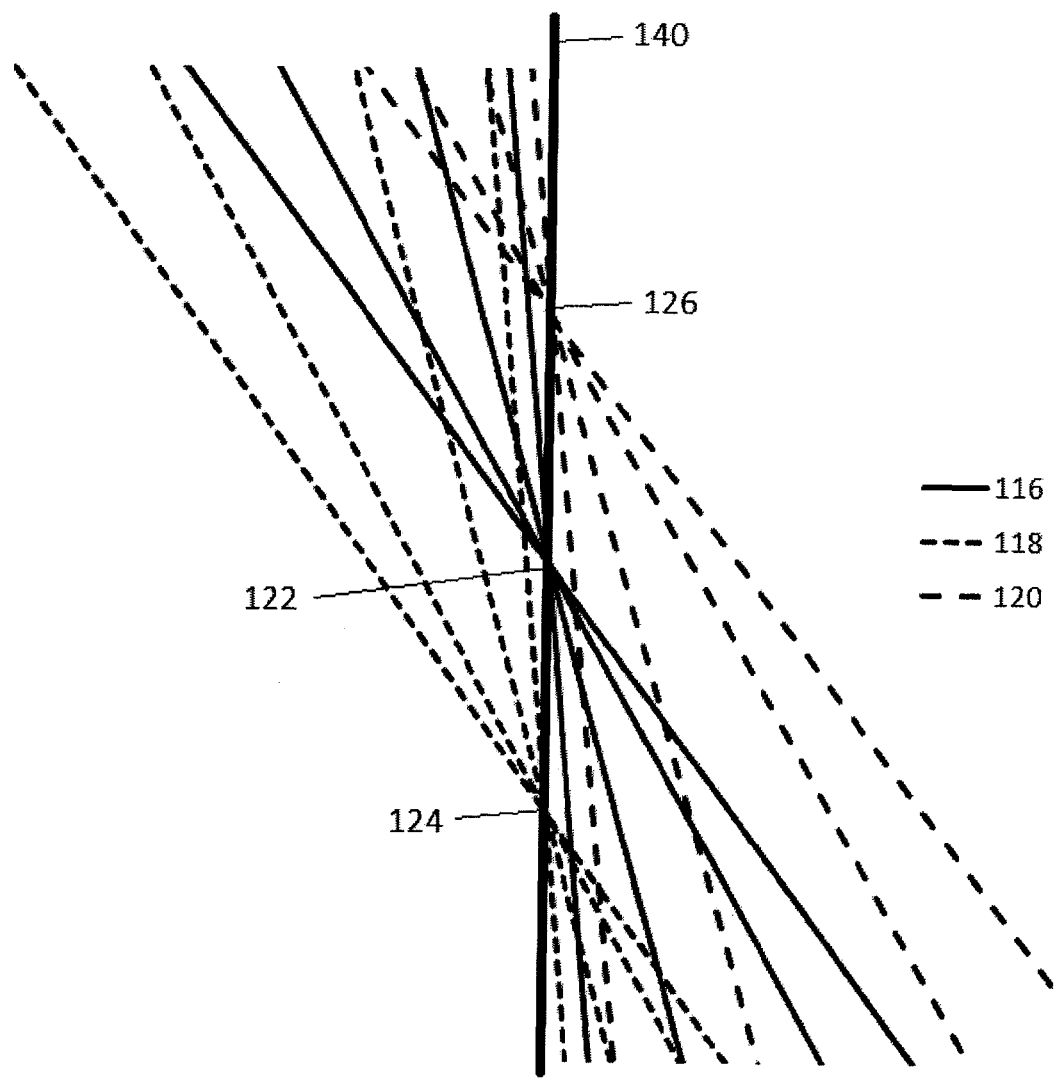
FIG. 1A illustrates ray tracing of a conventional system.
Figure 1B:
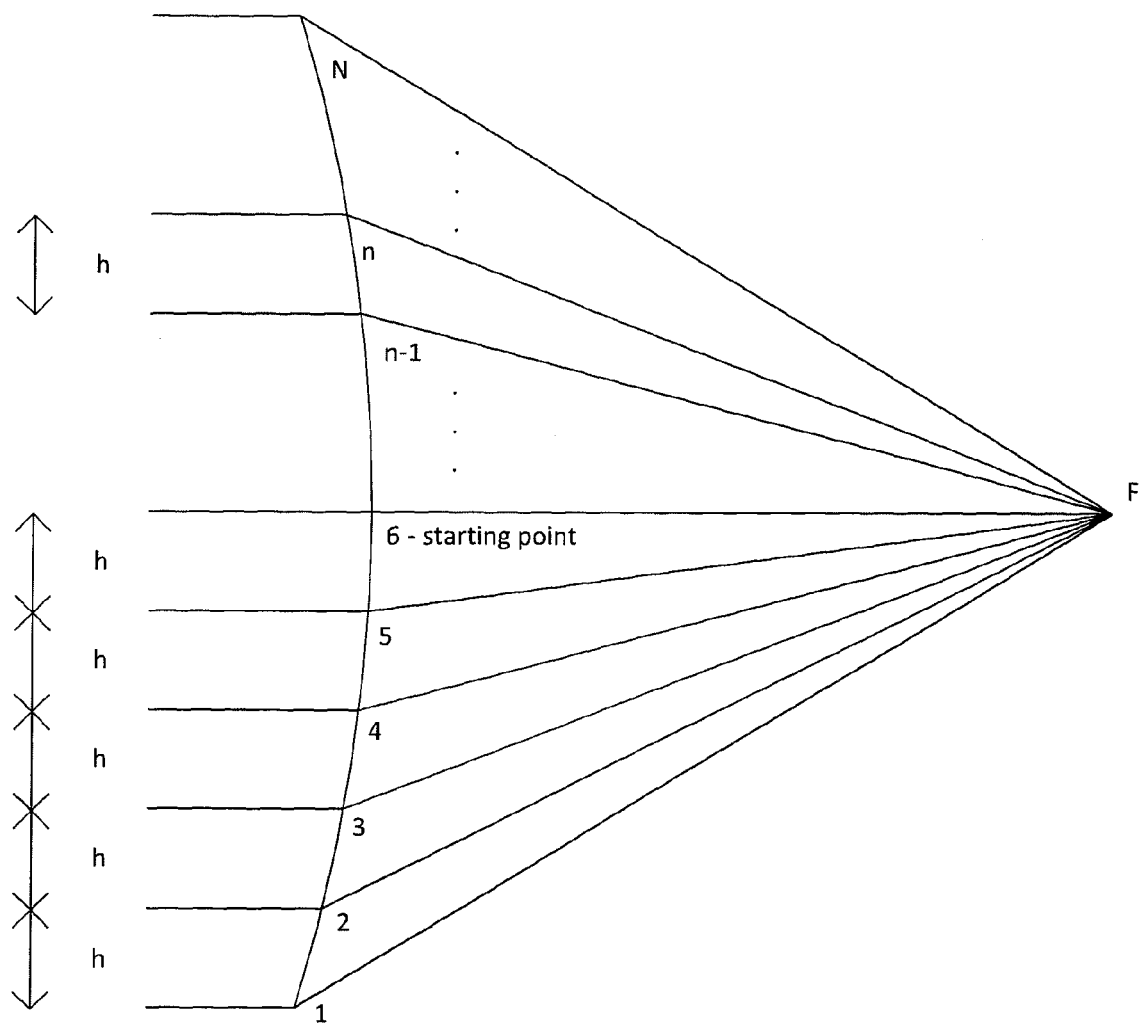
FIG. 1B illustrates an example lens, divided up into multiple piecewise linear sections.

An example lens shown in FIG. 1B, with focal point F, is divided up into N piecewise linear sections, where N can be any number. Each piecewise linear section has height h. The starting point of reverse ray tracing is usually a point that lies on the optical axis of the lens, a distance f from the focal point F. A ray from the focal point F to the starting point is perpendicular to the lens, and the incidence angle and reflectance angle are both 90°. The typical starting point for reverse ray tracing in FIG. 1B is labeled "6—starting point". The next point on the lens curve is found by tracing a ray from the focal point F, through a point on the lens curve, such that the ray is refracted in a direction parallel to the optical axis. The coordinates of the position of each piecewise linear section, constituting the lens, are found by realizing the trigonometric relationships as shown in FIG. 1C, and solving for the unknowns.

Figure 1C:
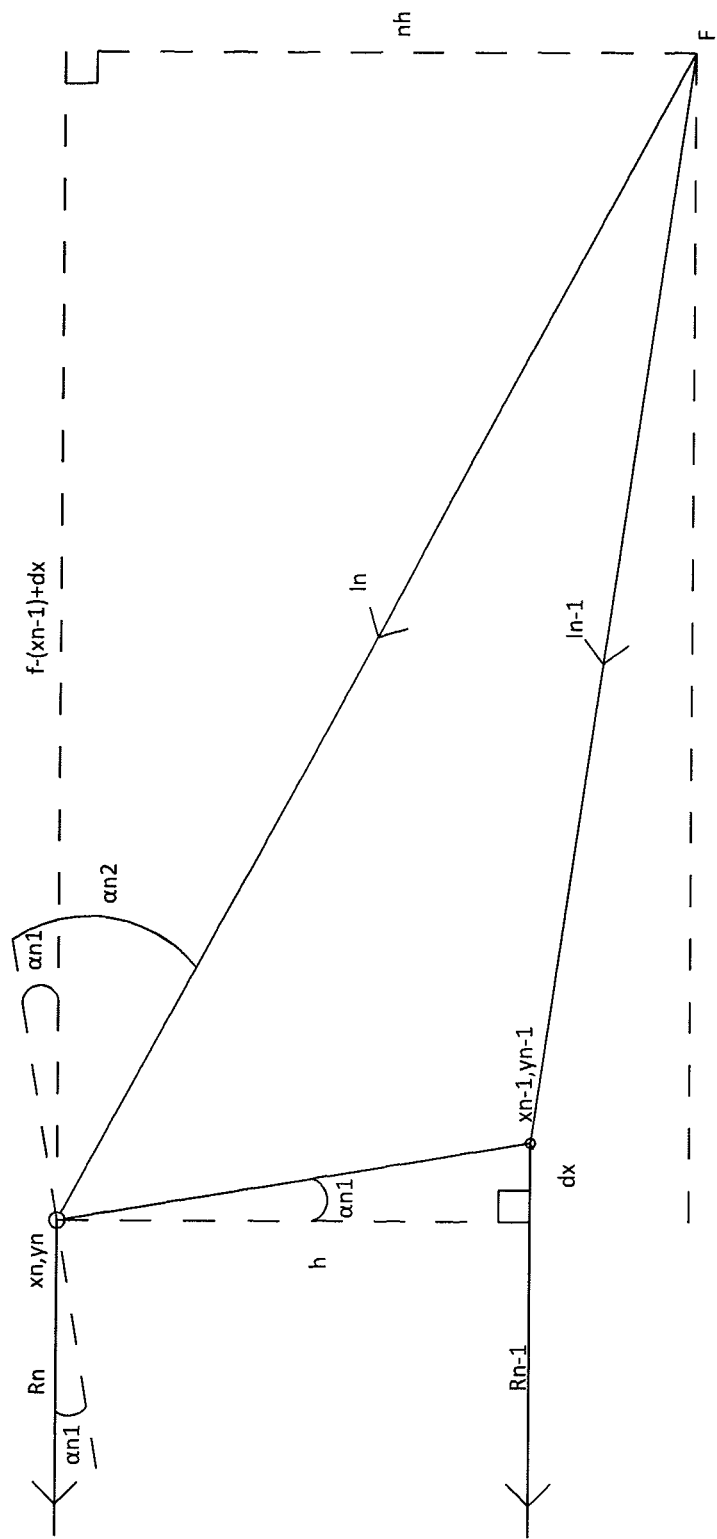
FIG. 1C illustrates one of the multiple piecewise linear sections of the example lens shown in FIG. 1B.

The diagram in FIG. 1C assumes that point $(x_{n-1}, y_{n-1})$ has been solved for, and explains how to find the next point $(x_n, y_n)$. The coordinate of the second end of the $n^{th}$ piecewise linear section $(x_n, y_n)$ can be expressed as $(x_{n-1}+dx, y_{n-1}+h)$, where $(x_{n-1}, y_{n-1})$ is the first end of the $n^{th}$ piecewise linear section and is the second end of the n-1$^{th}$ section. The quantity h is known and dx, the change in position along the x-axis between $x_n$ and $x_{n-1}$, has to be solved for, using trigonometric relationships and Snell's law. The following equation is obtained using Snell's law:

$$\alpha_{n2}=\sin^{-1}(n_2 \sin(\alpha_{n1})), \qquad \text{EQ. 1}$$

With reference to EQ. 1 $n_2$ represents the refractive index of the lens, $\alpha_{n2}$ is the incidence angle of the ray, which is the angular difference between the ray and the normal angle of the lens, and $\alpha_{n1}$ is the angle between the normal angle of the lens and the refracted ray. A second equation (EQ. 2) is derived by realizing the relationship between dx, h, and $\alpha_n$ $$\tan(\alpha_{n1}) = \frac{dx}{h}. \qquad \text{EQ. 2}$$

The last equation required to solve for dx is shown as EQ. 3 below:

$$\alpha_{n2} = \alpha_{n1} + \tan^{-1}\left(\frac{nh}{f - x_{n-1} + dx}\right). \qquad \text{EQ. 3}$$

The three equations can be combined to derive EQ. 4 below which can be used to solve for dx:

$$\sin^{-1}\left(n_2 \sin\left(\tan^{-1}\frac{dx}{h}\right)\right) = \tan^{-1}\left(\frac{dx}{h}\right) + \tan^{-1}\left(\frac{nh}{f - x_{n-1} + dx}\right). \qquad \text{EQ. 4}$$

The above discussion of reverse ray tracing assumes that all rays inside the lens are parallel to the optical axis. A more general case, excluding the assumption of the rays being parallel inside the lens, is now presented.

The two sides of a cross-section of the lens are divided up into a number of piecewise linear sections which are adjacent to one another, and the coordinate of each section is found iteratively for both sides of the lens. This approach adds another degree of freedom to the design, enabling the possibility to perform reverse ray tracing for two different wavelengths of electromagnetic radiation, which adds control of the chromatic dispersion.

Figure 1D:
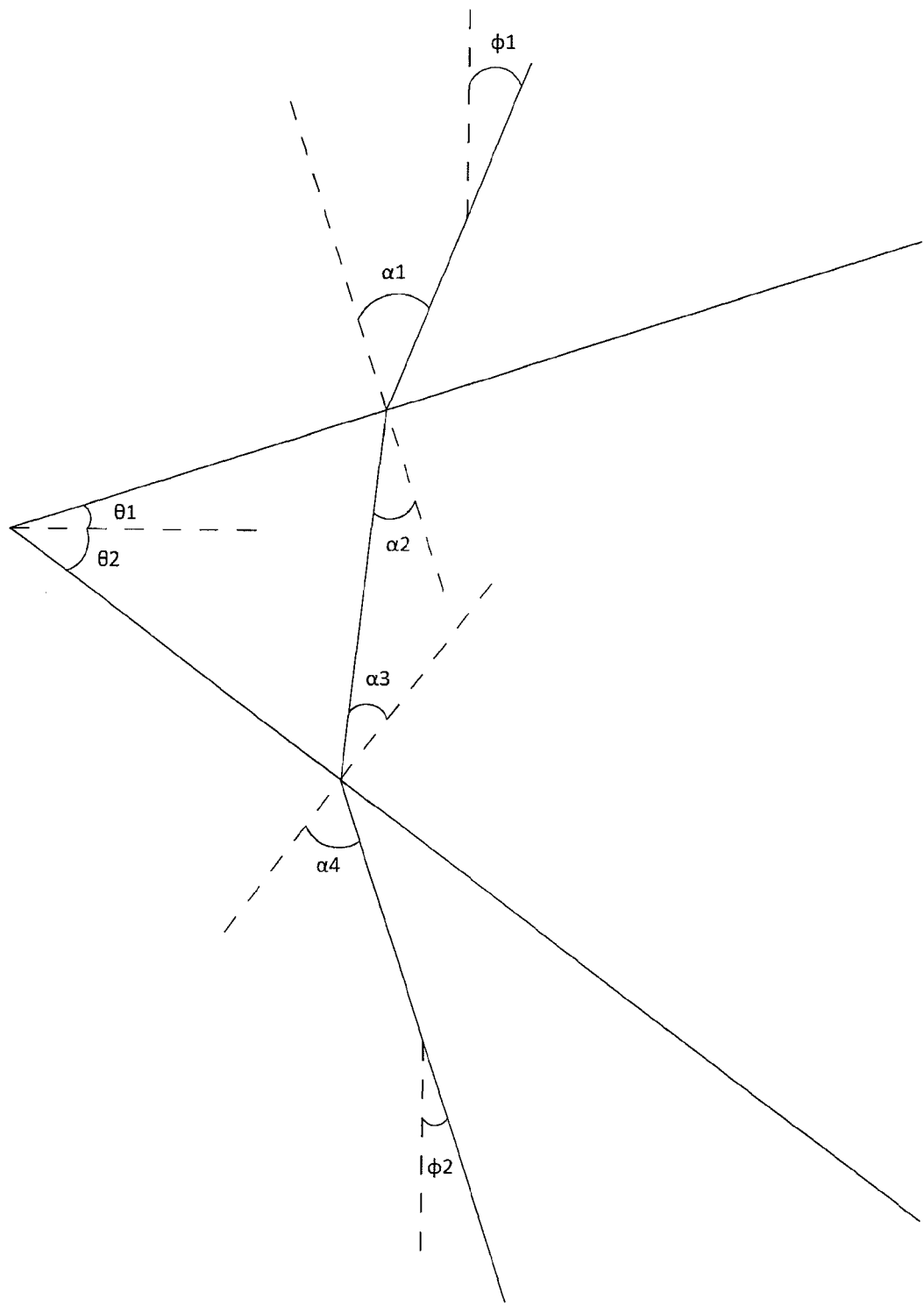
FIG. 1D illustrates an example of one section of the two sides of a cross-section of the lens.

FIG. 1D illustrates an example of one section of the two sides of a cross-section of the lens. The angle of the incident ray with respect to vertical is φ1, and the incidence angle of the ray with respect to the top side of the lens can be computed from EQ. 5 below:

$$\alpha_1 = \phi_1 + \theta_1, \qquad \text{EQ. 5}$$

where $\theta_1$ is the angle of the top side with respect to horizontal. The refracted angle with respect to the top side can be computed from EQ. 6 below:

$$\alpha_2 = \text{asin}\left(\frac{1}{n_2}\sin(\alpha_1)\right), \qquad \text{EQ. 6}$$

where $n_2$ is the refractive index of the lens. The incidence angle on the bottom side can be computed from EQ. 7 below:

$$\alpha_3 = \theta_2 - \alpha_2 + \theta_1, \qquad \text{EQ. 7}$$

where $\theta_2$ is the angle of the bottom side with respect to horizontal. The refracted angle on the bottom side can be computed from EQ. 8 below:

$$\alpha_4 = a\sin(n_2 \sin(\alpha_3)) \qquad \text{EQ. 8}$$

and the angle of the exit ray with respect to vertical can be computed from EQ. 9 below:

$$\phi_2 = \alpha_4 - \theta_2. \qquad \text{EQ. 9}$$

The equations EQ. 5-9 can be combined to solve for EQ. 10 below:

$$\varphi_2 = \text{asin}\left(n_2 \sin\left(\theta_1 + \theta_2 - \text{asin}\left(\frac{1}{n_2}\sin(\varphi_1 + \theta_1)\right)\right)\right) - \theta_2. \qquad \text{EQ. 10}$$

An additional ray of a different wavelength is introduced to control the chromatic dispersion. The incidence angle with respect to vertical, $\phi_1$, and the two exit angles with respect to vertical, $\phi_{2,r1}$ and $\phi_{2,r2}$, corresponding to the two rays of different wavelengths are fixed. The system of equations shown in EQ. 11 below:

$$\begin{cases} \varphi_{2,r1} = \text{asin}\left(n_{2,r1}\sin\left(\theta_1 + \theta_2 - \text{asin}\left(\frac{1}{n_{2,r1}}\sin(\varphi_1 + \theta_1)\right)\right)\right) - \theta_2 \\ \varphi_{2,r2} = \text{asin}\left(n_{2,r2}\sin\left(\theta_1 + \theta_2 - \text{asin}\left(\frac{1}{n_{2,r2}}\sin(\varphi_1 + \theta_1)\right)\right)\right) - \theta_2 \end{cases} \qquad \text{EQ. 11}$$

where $n_{2,r1}$ and $n_{2,r2}$ are the refractive indices of the lens for the two rays of different wavelengths, is solved for $\theta_1$ and $\theta_2$.

The angle of the bottom side $\theta_2$ as shown in FIG. 1D, found by solving the system of equations, is discarded; and only the angle of the top side $\theta_1$ as shown in FIG. 1D will be discussed. The angle of the top side, $\theta_1$, of each linear section is found by solving the system of equations above. However, the shape of the bottom side may be found through the use of reverse ray tracing to reduce aberration. A different set of equations, compared to the previous discussion of reverse ray tracing, may be derived, since the rays are not parallel inside the lens.

Figure 1E:
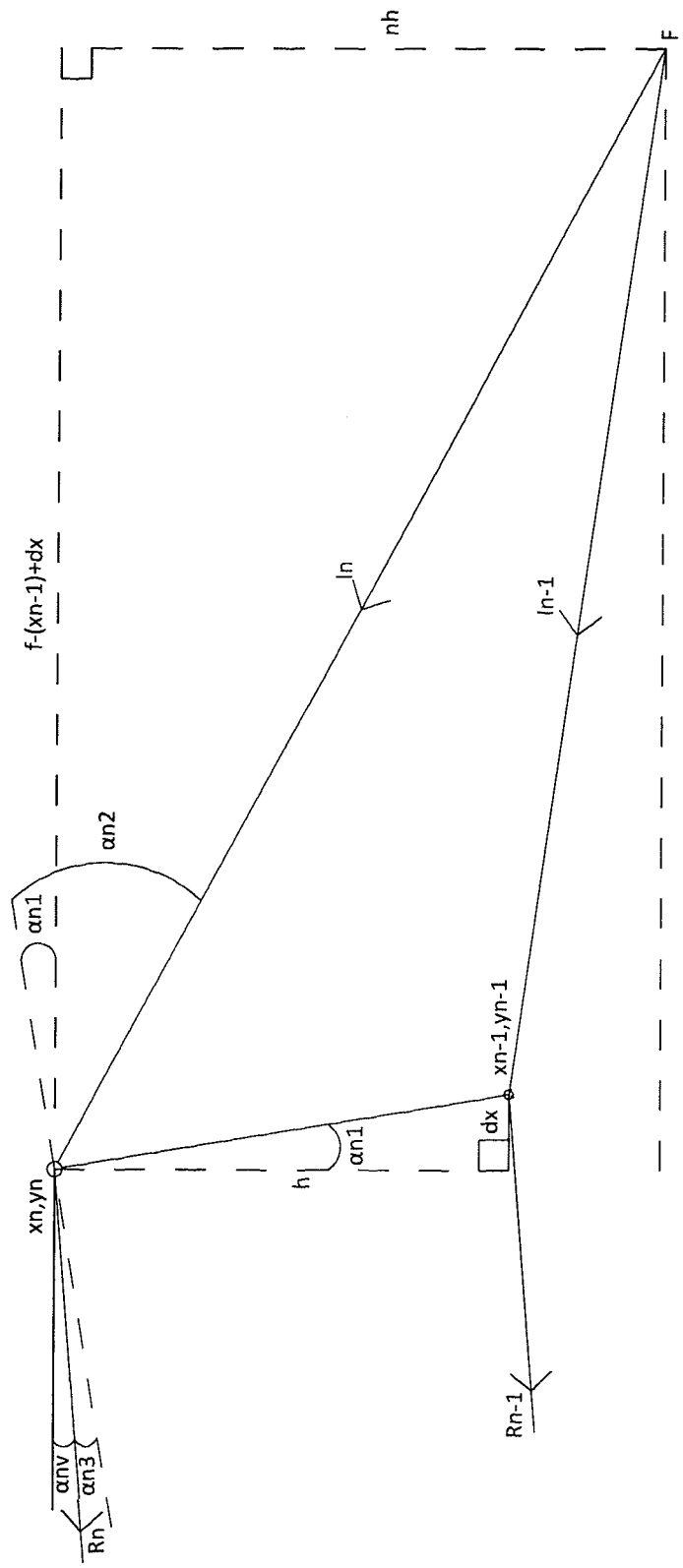
FIG. 1E illustrates one of the multiple piecewise linear sections of the example lens shown in FIG. 1B.

FIG. 1E illustrates one of the multiple piecewise linear sections of the example lens shown in FIG. 1B. The diagram in FIG. 1E assumes that point $(x_{n-1}, y_{n-1})$ has been solved for, and explains how to find the next point $(x_n, y_n)$. The first point $(x_0, y_0)$ is arbitrary and can be set to (0, 0). The coordinate of the second end of the $n^{th}$ piecewise linear section $(x_n, y_n)$ can be expressed as $(x_{n-1}+dx, y_{n-1}+h)$, where $(x_{n-1}, y_{n-1})$ is the first end of the $n^{th}$ piecewise linear section and is the second end of the n-1$^{th}$ section. The quantity h is known and dx, the change in position along the x-axis between $x_n$ and $x_{n-1}$ may be derived, using trigonometric relationships and Snell's law. The following equation EQ. 12 is obtained using Snell's law:

$$\alpha_{n2} = \sin^{-1}(n_2 \sin(\alpha_{n1} - \alpha_{nv})), \qquad \text{EQ. 12}$$

where $n_2$ is the refractive index of the lens, $\alpha_{n2}$ is the incidence angle of the ray, which is the angular difference between the ray and the normal angle of the lens, $\alpha_{n1}$ is the angle between the normal angle of the lens and the refracted ray, and $\alpha_{nv}$ is the angle between the ray inside the lens and horizontal. A second equation is derived by realizing the relationship between dx, h, and $\alpha_{n1}$ $$\tan(\alpha_{n1}) = \frac{dx}{h}. \qquad \text{EQ. 13}$$

The last equation required to solve for dx is given by EQ. 14 below:

$$\alpha_{n2} = \alpha_{n1} + \tan^{-1}\left(\frac{nh}{f - x_{n-1} + dx}\right). \qquad \text{EQ. 14}$$

The three equations EQ. 12-14 can be combined to derive EQ. 15 below, which can be solved for dx:

$$\sin^{-1}\left(n_2 \sin\left(\tan^{-1}\frac{dx}{h}\right) - \alpha_{nv}\right) = \tan^{-1}\left(\frac{dx}{h}\right) + \tan^{-1}\left(\frac{nh}{f - x_{n-1} + dx}\right). \qquad \text{EQ. 15}$$

According to some embodiments a method of designing a lens may include recording the refractive indices, $n_{2,r1}$ and $n_{2,r2}$, for the two rays corresponding to the reference wavelengths. The method also includes setting the focal distance, f to a value, setting the angle of the top side with respect to horizontal (for example, $\theta_1$ for the first linear section) for the first linear section of the lens to some value, setting the angle of the incidence ray with respect to vertical (for example, ($\phi_1$)

to a value, computing the value of the angle of the bottom side (for example, $\theta_2$ for the first linear section) for the ray corresponding to the refractive index $n_{2,r1}$ and the focal point f, and computing the exit angle with respect to vertical for ray 2, $\phi_{2,r2}$, given $\theta_1$ and $\theta_2$. Once the exit angle is determined, computation for a next linear section may be performed by setting $\phi_{2,r1}$ and $\phi_{2,r2}$, such that the ray corresponding to the refractive index $n_{2,r1}$ intersects the focal point F, and the ray corresponding to the refractive index $n_{2,r2}$ intersects the desired focal point of the second ray to solve for $\theta_1$ and $\theta_2$ of the next linear section. The method also includes computing the angle of the ray inside the lens, $\alpha_{nv}$, corresponding to the values of the angles $\theta_1$ and $\theta_2$ derived for the next linear section. A reverse ray tracing method for the first ray may be performed corresponding to the refractive index $n_{2,r1}$ in order to determine the curve of the bottom side of the lens. The computation for each subsequent linear section may be performed in order to derive a curve characterizing the lens.

Figure 2A:
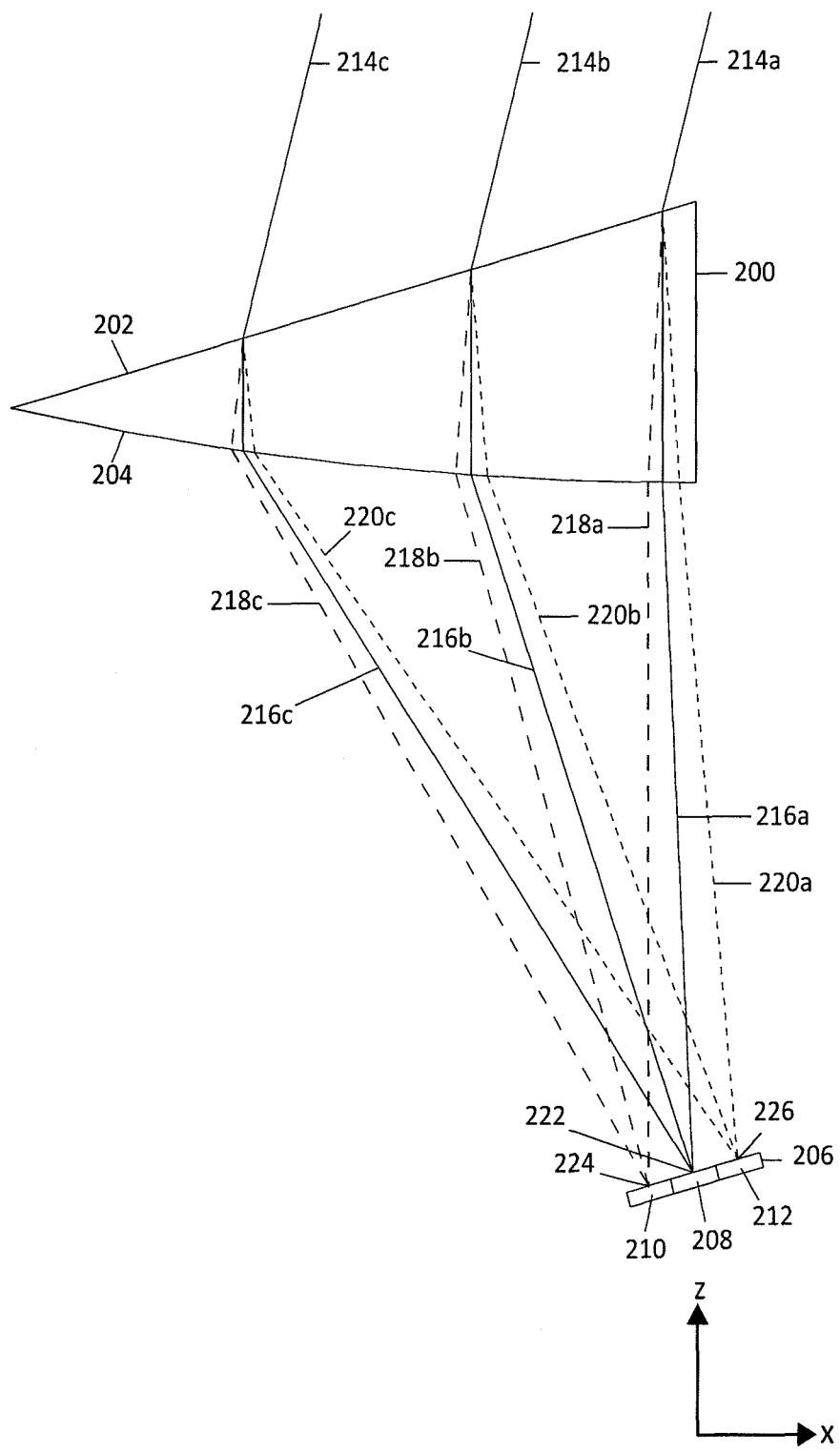
FIG. 2A illustrates a cross section of an optical device according to some embodiments.
Figure 2B:
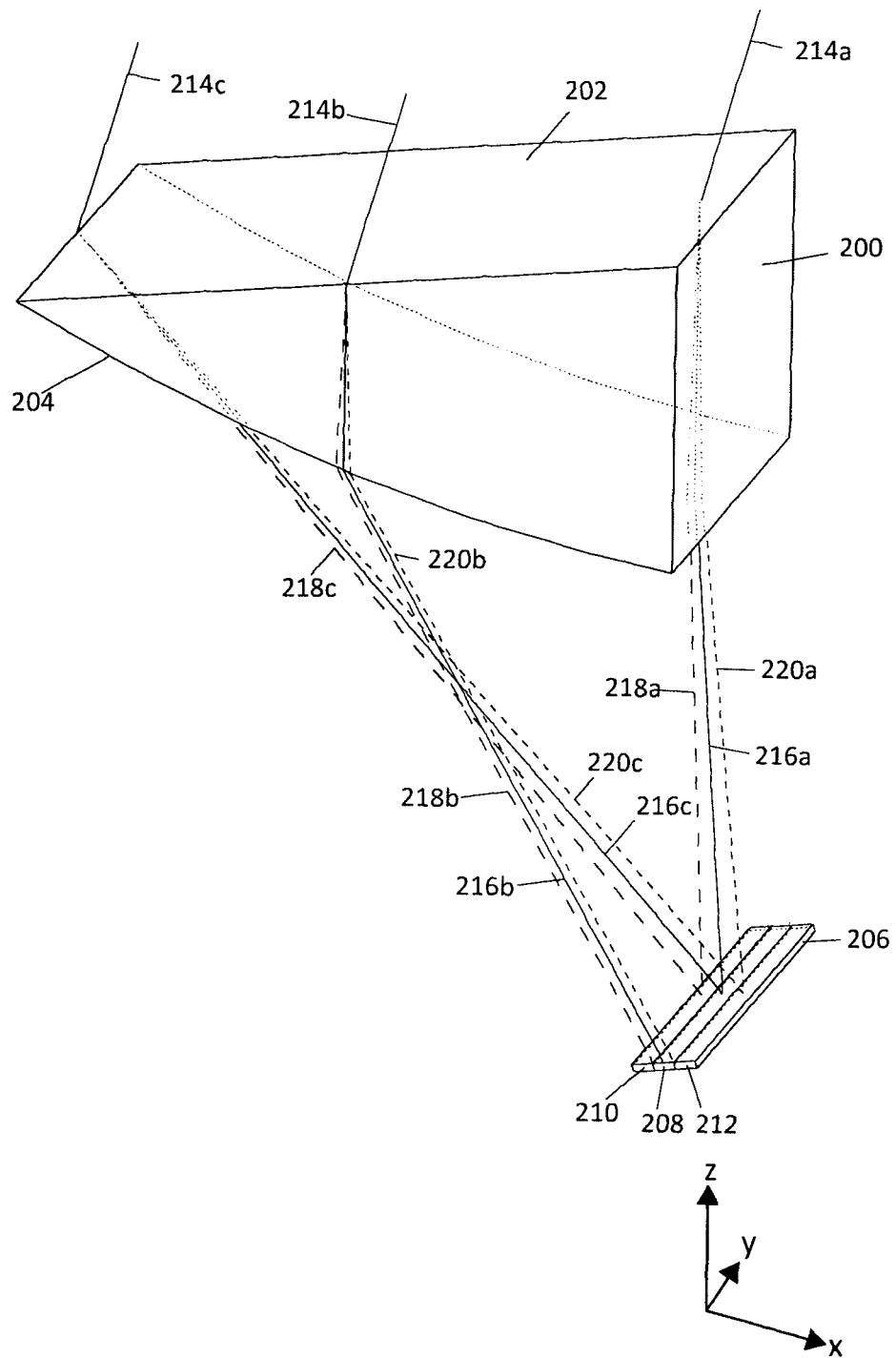
FIG. 2B illustrates a perspective view of the optical device of FIG. 2A.

An optical device according to some embodiments will be described in greater detail with reference to FIG. 2A and FIG. 2B. FIG. 2A illustrates a cross section of an optical device according to some embodiments. FIG. 2B illustrates a perspective view of the optical device of FIG. 2A. As illustrated in FIG. 2A, an optical device 200 includes a material that is transparent to electromagnetic radiation (such as glass or plastic). The optical device 200 has two interfaces, a first interface 202 and a second interface 204, between the optical device 200 and the surrounding medium. The first interface 202 is a planar surface. The second interface 204 is a convex surface. The first interface 202 is angled such that it is not perpendicular to the optical axis of the second interface 204. FIG. 2B shows a perspective view of the optical device of FIG. 2A. The optical device may be made of a single material and may be fabricated from a single optical structure.

In some embodiments, the optical axis may correspond to the axis onto which electromagnetic radiation is focused by a concentrating optical device, such as a lens with a convex surface. To aid in understanding FIG. 1A, FIG. 2A, FIG. 2B, and FIG. 3, the optical axis of the second interface 204 of the optical device 200 will be referred to as the z-axis.

The planar first interface 202 of the optical device 200 is angled such that the incoming rays of incident electromagnetic radiation 214a, 214b, and 214c are not perpendicular to the first interface 202 of the optical device 200 in the x-axis.

Incident electromagnetic radiation 214a, 214b, and 214c is refracted in the x-axis by the first interface 202 such that rays of a first wavelength of refracted radiation 216a, 216b, and 216c travel inside the optical device 200 parallel to the optical axis of the second interface 204, which is the z-axis. The second interface 204, which is formed as a convex surface, includes a curvature such that the rays of a first wavelength of refracted radiation 216a, 216b, and 216c are concentrated in the x-axis and brought to a single point of focus 222 on the z-axis. The curvature for the convex surface of the second interface 204 is created using, for example, a reverse ray tracing method as discussed above.

The optical device 200 and the target device 206 have a width along the y-axis. The y-axis is perpendicular to the x-axis and the z-axis.

A surface of the target device 206 includes a first target area 208, a second target area 210, and a third target area 212. Electromagnetic radiation energy conversion devices, such as solar cells, solar thermal units, or solar chemical units, may be placed at the target areas 208, 210, and 212.

The optical device 200 is different than a tilted plano-convex lens. In a tilted plano-convex lens the optical axis of the second interface 204 (the convex interface of the lens) would point in a direction that is perpendicular to the planar first interface of the lens. Additionally, incident electromagnetic radiation 214a, 214b, and 214c that is not perpendicular to the planar first interface of a plano-convex lens is not focused at a focal point along the optical axis of the convex second interface 204. Unlike a tilted plano-convex lens, the embodiment in FIG. 2A and FIG. 2B has a second interface 204 with an optical axis that is not perpendicular to the planar first interface 202. Further, in the embodiment shown in FIG. 2A and FIG. 2B, refracted radiation of the first wavelength 216a, 216b, and 216c is focused at a focal point 222 along the z-axis, the optical axis of the second interface 204, when the planar first interface 202 of the optical device 200 is angled such that the incoming rays of incident electromagnetic radiation 214a, 214b, and 214c are not perpendicular to the first interface 202 of the optical device 200.

FIG. 2A shows the planar first interface 202 of the optical device 200 angled such that the incoming rays of incident electromagnetic radiation 214a, 214b, and 214c are not perpendicular to the first interface 202 of the optical device 200. The rays of incident electromagnetic radiation 214a, 214b, and 214c are refracted in the first axis at a wavelength dependent angle at the first interface 202. The first interface 202 splits the spectrum of incident electromagnetic radiation 214a, 214b, and 214c into rays of varying wavelength. This wavelength dependent refraction may be referred to as chromatic dispersion. FIG. 2A shows a first wavelength of refracted radiation 216a, 216b, and 216c, a second wavelength of refracted radiation 218a, 218b, and 218c, and a third wavelength of refracted radiation 220a, 220b, and 220c each traveling in a direction corresponding to their wavelength. The difference in direction between the first wavelength of refracted radiation 216a, 216b, and 216c, the second wavelength of refracted radiation 218a, 218b, and 218c, and the third wavelength of refracted radiation 220a, 220b, and 220c, is determined in part by the Abbe number of the material of the optical device 200.

The Abbe number is a measure of the change in refractive index with a change in the wavelength of electromagnetic radiation for a material. In physics and optics, the Abbe number, also known as the V-number or constringence of a transparent material, is a measure of the material's dispersion (variation of refractive index with wavelength) in relation to the refractive index. The Abbe number V of a material may be defined according to EQ. 16 below:

$$V = \frac{n_d - 1}{n_F - n_C}, \qquad \text{EQ. 16}$$

where $n_d$, $n_F$, and $n_C$ are the refractive indices of the material at the wavelengths of the Fraunhofer d-, F-, and C-spectral lines (587.6 nm, 486.1 nm and 656.3 nm respectively). Low dispersion (low chromatic aberration) materials have high values of V. Abbe numbers are used to classify glasses, plastics, and other optically transparent materials.

The incident radiation 214a, 214b, and 214c is refracted by the first interface 202 such that rays of a first wavelength of refracted radiation 216a, 216b, and 216c travel through the optical device 200 parallel to the z-axis, which corresponds to the optical axis of the second interface 204. The incident radiation 214a, 214b, and 214c is refracted by the first interface 202 such that rays of the second wavelength of refracted radiation 218a, 218b, and 218c and rays of the third wavelength of refracted radiation 220a, 220b, and 220c travel through the optical device 200 at angles different than the rays of the first wavelength of refracted radiation 216a, 216b, and 216c and different to each other. At the second interface 204 of the optical device 200 the rays of the first wavelength of refracted radiation 216a, 216b, and 216c are concentrated in the x-axis and brought to a single point of focus 222 on the z-axis. The rays of the second wavelength of refracted radiation 218a, 218b, and 218c and the rays of the third wavelength of refracted radiation 220a, 220b, and 220c are concentrated in the first axis and are brought to areas of focus 224 and 226 at locations different than the first wavelength focal point 222.

To aid in understanding the description of the design of the optical device 200, the second wavelength focal area 224 of the rays of the second wavelength of refracted radiation 218a, 218b, and 218c and the third wavelength focal area 226 of the rays of the third wavelength of refracted radiation 220a, 220b, and 220c may also be referred to as focal points even though the refracted rays 218a, 218b, 218c, 220a, 220b, and 220c at the second and third wavelength focal areas 224 and 226 may not be focused to a single point with the same precision as the rays of the first wavelength of refracted radiation 220a, 220b, and 220c at the first wavelength focal point 222. The focal points 224 and 226 of the refracted rays of the second and third wavelength 218a, 218b, 218c, 220a, 220b, and 220c may differ in position from the focal point 222 of the refracted rays of the first wavelength 216a, 216b, and 216c along the x-axis and also along the z-axis. The focal points 222, 224, and 226 may all differ in location from each other along both the x-axis and the z-axis.

The focal points 222, 224, and 226 may differ in location from each other along the x-axis because dispersion of the incident electromagnetic radiation 214a, 214b, and 214c in the x-axis takes place at the first interface 202 and the second interface 204 of the optical device 200 and the concentration in the x-axis of the refracted electromagnetic radiation of the first, second, and third wavelengths 216a, 216b, 216c, 218a, 218b, 218c, 220a, 220b, and 220c takes place only at the second interface 204 of the optical device 200. Because the focal points 222, 224, and 226 may differ in location from each other along the x-axis, the focal points 222, 224, and 226 of three different wavelengths, 216a, 216b, 216c, 218a, 218b, 218c, 220a, 220b, and 220c of electromagnetic radiation may be oriented such that relative to one another they are not parallel to the incident electromagnetic radiation 214a, 214b, and 214c.

FIG. 2A and FIG. 2B show the optical device 200 and a target device 206. The target device 206 is positioned in relation to the optical device 200 such that the first, second, and third wavelength refracted radiation 216a, 216b, 216c, 218a, 218b, 218c, 220a, 220b, and 220c, which is chromatically dispersed in the x-axis by the first interface 202 and the second interface 204 and concentrated in the x-axis by the second interface 204, is incident upon a surface of the target device 206. The surface of the target device 206 includes a first target area 208, a second target area 210, and a third target area 212. The first target area 208, second target area 210, and third target area 212 may be in different positions from each other in the x-axis and the z-axis, in the x-axis only, or in the z-axis only. While three target areas 208, 210, and 212 are shown, any number of target areas may be used in the embodiment.

The rays of refracted radiation of the first, second, and third wavelengths 216a, 216b, 216c, 218a, 218b, 218c, 220a, 220b, and 220c are focused by the optical device 200 such that the rays of the first wavelength of refracted radiation 216a, 216b, and 216c are incident on the first target area 208, the rays of the second wavelength of refracted radiation 218a, 218b, and 218c are incident on the second target area 210, and the rays of the third wavelength of refracted radiation 220a, 220b, and 220c are incident on the third target area 212.

Figure 3:
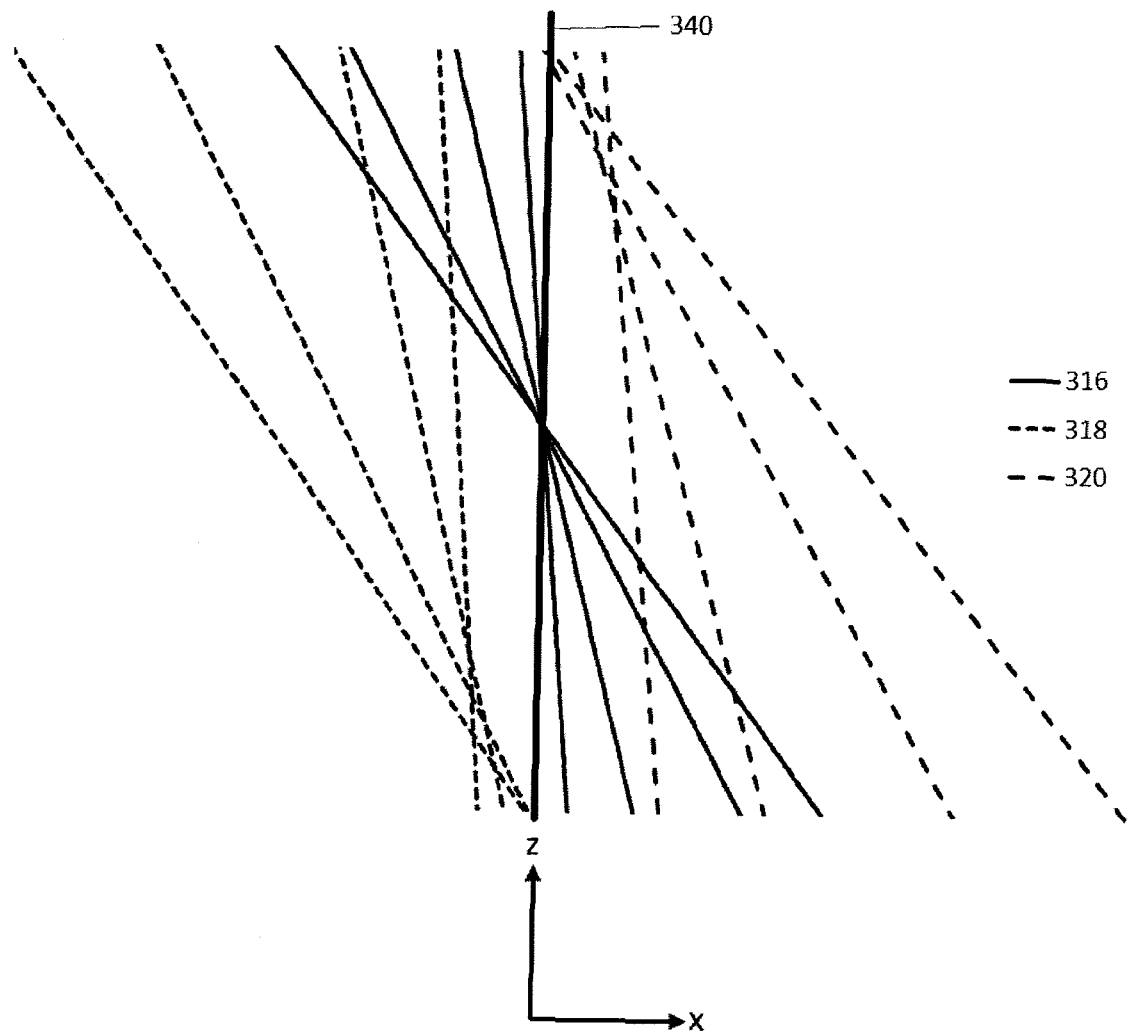
FIG. 3 illustrates an example ray trace of an optical device with one Abbe number.

FIG. 3 illustrates an example ray trace of an optical device including a first interface that is a planar surface and a second interface that is a convex surface, where the first interface is angled such that it is not perpendicular to the optical axis of the second interface. FIG. 3 illustrates a view of the focal areas of three wavelengths of electromagnetic radiation 316, 318, and 320, after being dispersed and concentrated by an optical device located above the focal areas shown in FIG. 3. The optical axis of the second interface, which is parallel to the z-axis, is represented by a vertical line 340 in FIG. 3. The ray trace of the three wavelengths of electromagnetic radiation 316, 318, and 320 shown in FIG. 3 shows that the focal area for each wavelength of electromagnetic radiation differs in location from the focal areas of the other wavelengths in both the x-axis and the z-axis. Because the focal areas may differ in location from each other along the x-axis and the z-axis, the focal areas of the three different wavelengths 316, 318, and 320 of electromagnetic radiation may be oriented such that relative to one another they are not parallel to the incident electromagnetic radiation.

The target device 206, shown in FIG. 2A and FIG. 2B, is made up of electromagnetic radiation energy conversion devices, such as solar cells, solar thermal units, or solar chemical units that are placed at the target areas 208, 210, and 212. The choice of the type and size of the electromagnetic radiation energy conversion devices may be chosen such that ranges of wavelengths and portions of the spectrum are converted to other forms of energy, such as electricity or thermal energy, using devices that are efficient for the respective wavelengths, which are incident upon them. For example, an electromagnetic radiation energy conversion device placed at the first target area 208 is configured to be efficient at converting the refracted radiation of the first wavelength 216a, 216b, and 216c to another form of energy. Further, an electromagnetic radiation energy conversion device placed at the second target area 210 is configured to be efficient at converting the refracted radiation of the second wavelength 218a, 218b, and 218c to another form of energy. An electromagnetic radiation energy conversion device placed at the third target area 212 is configured to be efficient at converting the refracted radiation of the third wavelength 220a, 220b, and 220c to another form of energy.

FIG. 3 illustrates ray tracing of an optical device. FIG. 3 shows a close-up view of the focal area of three wavelengths of electromagnetic radiation 316, 318, and 320 after being dispersed and concentrated by the optical device located above the focal areas shown in FIG. 3. The optical axis, which is parallel to the z-axis, is represented by a vertical line 340 in FIG. 3. The ray trace of the three wavelengths of electromagnetic radiation 316, 318, and 320 shown in FIG. 3 shows that the focal area for each wavelength of electromagnetic radiation differs in location from the focal areas of the other wavelengths in both the x-axis and the z-axis.

As discussed with reference to FIG. 2A and FIG. 2B, the optical device 200 and the target device 206, may be placed on a tracking mechanism to ensure that the incident angle of the incident radiation 214a, 214b, and 214c on the first interface 202 is constant if a source of the incident electromagnetic radiation 214a, 214b, and 214c, such as the sun, moves. The tracking mechanism may also include structures to maintain the relative position of the optical device 200 and the target device 206 in a fixed position. The structures may also include positioning equipment to adjust the position of the optical device 200 and the target device 206. This positioning equipment may be used to calibrate the position and angle of the optical device 200 and the target device 206 so that the rays of the first wavelength of refracted radiation 216a, 216b, and 216c are incident on the first target area 208, the rays of the second wavelength of refracted radiation 218a, 218b, and 218c are incident on the second target area 210, and the rays of the third wavelength of refracted radiation 220a, 220b, and 220c are incident on the third target area 212. Keeping the incident angle of the incident radiation 214a, 214b, and 214c on the first interface 202 constant and keeping the relative position of the optical device 200 and the target device 206 fixed, after their relative positions are aligned, ensures that the rays of the first wavelength of refracted radiation 216a, 216b, and 216c are incident on the first target area 208, the rays of the second wavelength of refracted radiation 218a, 218b, and 218c are incident on the second target area 210, and the rays of the third wavelength of refracted radiation 220a, 220b, and 220c are incident on the third target area 212.

The tracking mechanism may track the source of the electromagnetic radiation in the x-axis only or in the x-axis and the y-axis.

As discussed above, there are conventional designs which use an optical device to concentrate electromagnetic radiation onto an electromagnetic radiation energy conversion device.

One advantage of the embodiment in FIG. 2A and FIG. 2B over conventional designs is that multiple electromagnetic radiation energy conversion devices may be used to efficiently convert multiple portions of the spectrum of electromagnetic energy to other forms of energy. Each portion of the spectrum is converted to another form of energy by a device which has a high efficiency for converting electromagnetic radiation in that portion of the spectrum. Thus, the overall efficiency of converting electromagnetic radiation of several portions of the spectrum may be higher for the embodiment in FIG. 2A and FIG. 2B than conventional optical device designs that use a single electromagnetic radiation energy conversion device.

Another advantage of the embodiment in FIG. 2A and 2B over conventional designs is that multiple electromagnetic radiation energy conversion devices may be placed in target areas 208, 210, and 212 such that electromagnetic radiation reaches each electromagnetic radiation energy conversion device without passing through other electromagnetic radiation energy conversion devices or other layers of the same electromagnetic radiation energy conversion device. Thus, the embodiment in FIG. 2A and FIG. 2B is free from the reflection and absorption losses that occur in electromagnetic radiation energy conversion systems in which electromagnetic radiation reaches electromagnetic radiation energy conversion devices after passing through other electromagnetic radiation energy conversion devices or other layers of the same electromagnetic radiation energy conversion device.

Another advantage of the embodiment in FIG. 2A and FIG. 2B over conventional designs is that a single optical device 200 is used to disperse and concentrate electromagnetic radiation. Each optical device has accompanying reflection and absorption losses. By using a single optical device 200 reflection and absorption losses may be decreased compared to designs that use multiple optical devices to disperse and concentrate electromagnetic radiation. Thus, the transmission efficiency may be higher for the embodiment in FIG. 2A and FIG. 2B than optical system designs that use multiple optical devices to disperse and concentrate electromagnetic radiation.

Another advantage of the embodiment in FIG. 2A and FIG. 2B over conventional designs is that the focal points 222, 224, and 226 differ in location from each other along both the x-axis and z-axis. The focal points 222, 224, and 226 differ in location from each other along the x-axis because of the dispersion of the incident electromagnetic radiation 214a, 214b, and 214c in the x-axis that takes place at the first interface 202 and second interface 204 of the optical device 200. The concentration in the x-axis of the refracted electromagnetic radiation of the first, second, and third wavelengths 216a, 216b, 216c, 218a, 218b, 218c, 220a, 220b, and 220c takes place only at the second interface 204 of the optical device 200. The variance in the position of the focal points 222, 224, and 226 in the x-axis reduces reflective losses at the surface of a target device 206 in which each of the target areas 208, 210, and 212 are positioned at or near the focal points 222, 224, and 226. Since, in some embodiments, the focal points 222, 224, and 226 vary in position in the x-axis in addition to the z-axis the target device may be angled such that it is not parallel to the z-axis, the optical axis of the second interface 204, while positioning each of the target areas 208, 210, and 212 at or near the focal points 222, 224, and 226. By angling the target device 206 such that it is not parallel to the z-axis, the off-normal incident angle of the refracted electromagnetic radiation of the first, second, and third wavelengths 216a, 216b, 216c, 218a, 218b, 218c, 220a, 220b, and 220c is reduced, which may reduce the reflection losses at the target areas 208, 210, and 212 on the surface of the target device 206.

An advantage of positioning the target device at or near the focal points 222, 224, and 226 is that the chromatic separation of the wavelengths is more precise close to their focal points. Improved spectral separation, or chromatic separation, allows for a higher overall efficiency since more of the electromagnetic radiation of a given wavelength will be incident on a target area with an electromagnetic radiation energy conversion device that can efficiently convert the electromagnetic radiation to another form of energy. Poor chromatic separation causes the electromagnetic radiation of a given wavelength to overlap electromagnetic radiation of other wavelengths such that target areas may absorb some electromagnetic radiation of wavelengths which they are not efficient in converting.

Thus, the embodiment in FIG. 2A and FIG. 2B may be capable of yielding higher conversion efficiencies than conventional designs by allowing the target device 206 to be positioned at an angle that reduces the off-normal incident angle of electromagnetic radiation on the target device 206, which reduces reflective losses while the target device 206 is positioned at or near the focal points 222, 224, and 226 of the electromagnetic radiation. Positioning the target device 206 at or near the focal points 222, 224, and 226 of electromagnetic radiation increases the concentration of the electromagnetic radiation incident on the electromagnetic radiation energy conversion devices located at the target areas 208, 210, and 212. Increasing the concentration of electromagnetic radiation incident on the electromagnetic radiation energy conversion devices placed at the target areas 208, 210, and 212 aids in reducing the size and cost of electromagnetic radiation energy conversion devices and improves chromatic separation, which may improve the conversion efficiency. These improvements are possible because the focal points 222, 224, and 226 differ in location from each other along both the x-axis and z-axis.

Figure 4A:
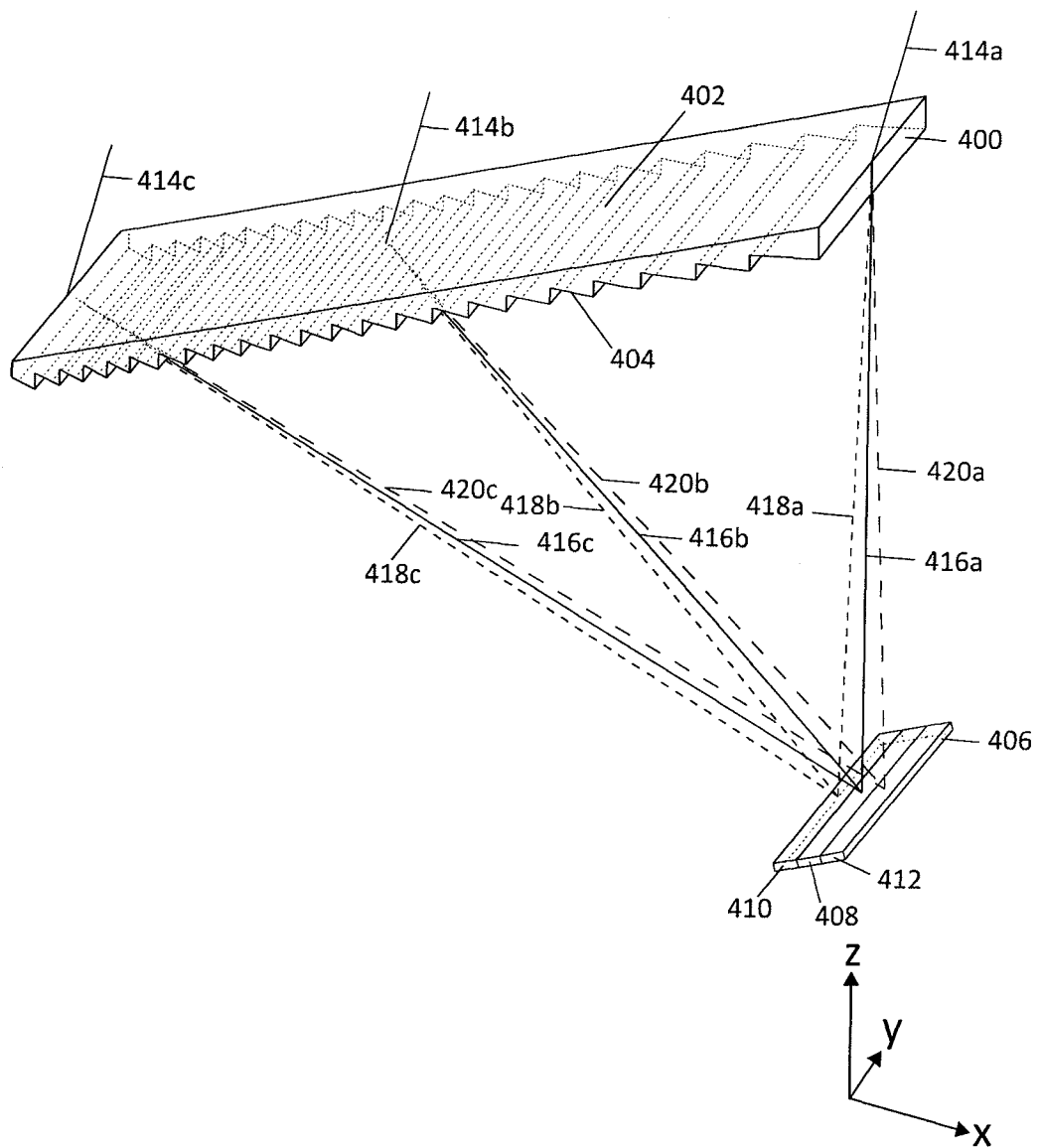
FIG. 4A illustrates a perspective view of an optical device having multiple discontinuous refractive surfaces according to some embodiments.
Figure 4B:
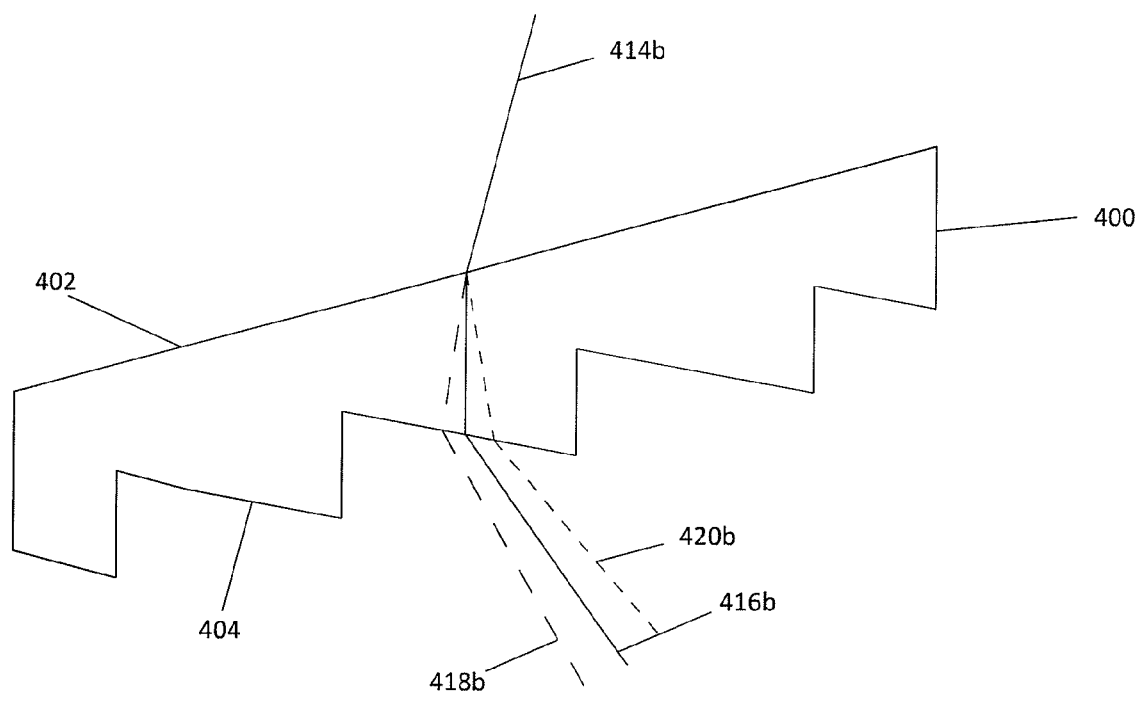
FIG. 4B illustrates a cross section of an optical device of FIG. 4A.

An alternative embodiment is shown in FIG. 4A and FIG. 4B.

FIG. 4A illustrates a perspective view of an optical device 400 having multiple discontinuous refractive surfaces according to some embodiments. FIG. 4B illustrates a cross section of an optical device of FIG. 4A. FIG. 4A shows a view of the optical device 400, made of a material that is transparent to electromagnetic radiation (such as glass or plastic), that concentrates and disperses electromagnetic radiation in the x-axis. The optical device 400 includes a dispersive first interface 402, tilted about the y-axis, and a concentrating second interface 404, made up of multiple discontinuous refracting surfaces. As referred to throughput the description of the various embodiments, the multiple discontinuous surfaces may have variation in pitch, aspect ratio, haze, or the like. Reverse ray tracing may be used to derive the exact shape of the first interface 402 and each of the multiple discontinuous refracting surfaces, which together make up the concentrating second interface 404, such that rays substantially converge at the target device 406. The dispersive first interface 402 chromatically disperses the electromagnetic radiation in the x-axis as shown in FIG. 4B and the second interface concentrates and chromatically disperses the electromagnetic radiation in the x-axis onto a target device 406.

As shown in FIG. 4A, the target device 406 is tilted about the y-axis, and includes multiple target areas 408, 410, and 412. The target device 406, shown in FIG. 4A, includes three target areas: first target area 408, second target area 410, and third target area 412. The target areas have a width along the y-axis equal to the width of the optical device 400 along the y-axis, since there is no concentration along the y-axis. The target device has a width along the x-axis less than the width of the optical device along the x-axis, since there is concentration in the x-axis. While three target areas 408, 410, and 412 are shown, any number of target areas may be used in the embodiment.

Incident electromagnetic radiation rays 414a, 414b, and 414c intersect the dispersive first interface 402 at an angle from the z-axis. The rays are dispersed into multiple wavelengths. Only three discrete wavelengths are shown: first wavelength refracted radiation 416a, 416b, and 416c, second wavelength refracted radiation 418a, 418b, and 418c, and third wavelength refracted radiation 420a, 420b, and 420c. The angle between the incident electromagnetic radiation 414a, 414b, and 414c and the dispersive first interface 402 may be selected such that the first wavelength refracted radiation rays 416a, 416b, and 416c are travelling through the optical device 400 parallel to the z-axis.

The target device 406 may be positioned such that the first wavelength refracted radiation rays 416a, 416b, and 416c intersect with the first target area 408, the second wavelength refracted radiation rays 418a, 418b, and 418c intersect with the second target area 410, and the third wavelength refracted radiation rays 420a, 420b, and 420c intersect with the third target area 412.

The optical device 400 of FIG. 4A is similar to the optical device 200 in FIG. 2A and FIG. 2B. A difference between the embodiment in FIG. 4A and the embodiment in FIG. 2A and FIG. 2B is that the second interface 404, includes multiple discontinuous refracting surfaces. The use of multiple discontinuous refractive surfaces at the second interface 404 of the optical device 400 allows the thickness of the optical device 400 to be decreased relative to conventional optical devices. The decreased thickness of the optical device 400 further reduces absorption losses, resulting in an increase of the overall conversion efficiency. Further, less material is needed to produce the optical device 400 due to the reduced thickness of the optical device 400 using multiple discontinuous refractive surfaces compared to optics, which do not use multiple discontinuous refractive surfaces.

The optical device 400 is different than a tilted conventional Fresnel lens. In a tilted conventional Fresnel lens the optical axis of the second interface (the Fresnel surface of the lens) would point in a direction that is perpendicular to the planar first interface of the lens. Further, incident electromagnetic radiation 414a, 414b, and 414c that is not perpendicular to the planar first interface of a Fresnel lens is not focused at a focal point along the optical axis of the Fresnel second interface. Unlike a tilted Fresnel lens, the embodiment in FIG. 4A and FIG. 4B has a second interface 404 with an optical axis that is not perpendicular to the planar first interface 402 of the optical device 400. Further, in the embodiment shown in FIG. 4A and FIG. 4B, refracted radiation of the first wavelength 416a, 416b, and 416c is focused at a focal point along the z-axis, the optical axis of the second interface 404, when the planar first interface 402 of the optical device 400 is angled such that the incoming rays of incident electromagnetic radiation 414a, 414b, and 414c are not perpendicular to the first interface 402 of the optical device 400.

Advantages of the embodiment in FIG. 4A include the use of a single optical device 400 and the spectral separation of the different wavelengths on the target device 406. Absorption and reflection losses are reduced due to the use of a single optical device 400. The spectral separation and use of multiple electromagnetic radiation energy conversion devices positioned at the target areas 408, 410, and 412, each receiving wavelengths of electromagnetic radiation at which the target area is efficient, results in increased conversion efficiencies.

Figure 4C:
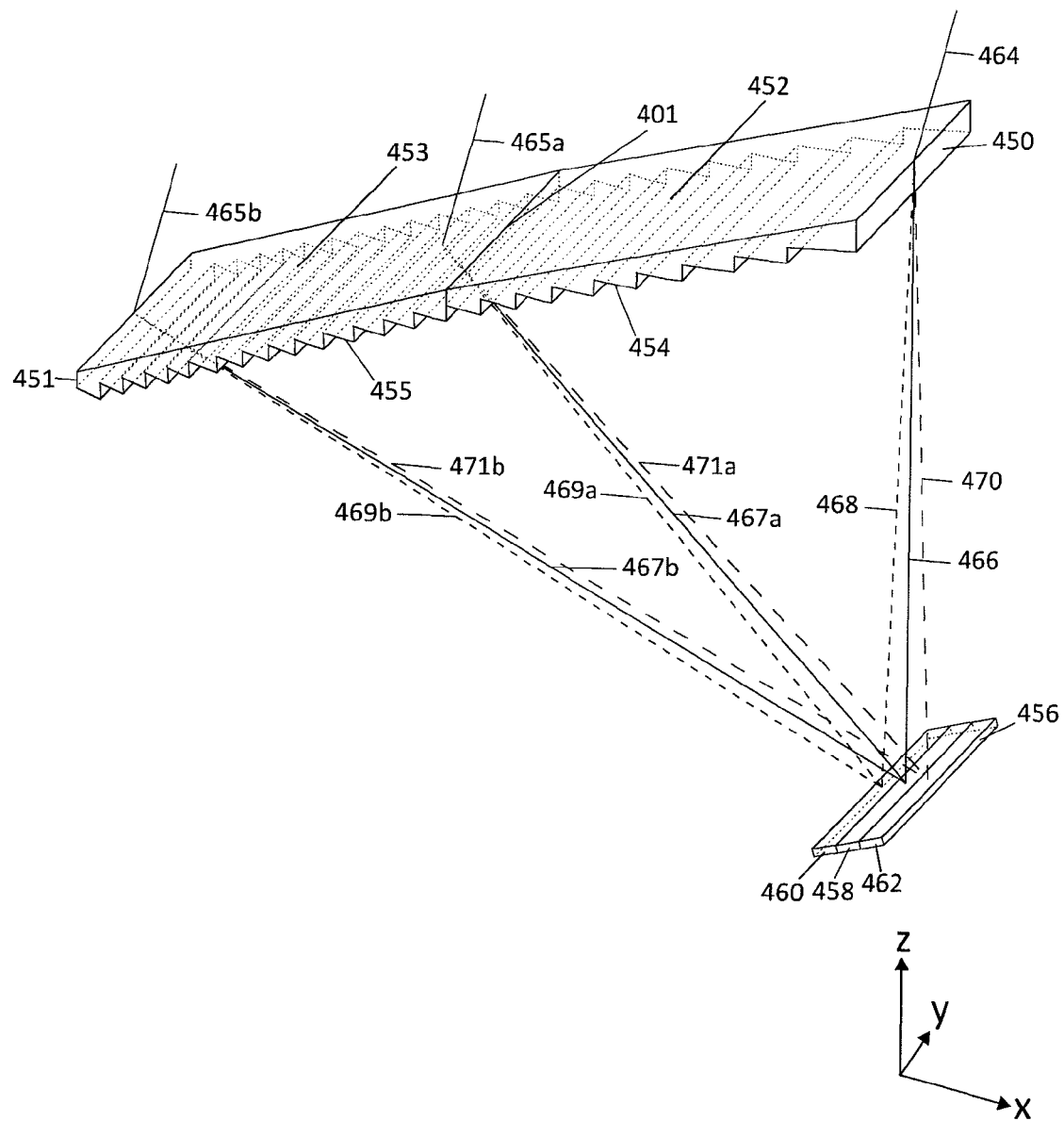
FIG. 4C illustrates a perspective view of an optical device including two areas having multiple discontinuous refractive surfaces according to some embodiments.

An alternative embodiment is shown in FIG. 4C.

FIG. 4C illustrates a perspective view of an optical device 401 including two areas having multiple discontinuous refractive surfaces according to some embodiments. FIG. 4C shows a view of an optical device 401, including a first area 450 and a second area 451, each including a material that is transparent to electromagnetic radiation (such as glass or plastic), that concentrates and disperses electromagnetic radiation in the x-axis. While two areas 450 and 451 are shown, any number of areas may be used in the embodiment. The first area 450 and the second area 451 are made of different materials with different optical characteristics. The first area 450 includes a dispersive first interface 452, tilted about the y-axis, and a concentrating and chromatically dispersive second interface 454, made up of multiple discontinuous refracting surfaces. The second area 451 includes a dispersive first interface 453, tilted about the y-axis, and a concentrating and chromatically dispersive second interface 455, made up of multiple discontinuous refracting surfaces. Reverse ray tracing may be used to find the exact shape of the first interface 452 of the first area 450, the first interface 453 of the second area 451, and each of the multiple discontinuous refracting surfaces, which together make up the concentrating and chromatically dispersing second interface 454 of the first area 450 and the concentrating and chromatically dispersing second interface 455 of the second area 451, such that rays of electromagnetic radiation will converge at the target device 456. The dispersive first interface 452 of the first area 450 and the dispersive first interface 453 of the second area 451 disperse the electromagnetic radiation, and the second interface 454 of the first area 450 and the second interface 455 of the second area 451 concentrate the electromagnetic radiation onto a target device 456.

The target device 456 is tilted about the y-axis, and includes multiple target areas 458, 460, and 462. The target device 456, shown in FIG. 4C, includes three target areas: first target area 458, second target area 460, and third target area 462. The target areas have a width along the y-axis equal to the width of the first area 450 and second area 451 along the y-axis, since there is no concentration along the y-axis. The target device has a width along the x-axis that is less than the width of the optical device 401 along the x-axis, since concentration occurs in the x-axis. While three target areas 458, 460, and 462 are shown, any number of target areas may be used.

Incident electromagnetic radiation 464 intersect the dispersive first interface 452 of the first area 450 and incident electromagnetic radiation 465*a* and 465*c* intersect the dispersive first interface 453 of the second area 451 at an angle from the z-axis. The rays are dispersed into multiple wavelengths. Only three discrete wavelengths are shown in FIG. 4C, which include a first wavelength refracted radiation 466 of the first area 450 and first wavelength refracted radiation 467*a* and 467*b* of the second area 451, second wavelength refracted radiation 468 of the first area 450 and second wavelength refracted radiation 469*a* and 469*b* of the second area 451, and third wavelength refracted radiation 470 of the first area 450 and third wavelength refracted radiation 471*a* and 471*b* of the second area 451. The angle between the incident electromagnetic radiation 464 of the first area 450 and the dispersive first interface 452 of the first area 450 may be set such that the first wavelength refracted radiation 466 is travelling through the first area 450 parallel to the z-axis. The angle between the incident electromagnetic radiation 465*a* and 465*b* of the second area 451 and the dispersive first interface 453 of the second area 451 may be set such that the first wavelength refracted radiation 467*a* and 467*b* are travelling through the second area 451 parallel to the z-axis.

Positioning of the target device 456 may be set such that the first wavelength refracted radiation rays 466, 467*a*, and 467*b* intersect with the first target area 458, the second wavelength refracted radiation rays 468, 469*a*, and 469*b* intersect with the second target area 460, and the third wavelength refracted radiation rays 470, 471*a*, and 471*b* intersect with the third target area 462.

The embodiment in FIG. 4C is similar to the embodiment in FIG. 4A, and a complete description of which is therefore omitted. A difference between the embodiment in FIG. 4C and the embodiment in FIG. 4A is the two areas 450 and 451 made of different materials with different Abbe numbers.

The Abbe number is frequently used to characterize the dispersive properties of optical materials; the amount of dispersion is inversely proportional to the Abbe number. The material of the second area 451 of the embodiment in FIG. 4C may be selected to have a higher Abbe number than the material of the first area 450, resulting in lower dispersion. This particular relationship between the Abbe number of the first area 450 and the second area 451, provides enhanced spectral separation of the wavelengths at the focal areas of the first, second, and third wavelengths 467*a*, 467*b*, 468, 469*a*, 469*b*, 470, 471*a*, and 471*b*.

Figure 5:
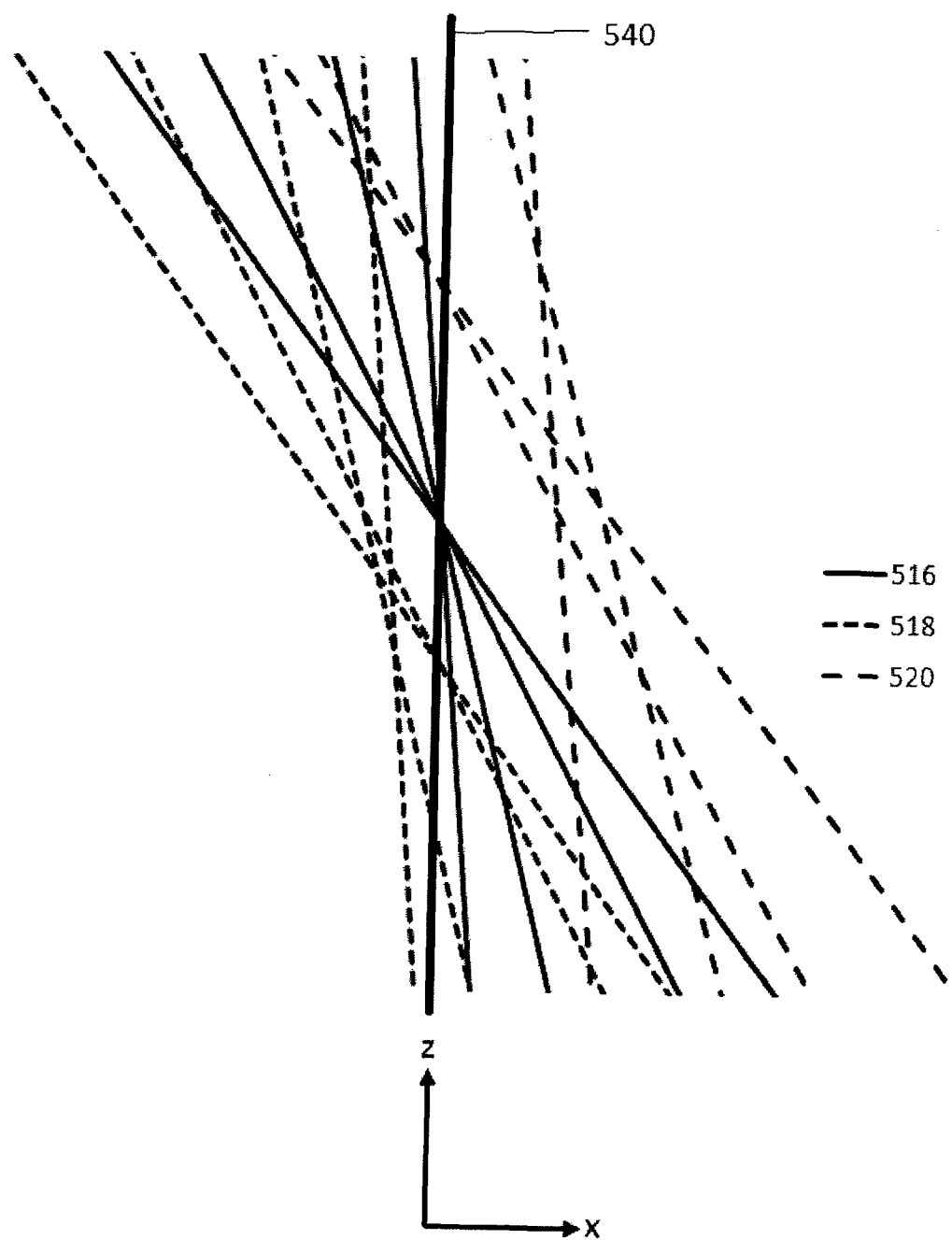
FIG. 5 illustrates ray tracing of an optical device with two Abbe numbers.

FIG. 5 illustrates ray tracing of an optical device with two Abbe numbers. FIG. 5 shows a close-up view of the focal area of three wavelengths of electromagnetic radiation 516, 518, and 520 after being dispersed and concentrated by the optical device located above the focal areas shown in FIG. 5. The optical axis, which is parallel to the z-axis, is represented by a vertical line 540 in FIG. 5. The ray trace of the three wavelengths of electromagnetic radiation 516, 518, and 520 shown in FIG. 5 shows that the focal area for each wavelength of electromagnetic radiation differs in location from the focal areas of the other wavelengths in both the x-axis and the z-axis. The focal areas of three different wavelengths of electromagnetic radiation may be oriented such that relative to one another they are not parallel to the incident electromagnetic radiation.

It is beneficial for the target device, which is not shown in FIG. 5, to be positioned at or near the focal points because chromatic separation of the wavelengths is more precise close to their focal points. Improved chromatic separation allows for a higher overall efficiency, since more of the electromagnetic radiation of a given wavelength will be incident on a target area with an electromagnetic radiation energy conversion device, which can efficiently convert the electromagnetic radiation of that wavelength to another form of energy. Thus, the embodiment in FIG. 4C is able to yield higher conversion efficiencies than conventional designs by allowing the target device 456 to be positioned at an angle that reduces the off-normal incident angle of electromagnetic radiation on the target device 456, which reduces reflective losses while the target device 456 is also positioned at or near the focal points of the electromagnetic radiation.

It can be seen in FIG. 4C that the tilt about the y-axis is different for the first area 450 and the second area 451. The Abbe numbers and refractive indexes of the materials of which the two optical areas are made are different. A different tilt of the first area 450 and the second area 451 about the y-axis is required such that the first wavelength refracted radiation 466 is travelling through the first area 450 parallel to the z-axis, and the first wavelength refracted radiation 467*a* and 467*b* are travelling through the second area 451 parallel to the z-axis.

An advantage of the embodiment in FIG. 4C, in addition to the advantages listed of the embodiment in FIG. 4A, is the enhanced spectral separation, which allows the electromagnetic radiation energy conversion devices placed at the target areas 458, 460, and 462 to operate at higher efficiencies, resulting in a higher overall conversion efficiency.

Figure 6:
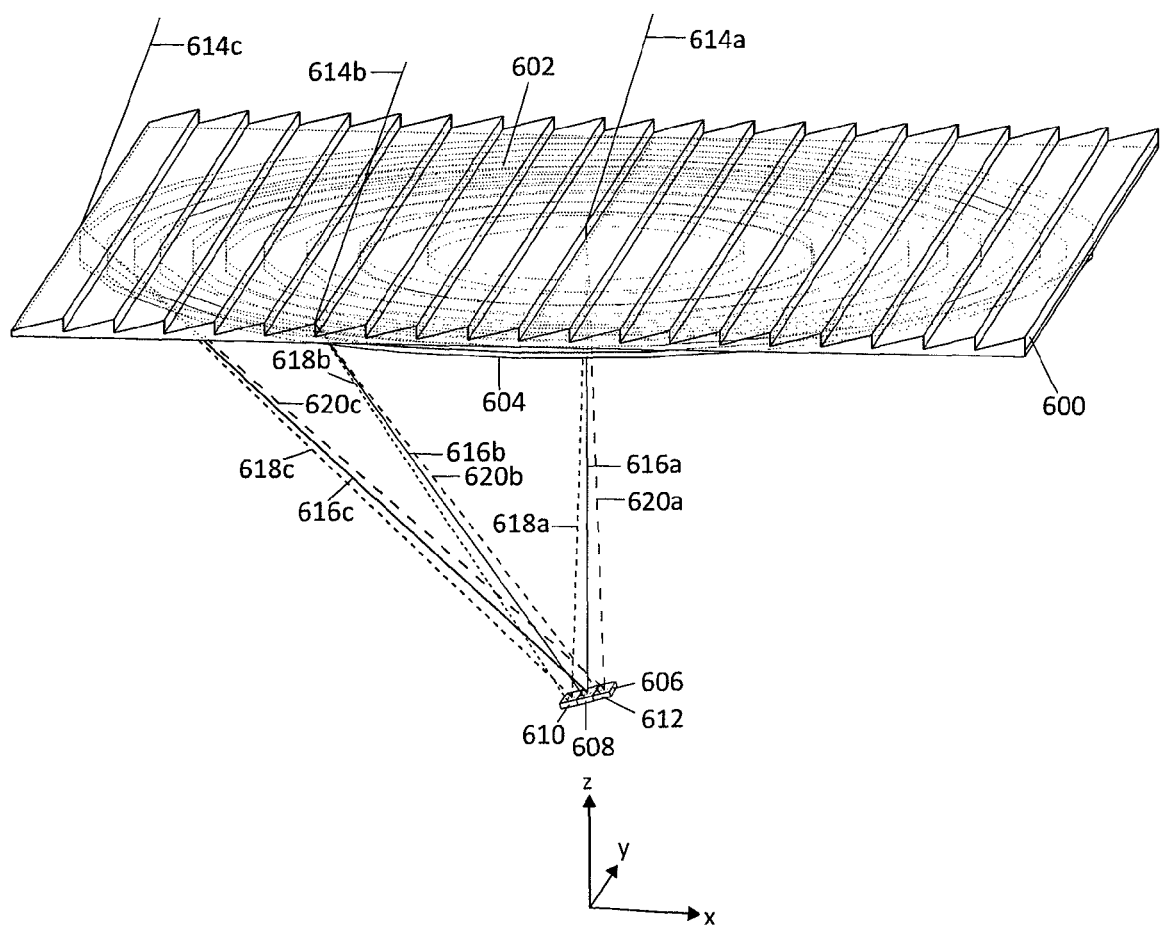
FIG. 6 illustrates a perspective view of an optical device including multiple discontinuous concentric refractive surfaces according to some embodiments.

An alternative embodiment is shown in FIG. 6.

FIG. 6 illustrates a perspective view of an optical device 600 including multiple different interfaces and multiple discontinuous refractive surfaces according to some embodiments. FIG. 6 shows a view of an optical device 600 including a material that is transparent to electromagnetic radiation (such as glass or plastic), which concentrates and disperses electromagnetic radiation in the x-axis and concentrates electromagnetic radiation in the y-axis. The optical device 600 includes a dispersive first interface 602, made up of multiple discontinuous surfaces tilted around the y-axis, and a concentrating second interface 604, made up of multiple discontinuous refracting surfaces. The discontinuous refracting surfaces of the second interface 604 are concentric and concentrate electromagnetic radiation in the x-axis and y-axis. While the concentric discontinuous refracting surfaces of the second interface 604 are shown to be circular in shape in FIG. 6, concentric discontinuous refracting surfaces of other shapes, such as rectangular concentric discontinuous refracting surfaces, may be used. Reverse ray tracing may be used to find the exact shape of the first interface 602 and each of the multiple discontinuous refracting surfaces, which together make up the concentrating second interface 604, such that rays will converge at the target device 606. The dispersive first interface 602 chromatically disperses the electromagnetic radiation and the second interface 604 concentrates and chromatically disperses the electromagnetic radiation onto a target device 606.

The target device 606 is tilted around the y-axis and consists of multiple target areas. The target device 606, shown in FIG. 6, consists of three target areas: first target area 608, second target area 610, and third target area 612. The target areas 608, 610, and 612 have a width along the y-axis less than the width of the optical device 600 along the y-axis, since there is concentration along the y-axis. The target device 606 has a width along the x-axis less than the width of the optical device 600 along the x-axis, since there is concentration in the x-axis. While three target areas 608, 610, and 612 are shown, any number of target areas may be used in the embodiment.

Incident electromagnetic radiation 614a, 614b, and 614c intersect the dispersive first interface 602 at an angle from the z-axis. The rays are dispersed into multiple wavelengths. Only three discrete wavelengths are shown: first wavelength refracted radiation 616a, 616b, and 616c, second wavelength refracted radiation 618a, 618b, and 618c, and third wavelength refracted radiation 620a, 620b, and 620c. The angle between the incident electromagnetic radiation 614a, 614b, and 614c and the surfaces of the dispersive first interface 602 is chosen such that the first wavelength refracted radiation 618a, 618b, and 618c rays are travelling through the optical device 600 parallel to the z-axis.

Positioning of the target device 606 is chosen such that the first wavelength refracted radiation rays 616a, 616b, and 616c intersect with the first target area 608, the second wavelength refracted radiation rays 618a, 618b, and 618c intersect with the second target area 610, and the third wavelength refracted radiation rays 620a, 620b, and 620c intersect with the third target area 612.

The optical device 600 in FIG. 6 consists of a single piece, made of one material with one Abbe number, but any number of pieces or areas, with different Abbe numbers, can be used.

The location of the focal points for the first, second, and third wavelengths 616a, 616b, 616c, 618a, 618b, 618c, 620a, 620b, and 620c may be different from one another in both the x-axis and the z-axis. The advantage of having the focal points for different wavelengths vary in both the x-axis and the z-axis has been previously discussed.

The embodiment in FIG. 6 is similar to the embodiment in FIG. 4A. A difference between the embodiment in FIG. 6 and the embodiment in FIG. 4A is the concentration in the y-axis. The total concentration is the product of the concentration in the x direction and the concentration in the y direction. Additional concentration allows for a smaller area target device 606 and increased intensity of the electromagnetic radiation incident on the target device 606. An advantage of the decrease in area of the target device 606 is cost reduction. Increased intensity of the electromagnetic radiation, incident on the target device 606, may result in increased conversion efficiencies.

Figure 7A:
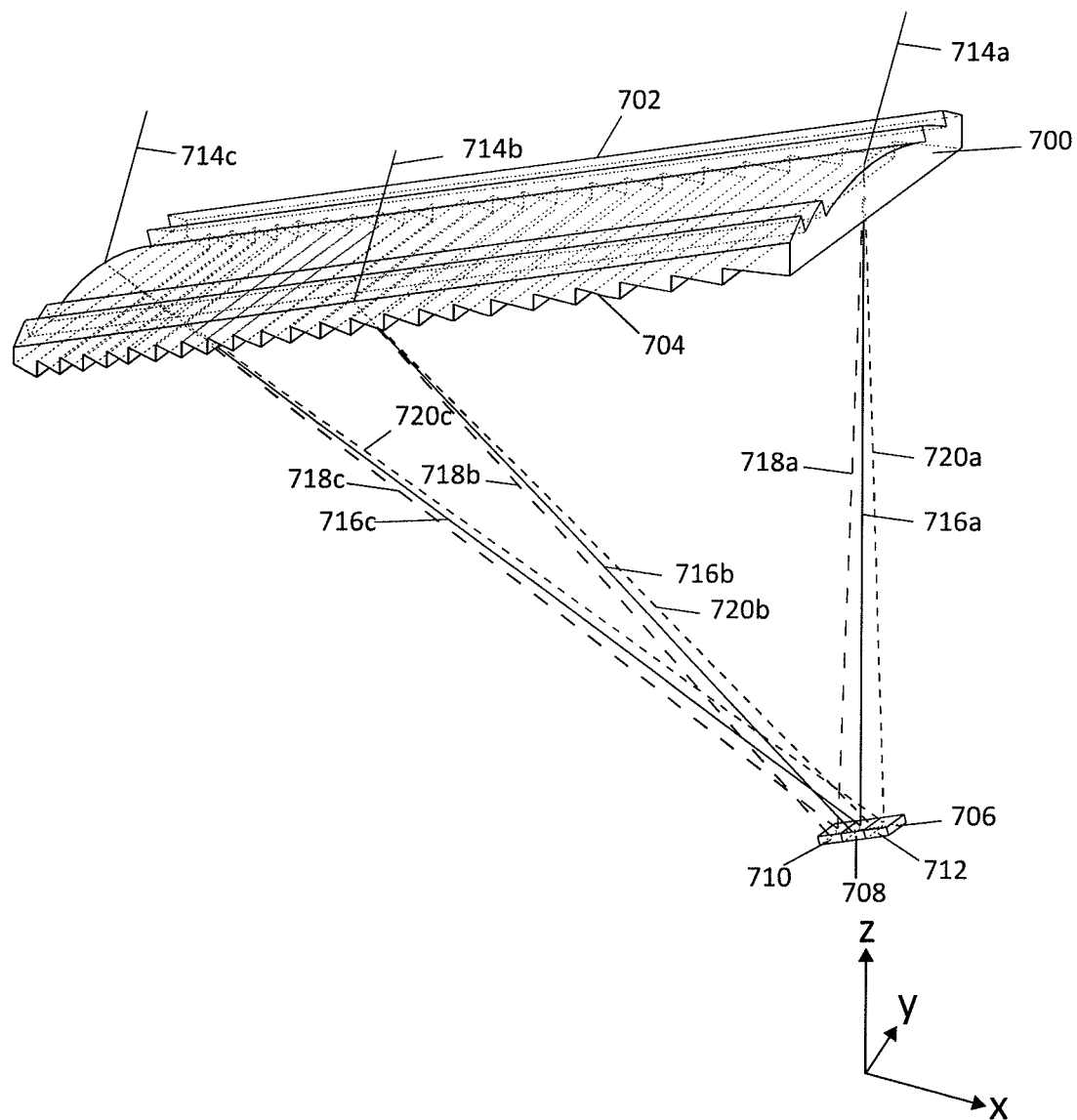
FIG. 7A illustrates a perspective view of an optical device including multiple different interfaces and multiple discontinuous refractive surfaces according to some embodiments.

An alternative embodiment is shown in FIG. 7A.

FIG. 7A illustrates a perspective view of an optical device 700 including multiple different interfaces and multiple discontinuous refractive surfaces according to some embodiments. FIG. 7A shows a view of an optical device 700 including a material that is transparent to electromagnetic radiation (such as glass or plastic), which concentrates and disperses electromagnetic radiation in the x-axis and concentrates electromagnetic radiation in the y-axis. The optical device 700 includes a concentrating and dispersive first interface 702, tilted about the y-axis, and a concentrating second interface 704, made up of multiple discontinuous refracting surfaces. The first interface 702 includes a tilted dispersive plane, dispersing electromagnetic radiation in the x-axis, with multiple discontinuous concentrating refracting surfaces that concentrate electromagnetic radiation in the y-axis. Reverse ray tracing may be used to find the exact shape of the first interface 702 and the second interface 704. The first interface 702 disperses the electromagnetic radiation in the x-axis and concentrates electromagnetic radiation in the y-axis, and the second interface 704 concentrates and chromatically disperses the electromagnetic radiation in the x-axis such that rays will converge at a target device 706.

The target device 706 is tilted about the y-axis and includes multiple target areas 708, 710, and 712. The target device 706, shown in FIG. 7A, includes three target areas: first target area 708, second target area 710, and third target area 712. The target areas have a width along the y-axis less than the width of the optical device 700 along the y-axis, since there is concentration along the y-axis. The target device has a width along the x-axis less than the width of the optical device along the x-axis, since there is concentration in the x-axis. While three target areas 708, 710, and 712 are shown, any number of target areas may be used in the embodiment.

Incident electromagnetic radiation 714a, 714b, and 714c intersect the concentrating dispersive first interface 702 at an angle from the z-axis. The rays are dispersed into multiple wavelengths. Only three discrete wavelengths are shown: first wavelength refracted radiation 716a, 716b, and 716c, second wavelength refracted radiation 718a, 718b, and 718c, and third wavelength refracted radiation 720a, 720b, and 720c. The angle between the incident electromagnetic radiation 714a, 714b, and 714c and the concentrating dispersive first interface 702 may be set such that the first wavelength refracted radiation 718a, 718b, and 718c rays are travelling through the optical device 700 in planes perpendicular to the x-axis.

Positioning of the target device 706 may be set so that the first wavelength refracted radiation rays intersect with the first target area 708, the second wavelength refracted radiation rays intersect with the second target area 710, and the third wavelength refracted radiation rays intersect with the third target area 712.

The location of the focal points for the first, second, and third wavelengths 716a, 716b, 716c, 718a, 718b, 718c, 720a, 720b, and 720c may be different from one another in both the x-axis and the z-axis. The advantage of having the focal points for different wavelengths vary in both the x-axis and the z-axis has been previously discussed.

The embodiment in FIG. 7A is similar to the embodiment in FIG. 4A. A difference between the embodiment in FIG. 7A and the embodiment in FIG. 4A is the concentration in the y-axis. The total concentration is the product of the concentration in the x direction and the concentration in the y direction. Additional concentration allows for a smaller area target device 706 and increased intensity of the electromagnetic radiation incident on the target device. An advantage of the decrease in area of the target device is cost reduction. Increased intensity of the electromagnetic radiation, incident on the target device 706, may result in increased conversion efficiencies.

Figure 7B:
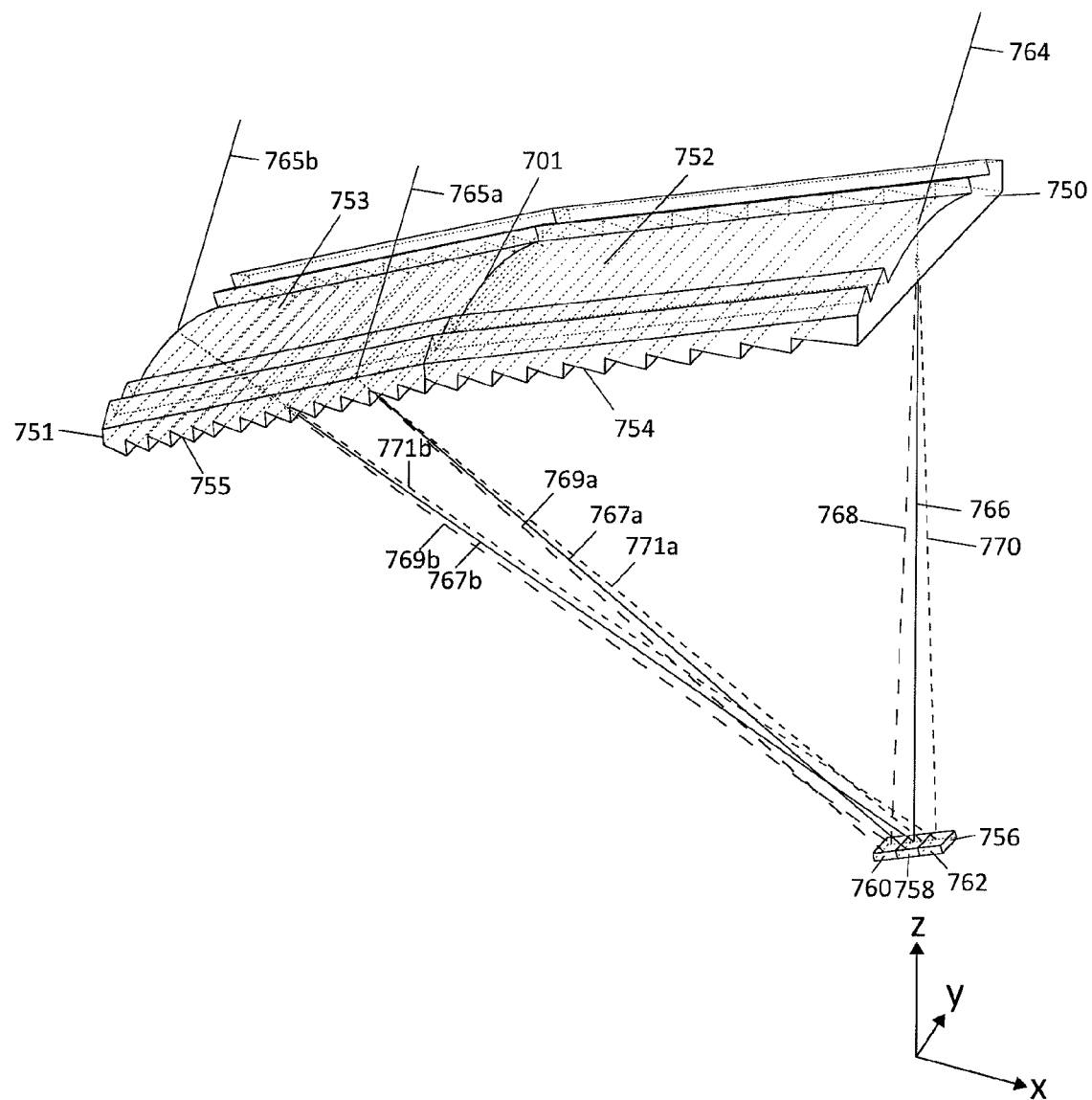
FIG. 7B illustrates a perspective view of an optical device including two interfaces and two areas each having multiple discontinuous refractive surfaces according to some embodiments.

An alternative embodiment is shown in FIG. 7B.

FIG. 7B illustrates a perspective view of an optical device 701 including two areas having multiple discontinuous refractive surfaces according to some embodiments. FIG. 7B shows a view of an optical device 701, including a first area 750 and a second area 751, each including a material that is transparent to electromagnetic radiation (such as glass or plastic), that concentrates and disperses electromagnetic radiation in the x-axis and concentrates electromagnetic radiation in the y-axis. The first area 750 and the second area 751 are made of different materials with different optical characteristics.

The first area 750 includes a concentrating and dispersive first interface 752, tilted about the y-axis, and a concentrating and chromatically dispersing second interface 754, made up of multiple discontinuous refracting surfaces. The first interface 752 includes a tilted dispersive plane, dispersing electromagnetic radiation in the x-axis, with multiple discontinuous concentrating refracting surfaces that concentrate electromagnetic radiation in the y-axis. Reverse ray tracing may be used to find the exact shape of the first interface 752 and the second interface 754. The first interface 752 disperses the electromagnetic radiation in the x-axis and concentrates electromagnetic radiation in the y-axis, and the second interface 754 concentrates and chromatically disperses the electromagnetic radiation in the x-axis, such that rays will converge at a target device 756.

The second area 751 includes a concentrating and dispersive first interface 753, tilted about the y-axis, and a concentrating and chromatically dispersing second interface 755, made up of multiple discontinuous refracting surfaces. The first interface 753 includes a tilted dispersive plane, dispersing electromagnetic radiation in the x-axis, with multiple discontinuous concentrating refracting surfaces that concentrate electromagnetic radiation in the y-axis. Reverse ray tracing may be used to find the exact shape of the first interface 753 and the second interface 755. The first interface 753 disperses the electromagnetic radiation in the x-axis and concentrates electromagnetic radiation in the y-axis, and the second interface 755 concentrates and chromatically disperses the electromagnetic radiation in the x-axis, such that rays will converge at a target device 756.

The target device 756 is tilted about the y-axis and includes multiple target areas 758, 760, and 762. The target device 756, shown in FIG. 7B, includes three target areas: first target area 758, second target area 760, and third target area 762. The target areas have a width along the y-axis less than the width of the optical device 701 made up of the first area 750 and second area 751 along the y-axis, since there is concentration along the y-axis at the first interface 752 of the first area 750 and the first interface 752 of the second area 751. The target device 756 has a width along the x-axis less than the width of the optical device 701 made up of the first area 750 and the second area 752 along the x-axis, since there is concentration in the x-axis at the second interface 754 of the first area 750 and the second interface 755 of the second area 750. While three target areas 758, 760, and 762 are shown, any number of target areas may be used in the embodiment.

Incident electromagnetic radiation 764 intersect the dispersive first interface 752 of the first area 750 at an angle from the z-axis. Incident electromagnetic radiation 765a and 765b intersect the dispersive first interface 753 of the second area 751 at an angle from the z-axis. The incident rays 764, 765a, and 765b are dispersed into multiple wavelengths. Only three discrete wavelengths are shown: first wavelength refracted radiation 766 of the first area 750 and first wavelength refracted radiation 767a and 767b of the second area 751, second wavelength refracted radiation 768 of the first area 750 and second wavelength refracted radiation 469a and 469b of the second area 751, and third wavelength refracted radiation 770 of the first area 750 and third wavelength refracted radiation 771a and 771b of the second area 751. The angle between the incident electromagnetic radiation 764 of the first area 750 and the dispersive first interface 752 of the first area 750 may be set such that the first wavelength refracted radiation 766 is traveling through the first area 750 in planes perpendicular to the x-axis. The angle between the incident electromagnetic radiation 765a and 765b of the second area 751 and the dispersive first interface 753 of the second area 751 may be set such that the first wavelength refracted radiation 767a and 767b are traveling through the second area 751 in planes perpendicular to the x-axis.

Positioning of the target device 756 may be set such that the first wavelength refracted radiation rays 766, 767a, and 767b intersect with the first target area 758, the second wavelength refracted radiation rays 768, 769a, and 769b intersect with the second target area 760, and the third wavelength refracted radiation rays 770, 771a, and 771b intersect with the third target area 762.

The embodiment in FIG. 7B is similar to the embodiment in FIG. 7A. A difference between the embodiment in FIG. 7B and the embodiment in FIG. 7A is the two areas 750 and 751, made of different materials with different Abbe numbers.

The advantages of using multiple areas, made of different materials with different Abbe numbers, have been discussed previously.

Figure 8A:
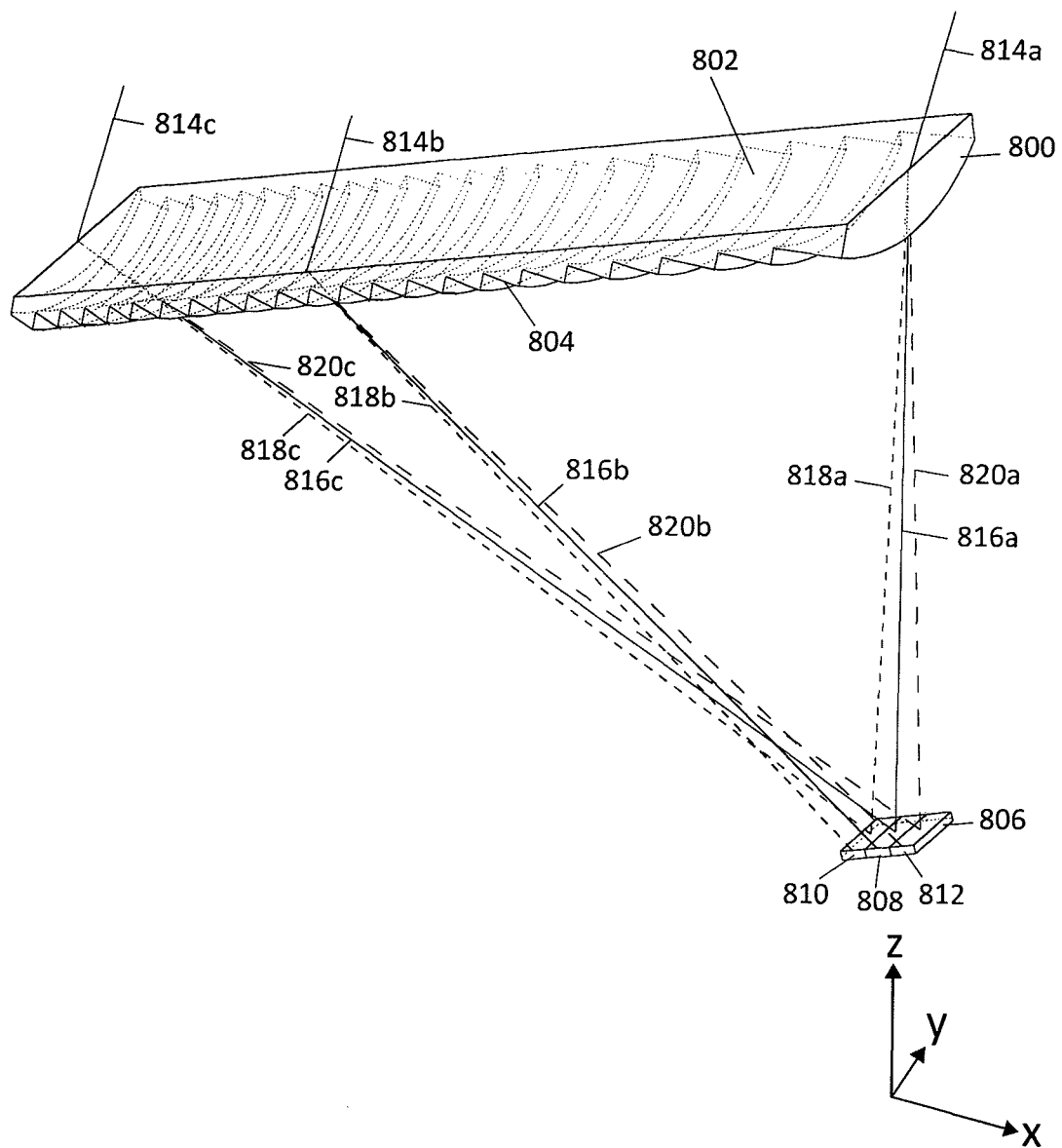
FIG. 8A illustrates a perspective view of an optical device including multiple discontinuous refractive surfaces according to some embodiments.

An alternative embodiment is shown in FIG. 8A.

FIG. 8A shows a view of an optical device 800 including a material that is transparent to electromagnetic radiation (such as glass or plastic), which concentrates and disperses electromagnetic radiation in the x-axis and concentrates electromagnetic radiation in the y-axis. The optical device 800 includes a first interface 802, tilted about the y-axis, and a second interface 804, made up of multiple discontinuous refracting surfaces. The first interface 802 includes a tilted dispersive plane, dispersing electromagnetic radiation in the x-axis. Reverse ray tracing may be used to find the exact angle and shape of the first interface 802 and the second interface 804. The second interface concentrates the electromagnetic radiation in the x-axis and the y-axis, such that rays will converge at a target device 806.

The target device 806 is tilted about the y-axis and includes multiple target areas 808, 810, and 812. The target device 806, shown in FIG. 8A, includes three target areas: first target area 808, second target area 810, and third target area 812. The target areas 808, 810, and 812 and target device 806 have a width along the y-axis less than the width of the optical device 800 along the y-axis, since there is concentration along the y-axis. The target device 806 has a width along the x-axis less than the width of the optical device 800 along the x-axis, since there is concentration in the x-axis. While three target areas 808, 810, and 812 are shown, any number of target areas may be used in the embodiment.

Incident electromagnetic radiation 814a, 814b, and 814c intersect the angled planar first interface 802 at an angle from the z-axis. The rays are dispersed into multiple wavelengths. Only three discrete wavelengths are shown: first wavelength refracted radiation 816a, 816b, and 816c, second wavelength refracted radiation 818a, 818b, and 818c, and third wavelength refracted radiation 820a, 820b, and 820c. The angle between the incident electromagnetic radiation 814a, 814b, and 814c and the dispersive first interface 802 may be set such that the first wavelength refracted radiation 818a, 818b, and 818c rays are travelling through the optical device 800 parallel to the z-axis.

Positioning of the target device 806 may be set such that the first wavelength refracted radiation rays 816a, 816b, and 816c intersect with the first target area 808, the second wavelength refracted radiation rays 818a, 818b, and 818c intersect with the second target area 810, and the third wavelength refracted radiation rays 820a, 820b, and 820c intersect with the third target area 812.

The embodiment in FIG. 8A is similar to the embodiment in FIG. 4A. A difference between the embodiment in FIG. 8A and the embodiment in FIG. 4A is the concentration in the y-axis. The total concentration is the product of the concentration in the x direction and the concentration in the y direction. Additional concentration allows for a smaller area target device 806 and increased intensity of the electromagnetic radiation incident on the target device 806. An advantage of the decrease in area of the target device 806 is cost reduction.

Increased intensity of the electromagnetic radiation, incident on the target device 806, may result in increased conversion efficiencies.

The embodiment in FIG. 8A shows an optical device 800 with a second interface 804, which has discontinuous refracting surfaces that are discontinuous in the x-axis. An embodiment may also have a second interface of the optical device, which has discontinuous refracting surfaces that are discontinuous in both the x-axis and the y-axis.

Figure 8B:
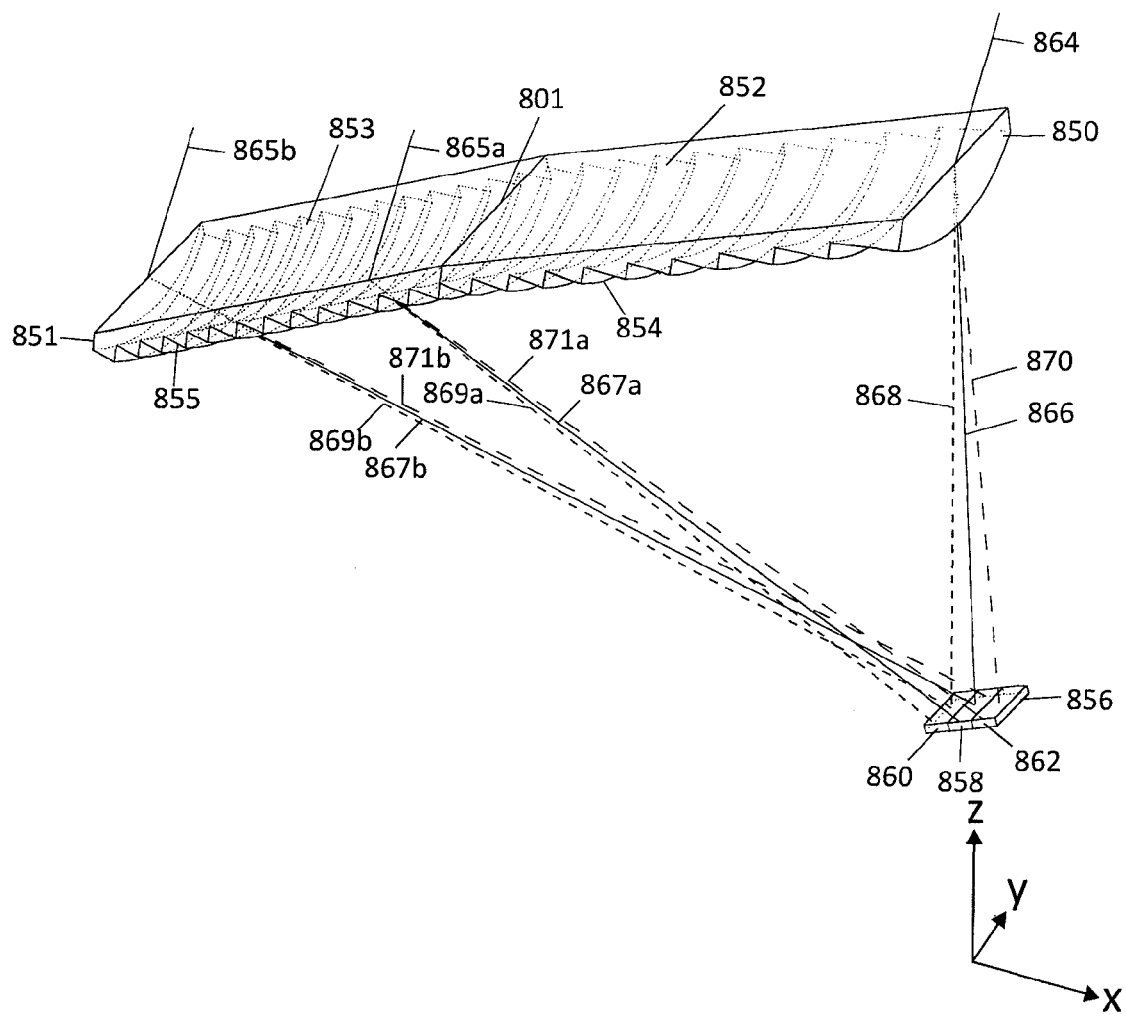
FIG. 8B illustrates a perspective view of an optical device including two areas having multiple discontinuous refractive surfaces according to some embodiments.

An alternative embodiment is shown in FIG. 8B.

FIG. 8B illustrates a perspective view of an optical device 801 including two areas having multiple discontinuous refractive surfaces according to some embodiments. FIG. 8B shows a view of an optical device 801, including a first area 850 and a second area 851, each including a material that is transparent to electromagnetic radiation (such as glass or plastic), that concentrates and disperses electromagnetic radiation in the x-axis and concentrates electromagnetic radiation in the y-axis. The first area 850 and the second area 851 are made of different materials with different optical characteristics.

The first area 850 includes a dispersive first interface 852, tilted about the y-axis, and a concentrating second interface 854, made up of multiple discontinuous refracting surfaces. The first interface 852 includes a tilted dispersive plane, dispersing electromagnetic radiation in the x-axis. Reverse ray tracing may be used to find the exact angle and shape of the first interface 852 and the second interface 854. The first interface 852 disperses the electromagnetic radiation in the x-axis and the second interface 854 concentrates the electromagnetic radiation in the x-axis and the y-axis, and also chromatically disperses electromagnetic radiation in the x-axis, such that rays will converge at a target device 856.

The second area 851 includes a dispersive first interface 853, tilted about the y-axis, and a concentrating second interface 855, made up of multiple discontinuous refracting surfaces. The first interface 853 includes a tilted dispersive plane, dispersing electromagnetic radiation in the x-axis. Reverse ray tracing may be used to find the exact angle and shape of the first interface 853 and the second interface 855. The first interface 853 disperses the electromagnetic radiation in the x-axis and the second interface 855 concentrates the electromagnetic radiation in the x-axis and the y-axis, and also chromatically disperses electromagnetic radiation in the x-axis, such that rays will converge at a target device 856.

The target device 856 is tilted about the y-axis, and includes multiple target areas 858, 860, and 862. The target device 856, shown in FIG. 8B, includes three target areas: first target area 858, second target area 860, and third target area 862. The target areas have a width along the y-axis less than the width of the first area 850 and second area 851 of the optical device 801 along the y-axis, since there is concentration along the y-axis at the second interface 854 of the first area 850 and the second interface 855 of the second area 851. The target device 856 has a width along the x-axis less than the width of the optical device 801 made up of the first area 850 and the second area 852 along the x-axis, since there is concentration in the x-axis at the second interface 854 of the first area 850 and the second interface 855 of the second area 850. While three target areas 858, 860, and 862 are shown, any number of target areas may be used in the embodiment.

Incident electromagnetic radiation 864 intersect the dispersive first interface 852 of the first area 850 and incident electromagnetic radiation 865a and 865b intersect the dispersive first interface 853 of the second area 851 at an angle from the z-axis. The incident rays 864, 865a, and 865b are dispersed into multiple wavelengths. Only three discrete wavelengths are shown: first wavelength refracted radiation 866 of the first area 850 and first wavelength refracted radiation 867a and 867b of the second area 851, second wavelength refracted radiation 868 of the first area 850 and second wavelength refracted radiation 869a and 869b of the second area 851, and third wavelength refracted radiation 870 of the first area 850 and third wavelength refracted radiation 871a and 871b of the second area 851. The angle between the incident electromagnetic radiation 864 of the first area 850 and the dispersive first interface 852 of the first area 850 may be set such that the first wavelength refracted radiation 866 is traveling through the first area 850 parallel to the z-axis. The angle between the incident electromagnetic radiation 865a and 865b of the second area 851 and the dispersive first interface 853 of the second area 851 may be set such that the first wavelength refracted radiation 867a and 867b are traveling through the second area 851 parallel to the z-axis.

Positioning of the target device 856 may be set such that the first wavelength refracted radiation rays 866, 867a, and 867b intersect with the first target area 858, the second wavelength refracted radiation rays 868, 869a, and 869b intersect with the second target area 860, and the third wavelength refracted radiation rays 870, 871a, and 871b intersect with the third target area 862.

The embodiment in FIG. 8B is similar to the embodiment in FIG. 8A. A difference between the embodiment in FIG. 8B and the embodiment in FIG. 8A is the two areas 850 and 851, made of different materials with different Abbe numbers.

The advantages of using multiple areas, made of different materials with different Abbe numbers, have been discussed previously.

The embodiment in FIG. 8B shows an optical device 801 with a second interface 854 of a first area 850, which has discontinuous refracting surfaces that are discontinuous in the x-axis. FIG. 8B shows that the optical device 801 has a second interface 855 of a second area 851, which has discontinuous refracting surfaces that are discontinuous in the x-axis. An embodiment may also have a second interface of a first area, which has discontinuous refracting surfaces that are discontinuous in both the x-axis and the y-axis and a second interface of a second area, which has discontinuous refracting surfaces that are discontinuous in both the x-axis and the y-axis.

Figure 9A:
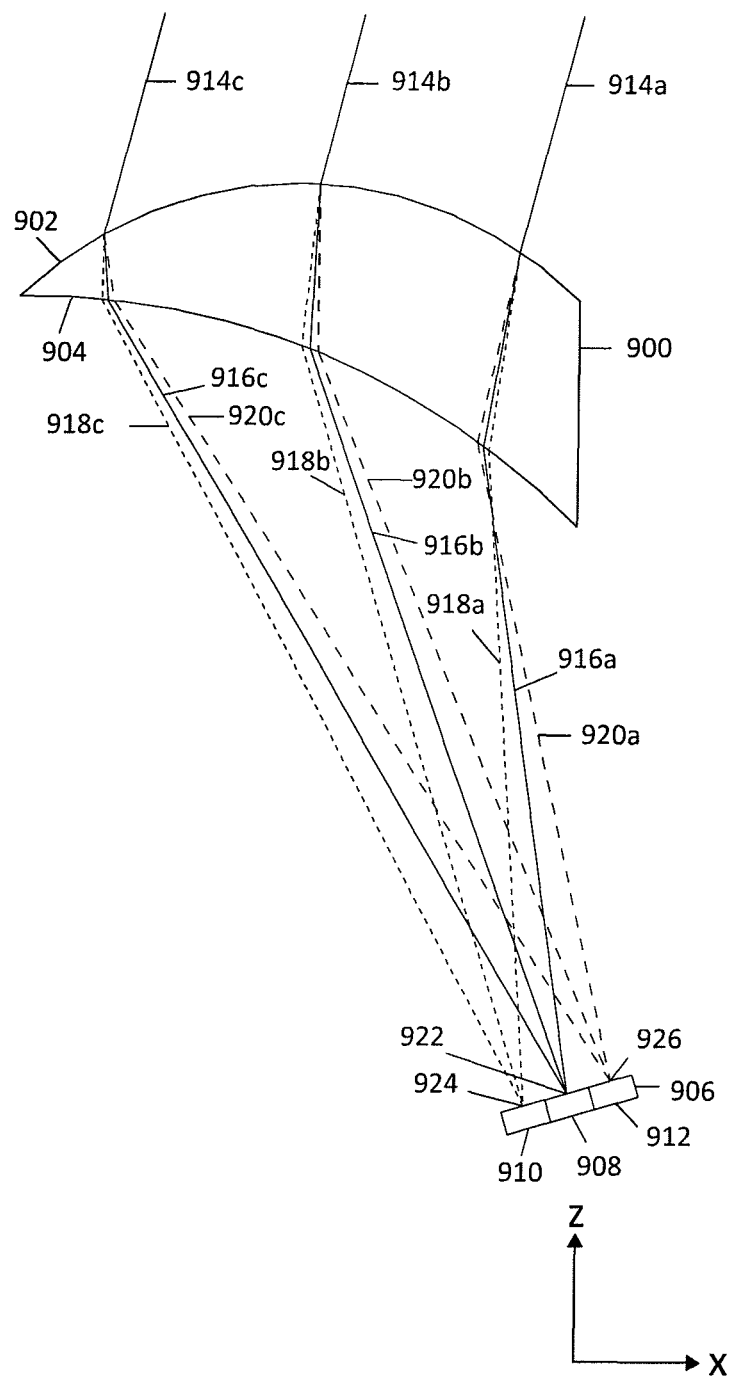
FIG. 9A illustrates a cross section of an optical device including two interfaces according to some embodiments.
Figure 9B:
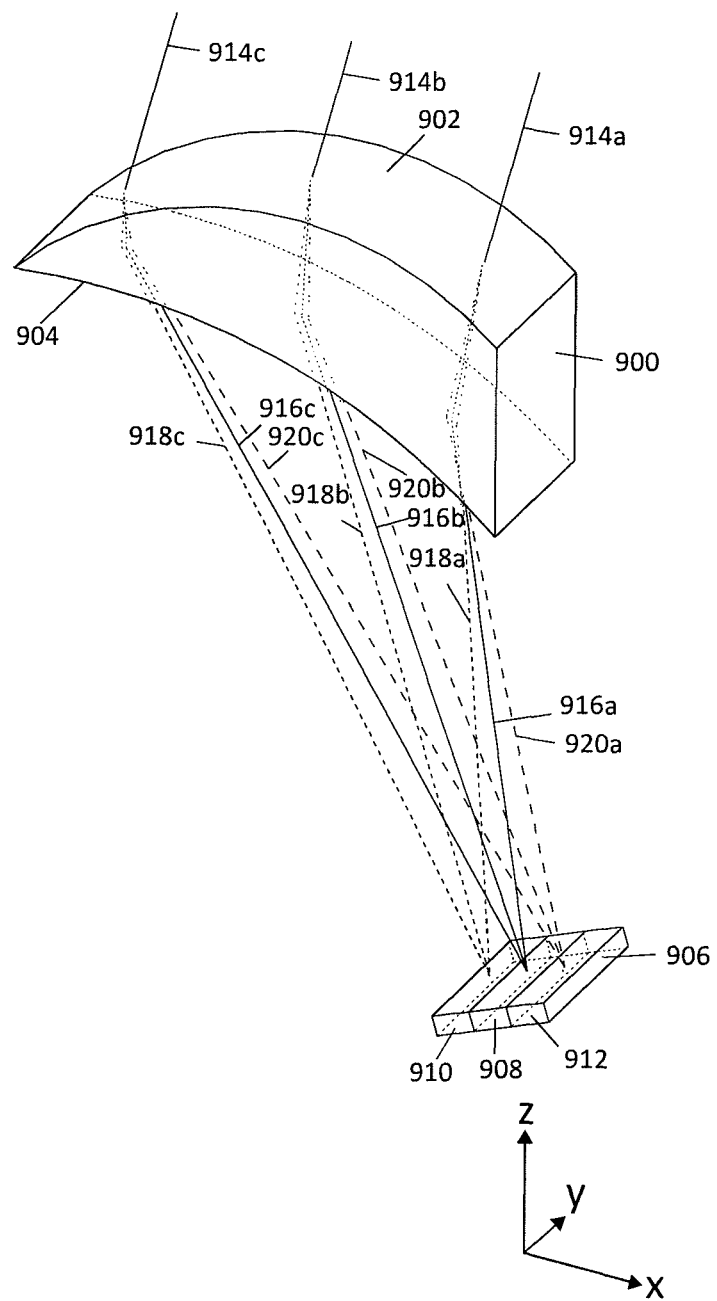
FIG. 9B illustrates a perspective view of an optical device of FIG. 9A.

An optical device according to some embodiments will be described in greater detail with reference to FIG. 9A and FIG. 9B. FIG. 9A illustrates a cross section of an optical device including two interfaces according to some embodiments. FIG. 9B illustrates a perspective view of an optical device of FIG. 9A. As illustrated in FIG. 9A, an optical device 900 includes a material transparent to electromagnetic radiation (such as glass or plastic). The optical device 900 has two interfaces, a first interface 902 and a second interface 904, between the optical device 900 and the surrounding medium. The first interface 902 is a convex surface. The second interface 904 is a concave surface. The first interface 902 and the second interface 904 are both curved surfaces. FIG. 9B shows a perspective view of the optical device. The optical device is made of a single material and a single piece.

Figure 10:
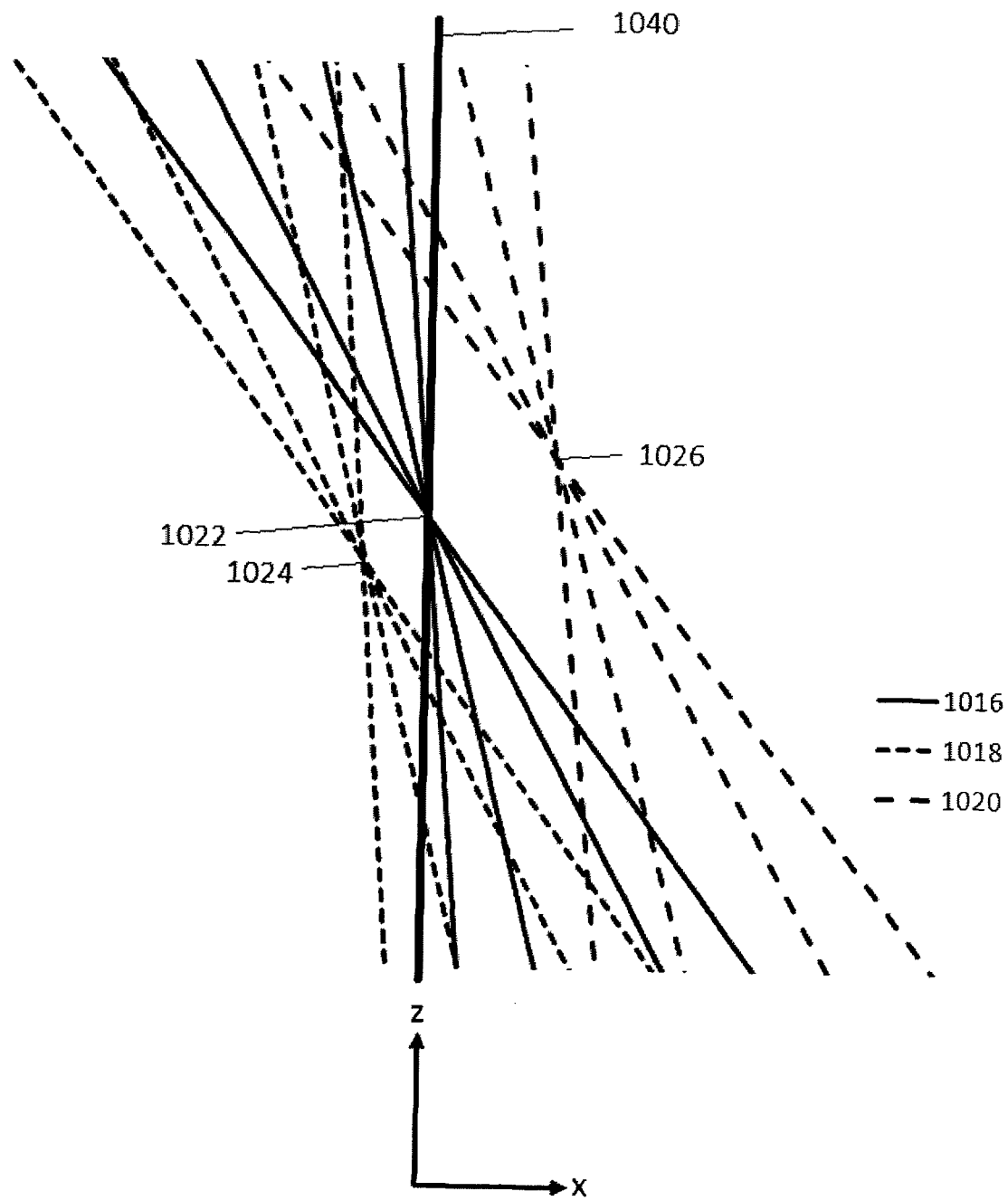
FIG. 10 illustrates ray tracing of an optical device with concentration and dispersion in two interfaces.

To aid in understanding FIG. 9A, FIG. 9B, and FIG. 10, the x-axis is defined as the axis along which the optical device 900 concentrates electromagnetic radiation. The y-axis is defined as lying within the plane of the target device 906 and is perpendicular to the x-axis. The z-axis is perpendicular to both the x-axis and the y-axis and intersects the focal point 922 of the first wavelength of refracted electromagnetic radiation 916a, 916b, and 916c.

Incident electromagnetic radiation 914a, 914b, and 914c is refracted in the x-axis by the first interface 902 of the optical device 900. The refracted electromagnetic radiation rays of a first wavelength 916a, 916b, and 916c, at different x-positions, travel inside the optical device 900 at different angles. Similarly, refracted electromagnetic radiation rays of any given wavelength that are incident upon the first interface 902 of the optical device 900 at different x-positions travel inside the optical device 900 at different angles due to the curvature of the top interface 902. The second interface 904, which is formed as a concave surface, includes a curvature such that the rays of a first wavelength of refracted radiation 916a, 916b, and 916c are concentrated in the x-axis and brought to a single point of focus 922 on the z-axis. The curvature for the concave surface of the second interface 904 may be determined through a reverse ray tracing method as discussed above.

The optical device 900 and the target device 906 have the same width in the y-axis since there is no concentration of electromagnetic radiation in the y-axis. The target device 906 has less width in the x-axis than the optical device 900 because the optical device 900 concentrates electromagnetic radiation in the x-axis.

A surface of the target device 906 includes a first target area 908, a second target area 910, and a third target area 912. Electromagnetic radiation energy conversion devices, such as solar cells, solar thermal units, or solar chemical units, may be placed at the target areas 908, 910, and 912.

The rays of incident electromagnetic radiation 914a, 914b, and 914c are refracted in the x-axis at wavelength dependent angles at the first interface 902 and the second interface 904. The first interface 902 and the second interface 904 split the spectrum of incident electromagnetic radiation 914a, 914b, and 914c into rays of varying wavelength. FIG. 9A shows a first wavelength of refracted radiation 916a, 916b, and 916c, a second wavelength of refracted radiation 918a, 918b, and 918c, and a third wavelength of refracted radiation 920a, 920b, and 920c each traveling in directions corresponding to their wavelength and the x-position at which each ray of electromagnetic radiation passed through the first interface 902 and the second interface 904.

The first interface 902 and second interface 904 of the optical device 900 concentrate the rays of the first wavelength of refracted radiation 916a, 916b, and 916c in the x-axis to a single point of focus 922 on the z-axis. The rays of the second wavelength of refracted radiation 918a, 918b, and 918c and the rays of the third wavelength of refracted radiation 920a, 920b, and 920c are concentrated in the first axis and are brought to areas of focus 924 and 926 at locations different than the first wavelength focal point 922.

The shape of the first interface 902 and the second interface 904 of the optical device 900 are chosen such that the focal points of the first, second, and third wavelengths 922, 924, and 926, vary in position from each other in respect to both the x-axis and the z-axis. Additionally, the focal points of different wavelengths, relative to one another, are not parallel to the electromagnetic radiation that is incident upon the optical device To aid in understanding the description of the design of the optical device 900, the second wavelength focal area 924 of the rays of the second wavelength of refracted radiation 918a, 918b, and 918c and the third wavelength focal area 926 of the rays of the third wavelength of refracted radiation 920a, 920b, and 920c may also be referred to as focal points even though the refracted rays 918a, 918b, 918c, 920a, 920b, and 920c at the second and third wavelength focal areas 924 and 926 may not be focused to a single point with the same precision as the rays of the first wavelength of refracted radiation 920a, 920b, and 920c at the first wavelength focal point 922. The focal points 924 and 926 of the refracted rays of the second and third wavelength 918a, 918b, 918c, 920a, 920b, and 920c differ in position from the focal point 922 of the refracted rays of the first wavelength 916a, 916b, and 916c along the x-axis and also along the z-axis. The focal points 922, 924, and 926 all differ in location from each other along both the x-axis and the z-axis. The focal points 922, 924, and 926 of three different wavelengths, 916a, 916b, 916c, 918a, 918b, 918c, 920a, 920b, and 920c of electromagnetic radiation may be oriented such that relative to one another they are not parallel to the incident electromagnetic radiation 914a, 914b, and 914c.

FIG. 9A and FIG. 9B show the optical device 900 and a target device 906. The target device 906 is positioned in relation to the optical device 900 such that the first, second, and third wavelength refracted radiation 916a, 916b, 916c, 918a, 918b, 918c, 920a, 920b, and 920c, which is chromatically dispersed in the x-axis and concentrated in the x-axis by the optical device 900, is incident upon a surface of the target device 906. The surface of the target device 906 includes a first target area 908, a second target area 910, and a third target area 912. The first target area 908, second target area 910, and third target area 912 may be in different positions from each other in the x-axis and the z-axis, in the x-axis only, or in the z-axis only. While three target areas 908, 910, and 912 are shown, any number of target areas may be used in the embodiment.

The rays of refracted radiation of the first, second, and third wavelengths 916a, 916b, 916c, 918a, 918b, 918c, 920a, 920b, and 920c are focused by the optical device 900 such that the rays of the first wavelength of refracted radiation 916a, 916b, and 916c are incident on the first target area 908, the rays of the second wavelength of refracted radiation 918a, 918b, and 918c are incident on the second target area 910, and the rays of the third wavelength of refracted radiation 920a, 920b, and 920c are incident on the third target area 912.

FIG. 10 illustrates ray tracing of an optical device with concentration and dispersion in two interfaces. FIG. 10 shows a close up view of the focal points 1022, 1024, 1026 of three wavelengths of electromagnetic radiation 1016, 1018, 1020 after being chromatically dispersed and concentrated by the optical device located above the focal points 1022, 1024, and 1026 shown in FIG. 10. The focal points 1022, 1024, and 1026 of the three wavelengths of electromagnetic radiation 1016, 1018, and 1020 may have enhanced precision compared to those shown in FIG. 3 and FIG. 5 due to the different configurations of the optical devices used to achieve the respective focal points. The z-axis, is represented by a vertical line 1040 in FIG. 10. The ray trace of the three wavelengths of electromagnetic radiation 1016, 1018, and 1020 shown in FIG. 10 shows that the focal point for each wavelength of electromagnetic radiation differs in location from the focal points of the other wavelengths in both the x-axis and the z-axis. The focal points 1022, 1024, and 1026 of three different wavelengths of electromagnetic radiation may be oriented such that relative to one another they are not parallel to the incident electromagnetic radiation.

The target device 906, shown in FIG. 9A and FIG. 9B, is made up of electromagnetic radiation energy conversion devices, such as solar cells, solar thermal units, or solar chemical units that are placed at the target areas 908, 910, and 912. The type and size of the electromagnetic radiation energy conversion devices may be chosen such that ranges of wavelengths and portions of the spectrum are converted to other forms of energy, such as electricity or thermal energy, using devices that are efficient for the respective wavelengths, which are incident upon them. For example, an electromagnetic radiation energy conversion device placed at the first target area 908 is efficient at converting the refracted radiation of the first wavelength 916a, 916b, and 916c to another form of energy. Also, an electromagnetic radiation energy conversion device placed at the second target area 910 is efficient at converting the refracted radiation of the second wavelength 918a, 918b, and 918c to another form of energy. Additionally, an electromagnetic radiation energy conversion device placed at the third target area 912 is efficient at converting the refracted radiation of the third wavelength 920a, 920b, and 920c to another form of energy.

As discussed with reference to FIG. 9A and FIG. 9B, the optical device 900 and the target device 906, may be placed on a tracking mechanism to control the incident angles of the incident radiation 914a, 914b, and 914c on the first interface 902 if a source of the incident electromagnetic radiation 914a, 914b, and 914c, such as the sun, moves. The tracking mechanism may also feature structures to keep the relative position of the optical device 900 and the target device 906 fixed. The structures may also have positioning equipment to adjust the position of the optical device 900 and the target device 906. This positioning equipment can be used to calibrate the position and angle of the optical device 900 and the target device 906 or to move the position of the target device 906 relative to the position of the optical device 900 as part of the tracking mechanism so that the rays of the first wavelength of refracted radiation 916a, 916b, and 916c are incident on the first target area 908, the rays of the second wavelength of refracted radiation 918a, 918b, and 918c are incident on the second target area 910, and the rays of the third wavelength of refracted radiation 920a, 920b, and 920c are incident on the third target area 912.

The tracking mechanism may track the source of the electromagnetic radiation in the x-axis only or in the x-axis and the y-axis. The positioning equipment used to calibrate the position and angle of the optical device 900 and the target device 906 or to move the position of the target device 906 relative to the position of the optical device 900, as part of the tracking mechanism, may calibrate or move the optical device 900 and target device 906 in any direction.

As discussed above, there are conventional designs which use an optical device to concentrate electromagnetic radiation onto an electromagnetic radiation energy conversion device.

One advantage of the embodiment in FIG. 9A and FIG. 9B over conventional designs is that multiple electromagnetic radiation energy conversion devices may be used to efficiently convert multiple portions of the spectrum of electromagnetic energy to other forms of energy. Each portion of the spectrum is converted to another form of energy by a device which has a high efficiency for converting electromagnetic radiation in that portion of the spectrum. Thus, the overall efficiency of converting electromagnetic radiation of several portions of the spectrum may be higher for the embodiment in FIG. 9A and FIG. 9B than conventional designs using an optical device and a single electromagnetic radiation energy conversion device.

Another advantage of the embodiment in FIG. 9A and 9B over conventional designs is that multiple electromagnetic radiation energy conversion devices may be placed in target areas 908, 910, and 912 such that electromagnetic radiation reaches each electromagnetic radiation energy conversion device without passing through other electromagnetic radiation energy conversion devices or other layers of the same electromagnetic radiation energy conversion device. Thus, the embodiment in FIG. 9A and FIG. 9B is free from the reflection and absorption losses that occur in electromagnetic radiation energy conversion systems in which electromagnetic radiation reaches electromagnetic radiation energy conversion devices after passing through other electromagnetic radiation energy conversion devices or other layers of the same electromagnetic radiation energy conversion device.

Another advantage of the embodiment in FIG. 9A and FIG. 9B over conventional designs is that a single optical device 900 is used to disperse and concentrate electromagnetic radiation. Each optical device has accompanying reflection and absorption losses. By using a single optical device 900, reflection and absorption losses are decreased compared to designs that use multiple optical devices to disperse and concentrate electromagnetic radiation. Thus, the transmission efficiency is higher for the embodiment in FIG. 9A and FIG. 9B than optical system designs that use multiple optical devices to disperse and concentrate electromagnetic radiation.

Another advantage of the embodiment in FIG. 9A and FIG. 9B over conventional designs is that the focal points 922, 924, and 926 differ in location from each other along both the x-axis and z-axis. The focal points 922, 924, and 226 differ in location from each other along the x-axis because of the dispersion of the incident electromagnetic radiation 914a, 914b, and 914c in the x-axis that takes place at the first interface 902 and second interface 904 of the optical device 900. The concentration in the x-axis of the refracted electromagnetic radiation of the first, second, and third wavelengths 916a, 916b, 916c, 918a, 918b, 918c, 920a, 920b, and 920c also takes place at both the first interface 902 and second interface 904 of the optical device 900. The variance in the position of the focal points 922, 924, and 926 in the x-axis reduces reflective losses at the surface of a target device 906 in which each of the target areas 908, 910, and 912 are positioned at or near the focal points 922, 924, and 926. Because the focal points 922, 924, and 926 vary in position in the x-axis in addition to the z-axis the target device may be angled such that it is not parallel to the z-axis while positioning each of the target areas 908, 910, and 912 at or near the focal points 922, 924, and 926. By angling the target device 906 such that it is not parallel to the z-axis, the off-normal incident angle of the refracted electromagnetic radiation of the first, second, and third wavelengths 916a, 916b, 916c, 918a, 918b, 918c, 920a, 920b, and 920c relative to the surface of the target device 906 is reduced, which reduces the reflection losses at the target areas 908, 910, and 912 on the surface of the target device 906. Additionally, reducing the off-normal incident angle of the refracted electromagnetic radiation of the first, second, and third wavelengths 916a, 916b, 916c, 918a, 918b, 918c, 920a, 920b, and 920c relative to the surface of the target device 906, increases the concentration of the refracted electromagnetic radiation of the first, second, and third wavelengths 916a, 916b, 916c, 918a, 918b, 918c, 920a, 920b, and 920c at the target areas 908, 910, and 912. Increasing the concentration of the refracted electromagnetic radiation of the first, second, and third wavelengths 916a, 916b, 916c, 918a, 918b, 918c, 920a, 920b, and 920c at the target areas 908, 910, and 912, can be beneficial in terms of system cost, by reducing the surface area of the electromagnetic radiation energy conversion devices located at the target areas 908, 910, and 912, and in terms of performance, since the electromagnetic radiation energy conversion devices located at the target areas 908, 910, and 912 may achieve higher conversion efficiencies with increased concentration of refracted electromagnetic radiation of the first, second, and third wavelengths 916a, 916b, 916c, 918a, 918b, 918c, 920a, 920b, and 920c.

FIG. 10 shows a close up view of the focal points 922, 924, and 926 for refracted electromagnetic radiation of the first, second, and third wavelengths 916a, 916b, 916c, 918a, 918b, 918c, 920a, 920b, and 920c, which occur in the embodiment. It is beneficial for the target device, which is not shown in FIG. 10, to be positioned at or near the focal points 922, 924, and 926, since this increases the concentration of the electromagnetic radiation on the surface of the target device. A higher concentration of electromagnetic radiation on the surface of the target devices reduces the amount of surface area of the target areas, and thus reduces the size of the corresponding electromagnetic radiation energy conversion devices, required to capture and convert the electromagnetic radiation to achieve a desired power output. The reduction in the size and amount of material needed for the electromagnetic radiation energy conversion devices reduces the cost of the electromagnetic radiation energy conversion devices and therefore reduces the total system cost.

An additional benefit of positioning the target device 906 at or near the focal points 922, 924, and 926 is that the chromatic separation of the wavelengths is more precise close to their focal points. Improved spectral separation, or chromatic separation, allows for a higher overall efficiency since more of the electromagnetic radiation of a given wavelength will be incident on a target area with an electromagnetic radiation energy conversion device that can efficiently convert the electromagnetic radiation to another form of energy. Poor chromatic separation causes the electromagnetic radiation of a given wavelength to overlap electromagnetic radiation of other wavelengths such that target areas may absorb some electromagnetic radiation of wavelengths which they are not efficient in converting, thus decreasing the total system energy conversion efficiency.

Thus, the embodiment in FIG. 9A and FIG. 9B may yield higher conversion efficiencies than conventional designs by allowing the target device 906 to be positioned at an angle that reduces the off-normal incident angle of electromagnetic radiation on the target device 906, which reduces reflective losses while the target device 906 is positioned at or near the focal points 922, 924, and 926 of the electromagnetic radiation. Positioning the target device 906 at or near the focal points 922, 924, and 926 of electromagnetic radiation increases the concentration of the electromagnetic radiation incident on the electromagnetic radiation energy conversion devices located at the target areas 908, 910, and 912. Increasing the concentration of electromagnetic radiation incident on the electromagnetic radiation energy conversion devices placed at the target areas 908, 910, and 912 aids in reducing the size and cost of electromagnetic radiation energy conversion devices located at the target areas 908, 910, and 912 and may improve chromatic separation and concentration at the surface of the target device 906, which may improve the conversion efficiency. These improvements are possible because the focal points 922, 924, and 926 may differ in location from each other along both the x-axis and z-axis.

Figure 11A:
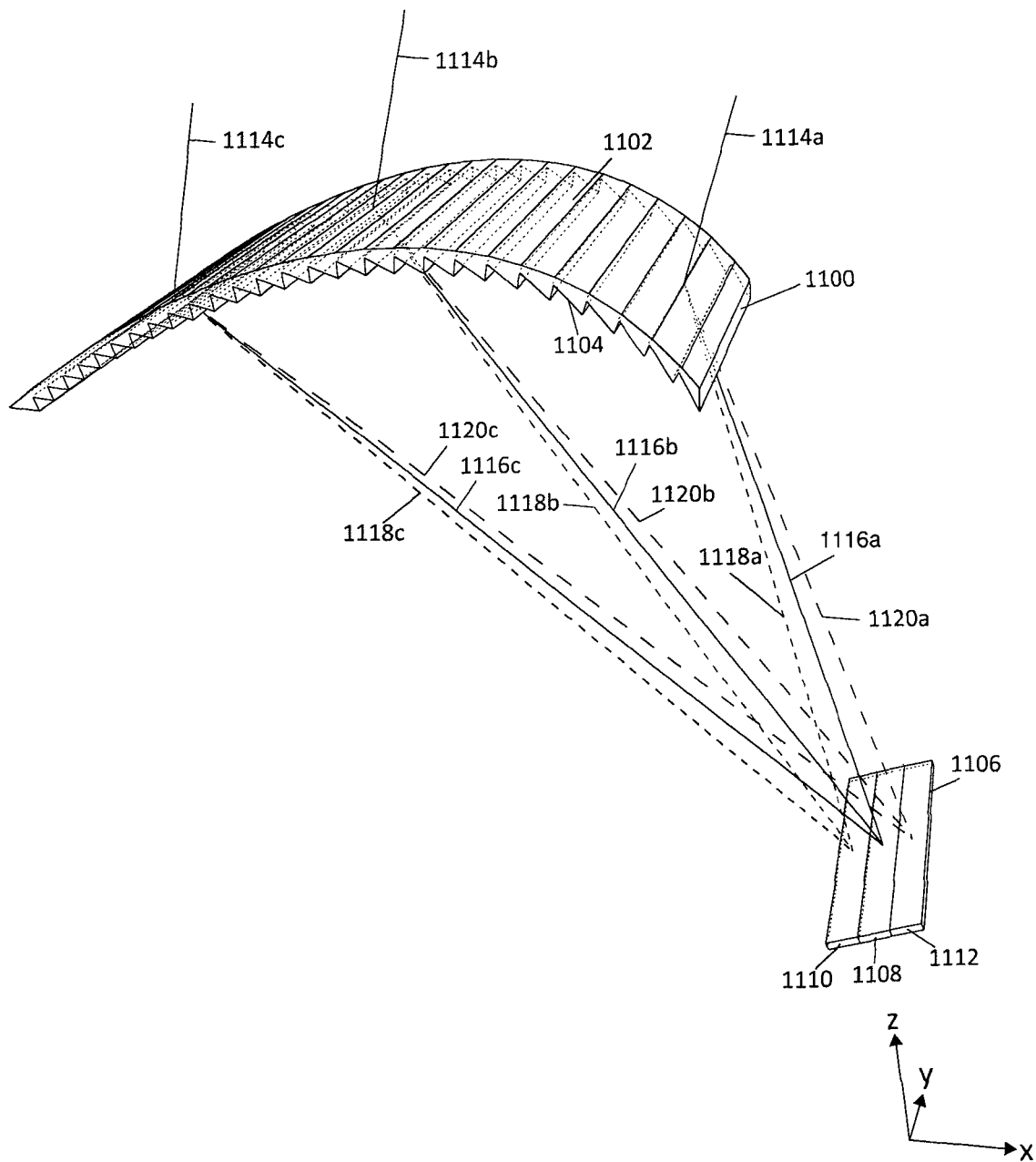
FIG. 11A illustrates a perspective view of an optical device including multiple discontinuous refractive surfaces and two interfaces according to some embodiments.
Figure 11B:
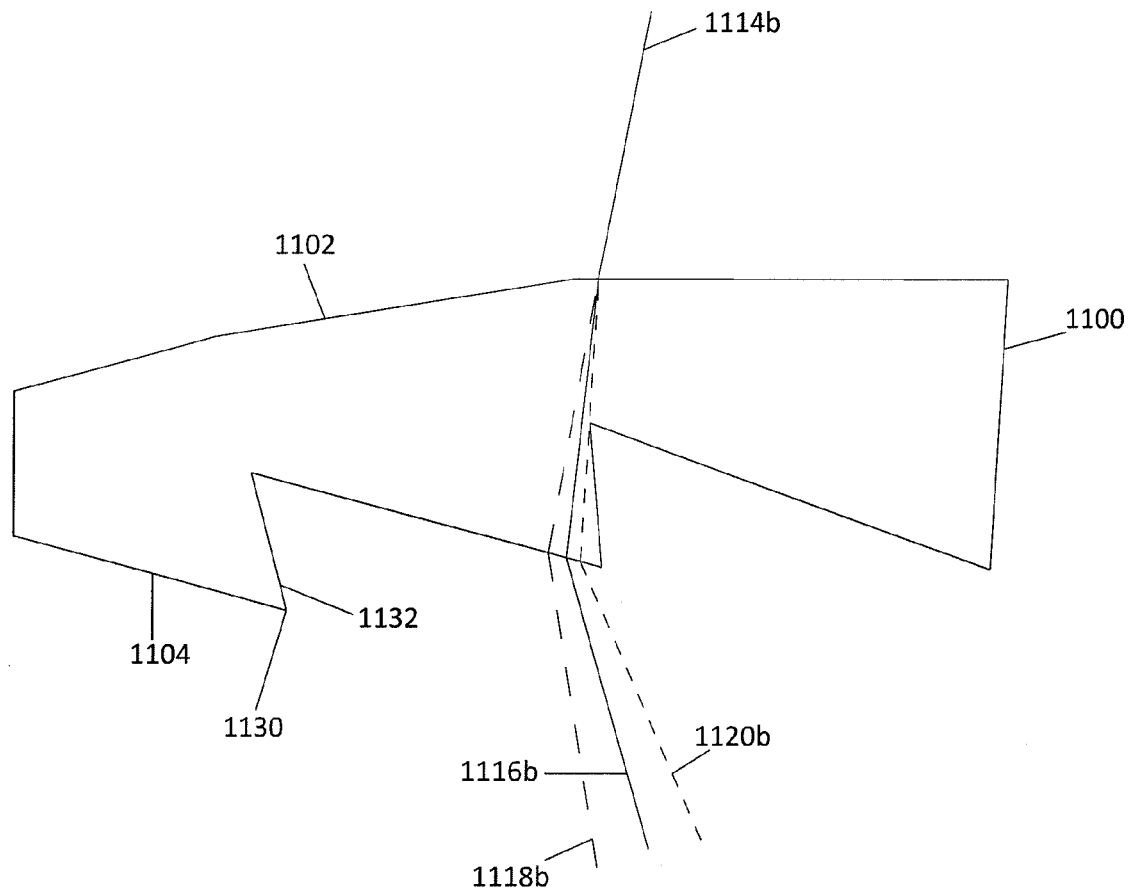
FIG. 11B illustrates a cross section of an optical device including multiple discontinuous refractive surfaces and two interfaces according to some embodiments.
Figure 11C:
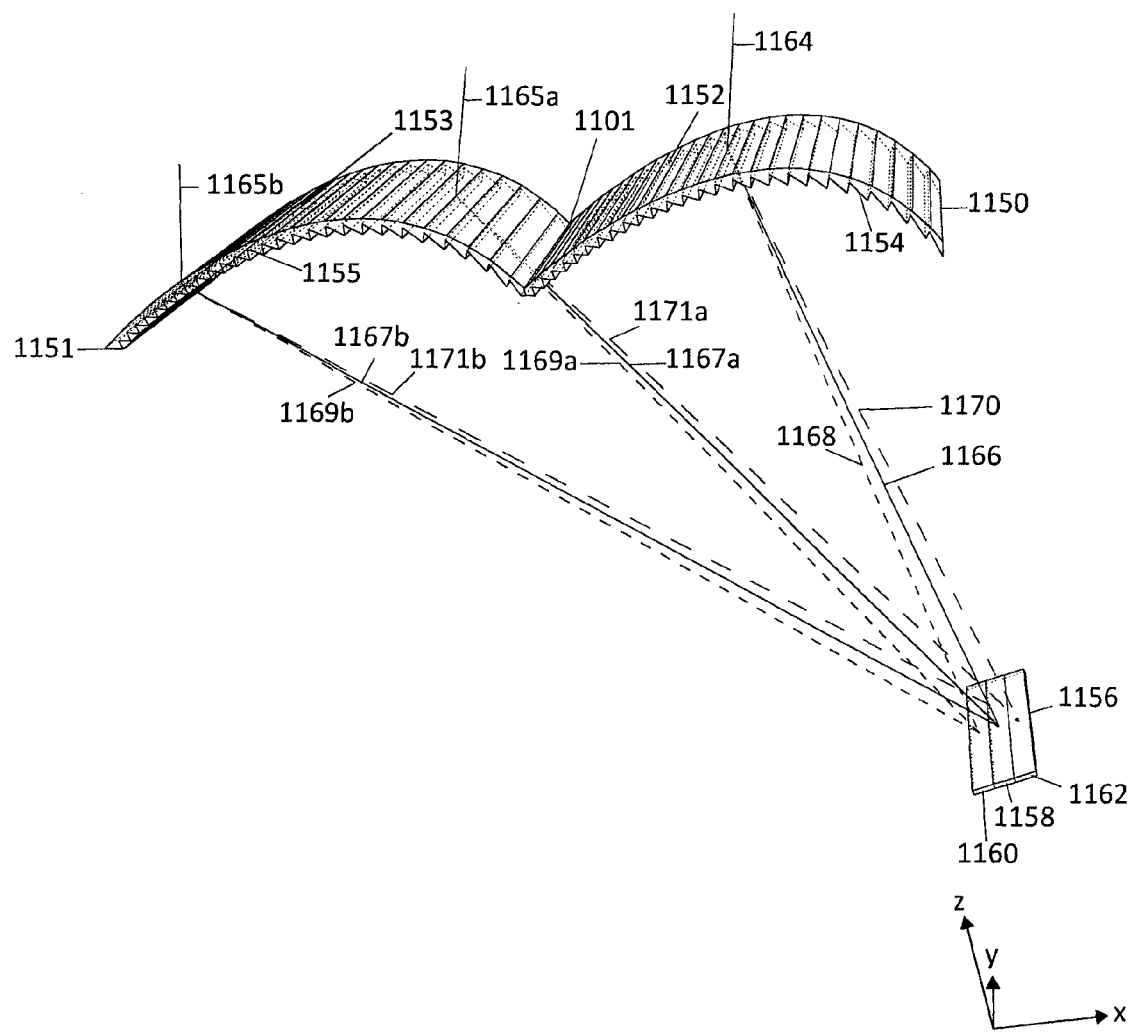
FIG. 11C illustrates a perspective view of an optical device including two areas having multiple discontinuous refractive surfaces and two interfaces according to some embodiments.

An alternative embodiment is shown in FIG. 11A, FIG. 11B, and FIG. 11C.

FIG. 11A illustrates a perspective view of an optical device 1100 including multiple discontinuous refractive surfaces and two interfaces according to some embodiments. FIG. 11B illustrates a cross section of an optical device 1100 including multiple discontinuous refractive surfaces and two interfaces according to some embodiments. FIG. 11C illustrates a perspective view of an optical device 1101 including two areas having multiple discontinuous refractive surfaces and two interfaces according to some embodiments.

FIG. 11A shows a view of an optical device 1100 including a material that is transparent to electromagnetic radiation (such as glass or plastic), that concentrates and disperses electromagnetic radiation in the x-axis. The optical device 1100 includes a first interface 1102, composed of multiple flat surfaces, with each flat surface having a different angle, and a second interface 1104, made up of multiple discontinuous refracting surfaces. Reverse ray tracing may be used to find the exact shape of the first interface 1102 and each of the multiple discontinuous refracting surfaces, which together make up the concentrating second interface 1104, such that rays will converge at the target device 1106. The multiple discontinuous refracting surfaces that together make up the second interface 1104 each have a curvature that may be determined by reverse ray tracing.

The target device 1106 is tilted about the y-axis, and includes multiple target areas 1108, 1110, and 1112. The target device 1106, shown in FIG. 11A, includes three target areas: first target area 1108, second target area 1110, and third target area 1112. The target areas 1108, 1110, and 1112 have a width along the y-axis equal to the width of the optical device 1100 along the y-axis, since there is no concentration along the y-axis. The target device 1106 has a width along the x-axis less than the width of the optical device 1100 along the x-axis, since there is concentration in the x-axis. While three target areas 1108, 1110, and 1112 are shown, any number of target areas may be used in the embodiment.

Incident electromagnetic radiation rays 1114a, 1114b, and 1114c intersect the first interface 1102 at an angle from the z-axis. The rays are dispersed into multiple wavelengths. Only three discrete wavelengths are shown: first wavelength refracted radiation 1116a, 1116b, and 1116c, second wavelength refracted radiation 1118a, 1118b, and 1118c, and third wavelength refracted radiation 1120a, 1120b, and 1120c.

Positioning of the target device 1106 may be set such that the first wavelength refracted radiation rays 1116a, 1116b, and 1116c intersect with the first target area 1108, the second wavelength refracted radiation rays 1118a, 1118b, and 1118c intersect with the second target area 1110, and the third wavelength refracted radiation rays 1120a, 1120b, and 1120c intersect with the third target area 1112.

The optical device 1100 of FIG. 11A is similar to the optical device 900 in FIG. 9A and FIG. 9B. A difference between the embodiment in FIG. 11A and the embodiment in FIG. 9A and FIG. 9B is the second interface 1104, which is made up of multiple discontinuous refracting surfaces along the x-axis. The multiple discontinuous interfaces make it possible to reduce the thickness of the optical device 1100 in the direction of the z-axis, resulting in reduced absorption of the radiation inside of the optical device 1100. Also, less material is needed to produce the optical device 1100 due to the reduced thickness of the optical device 1100 using multiple discontinuous refractive surfaces compared to optics that do not use multiple discontinuous refractive surfaces, enabling a reduction in the cost of the optical device 1100 compared to optics that do not use multiple discontinuous refractive surfaces.

FIG. 11B shows a close up view of a portion of the optical device 1100 looking at the optical device 1100 from the direction of the y-axis. FIG. 11B shows a portion of the first interface 1102 made up of multiple flat surfaces, with each flat surface having a different angle, and three of the discontinuous surfaces that make up the second interface 1104 along the x-axis. Incident electromagnetic radiation 1114b is refracted and dispersed by the first interface 1102 and the second interface 1104. Refracted rays of electromagnetic radiation 1116b, 1118b, and 1120b travel toward the target device 1106, which is not shown in FIG. 11B. The target device 1106 is located below the optical device 1100. The draft surfaces 1132, which connect the multiple discontinuous surfaces that make up the second interface 1104, are flat surfaces and are angled such that no electromagnetic radiation of selected wavelengths is incident upon the draft surfaces 1132. The angle of the draft surfaces 1132 may be constant or the angles of the draft surfaces 1132 may vary depending upon their location along the x-axis. By ensuring that none of the electromagnetic radiation of selected wavelengths is incident upon the draft surfaces 1132, shading losses, which are losses of electromagnetic radiation due to reflection or refraction of electromagnetic radiation at the draft surfaces 1132, are minimized. Additionally, losses due to the outside corners 1130 at the edges of the discontinuous surfaces that make up the second interface 1104 are minimized due to the angles of the draft surfaces 1132.

Advantages of the embodiment in FIG. 11A and FIG. 11B include the use of a single optical device 1100 and the spectral separation of the different wavelengths on the target device 1106. Absorption and reflection losses are reduced due to the use of a single optical device 1100. The spectral separation and use of multiple electromagnetic radiation energy conversion devices positioned at the target areas 1108, 1110, and 1112, each receiving wavelengths of electromagnetic radiation at which the target area is efficient, may result in increased conversion efficiencies. Additionally, shading losses are reduced due to the angles of the draft surfaces 1132 being chosen such that no electromagnetic radiation of selected wavelengths is incident upon the draft surfaces 1132 or the outside corners 1130 at the edges of the discontinuous surfaces that make up the second interface 1104.

An alternative embodiment is shown in FIG. 11C.

FIG. 11C shows a view of an optical device 1101, made up of a first area 1150 and a second area 1151, including a material that is transparent to electromagnetic radiation (such as glass or plastic), that concentrates and disperses electromagnetic radiation in the x-axis. While two areas 1150 and 1151 are shown, any number of areas may be used in the embodiment. The first area 1150 and the second area 1151 are made of different materials with different optical characteristics. The first area 1150 includes a first interface 1152, made up of multiple flat surfaces, with each surface having a different angle, and a second interface 1154, made up of multiple discontinuous refracting surfaces. The second area 1151 includes a first interface 1153, made up of multiple flat surfaces, with each surface having a different angle, and a second interface 1155, made up of multiple discontinuous refracting surfaces. Reverse ray tracing may be used to find the exact shape of the first interface 1152 of the first area 1150, the first interface 1153 of the second area 1151, and each of the multiple discontinuous refracting surfaces, which together make up the concentrating second interface 1154 of the first area 1150 and the concentrating second interface 1155 of the second area 1151, such that rays of refracted electromagnetic radiation 1166, 1168, 1170, 1167a, 1169a, 1171a, 1167b, 1169b, and 1171b will converge at the target device 1156.

The target device 1156 is tilted about the y-axis, and includes multiple target areas 1158, 1160, and 1162. The target device 1156, shown in FIG. 11C, includes three target areas: first target area 1158, second target area 1160, and third target area 1162. The target areas have a width along the y-axis equal to the width of the first area 1150 and second area 1151 along the y-axis, since there is no concentration along the y-axis. The target device has a width along the x-axis less than the width of the optical device 1101, made of a first area 1150 and a second area 1151, along the x-axis, since there is concentration in the x-axis. While three target areas 1158, 1160, and 1162 are shown, any number of target areas may be used in the embodiment.

Incident electromagnetic radiation 1164 intersects the first interface 1152 of the first area 1150 and incident electromagnetic radiation 1165a and 1165c intersect the first interface 1153 of the second area 1151 at an angle from the z-axis. The rays are dispersed into multiple wavelengths. Only three discrete wavelengths are shown: first wavelength refracted radiation 1166 of the first area 1150 and first wavelength refracted radiation 1167a and 1167b of the second area 1151, second wavelength refracted radiation 1168 of the first area 1150 and second wavelength refracted radiation 1169a and 1169b of the second area 1151, and third wavelength refracted radiation 1170 of the first area 1150 and third wavelength refracted radiation 1171a and 1171b of the second area 1151.

Positioning of the target device 1156 may be set such that the first wavelength refracted radiation rays 1166, 1167a, and 1167b intersect with the first target area 1158, the second wavelength refracted radiation rays 1168, 1169a, and 1169b intersect with the second target area 1160, and the third wavelength refracted radiation rays 1170, 1171a, and 1171b intersect with the third target area 1162.

The embodiment in FIG. 11C is similar to the embodiment in FIG. 11A. A difference between the embodiment in FIG. 11C and the embodiment in FIG. 11A is the two areas 1150 and 1151 made of different materials with different Abbe numbers.

The Abbe number is frequently used to characterize the dispersive properties of optical materials; the amount of dispersion is inversely proportional to the Abbe number. The material of the second area 1151 of the embodiment in FIG. 11C may be selected to have a higher Abbe number than the material of the first area 1150, resulting in lower dispersion.

Figure 12:
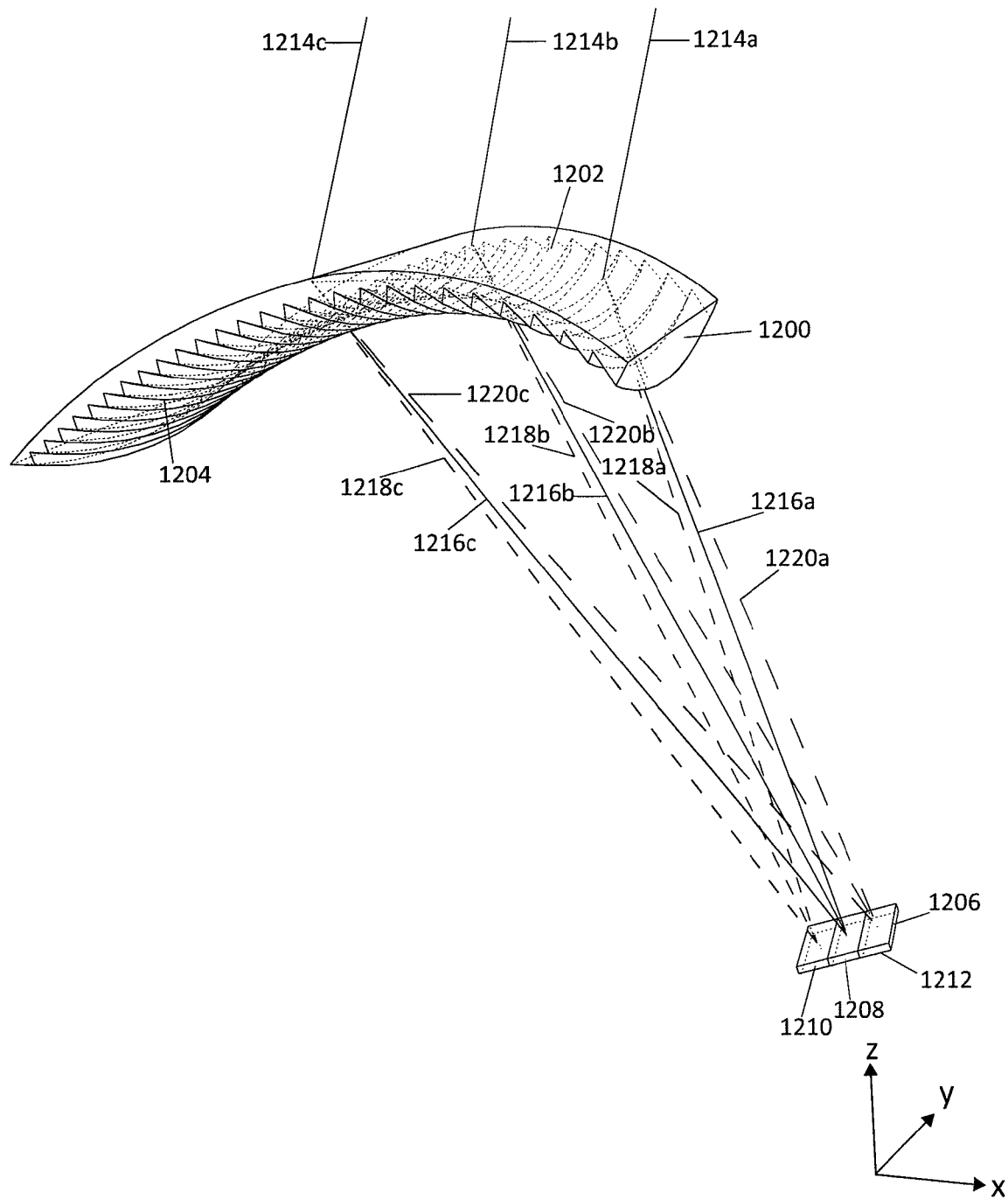
FIG. 12 illustrates a perspective view of an optical device including multiple discontinuous refractive surfaces according to some embodiments.

An alternative embodiment is shown in FIG. 12.

FIG. 12 illustrates a perspective view of an optical device 1200 including multiple discontinuous refractive surfaces according to some embodiments. FIG. 12 shows a view of an optical device 1200 including a material that is transparent to electromagnetic radiation (such as glass or plastic), which concentrates and chromatically disperses electromagnetic radiation in the x-axis and concentrates electromagnetic radiation in the y-axis. The optical device 1200 includes a concentrating and chromatically dispersive first interface 1202, that has a convex curvature along the x-axis and is flat along the y-axis, and a second interface 1204, which has a curvature made up of multiple discontinuous surfaces along the x-axis and a convex curvature along the y-axis. Reverse ray tracing may be used to find the exact shape of the first interface 1202 and the second interface 1204. The first interface 1202 disperses the electromagnetic radiation in the x-axis and concentrates electromagnetic radiation in the x-axis, and the second interface 1204 disperses electromagnetic radiation in the x-axis and concentrates the electromagnetic radiation in the x-axis and the y-axis such that rays of refracted electromagnetic radiation 1216a, 1218a, 1220a, 1216b, 1218b, 1220b, 1216c, 1218c, and 1220c converge at a target device 1206.

The target device 1206 is tilted about the y-axis and includes multiple target areas 1208, 1210, and 1212. The target device 1206, shown in FIG. 12, includes three target areas: first target area 1208, second target area 1210, and third target area 1212. The target areas 1208, 1210, and 1212 have a width along the y-axis less than the width of the optical device 1200 along the y-axis, since there is concentration along the y-axis. The target device 1206 has a width along the x-axis less than the width of the optical device 1200 along the x-axis, since there is concentration in the x-axis. While three target areas 1208, 1210, and 1212 are shown, any number of target areas may be used in the embodiment.

Incident electromagnetic radiation 1214a, 1214b, and 1214c intersect the convex first interface 1202 at an angle from the z-axis. The rays are dispersed into multiple wavelengths. Only three discrete wavelengths are shown: first wavelength refracted radiation 1216a, 1216b, and 1216c, second wavelength refracted radiation 1218a, 1218b, and 1218c, and third wavelength refracted radiation 1220a, 1220b, and 1220c.

Positioning of the target device 1206 may be set so that the first wavelength refracted radiation rays 1216a, 1216b, and 1216c intersect with the first target area 1208, the second wavelength refracted radiation rays 1218a, 1218b, and 1218c intersect with the second target area 1210, and the third wavelength refracted radiation rays 1220a, 1220b, and 1220c intersect with the third target area 1212.

The location of the focal points for the first, second, and third wavelengths 1216a, 1216b, 1216c, 1218a, 1218b, 1218c, 1220a, 1220b, and 1220c are different from one another in both the x-axis and the z-axis. The advantage of having the focal points for different wavelengths vary in both the x-axis and the z-axis has been previously discussed.

The embodiment in FIG. 12 is similar to the embodiment in FIG. 11A. A difference between the embodiment in FIG. 12 and the embodiment in FIG. 11A is the concentration in the y-axis. The total concentration is the product of the concentration in the x-axis and the concentration in the y-axis. Additional concentration allows for a smaller area target device 1206 and increased intensity of the electromagnetic radiation incident on the target device. An advantage of the decrease in area of the target device 1206 is cost reduction. Increased intensity of the electromagnetic radiation, incident on the target device 1206, may result in increased conversion efficiencies for the electromagnetic radiation energy conversion devices located at the target areas 1208, 1210, and 1212.

Figure 13A:
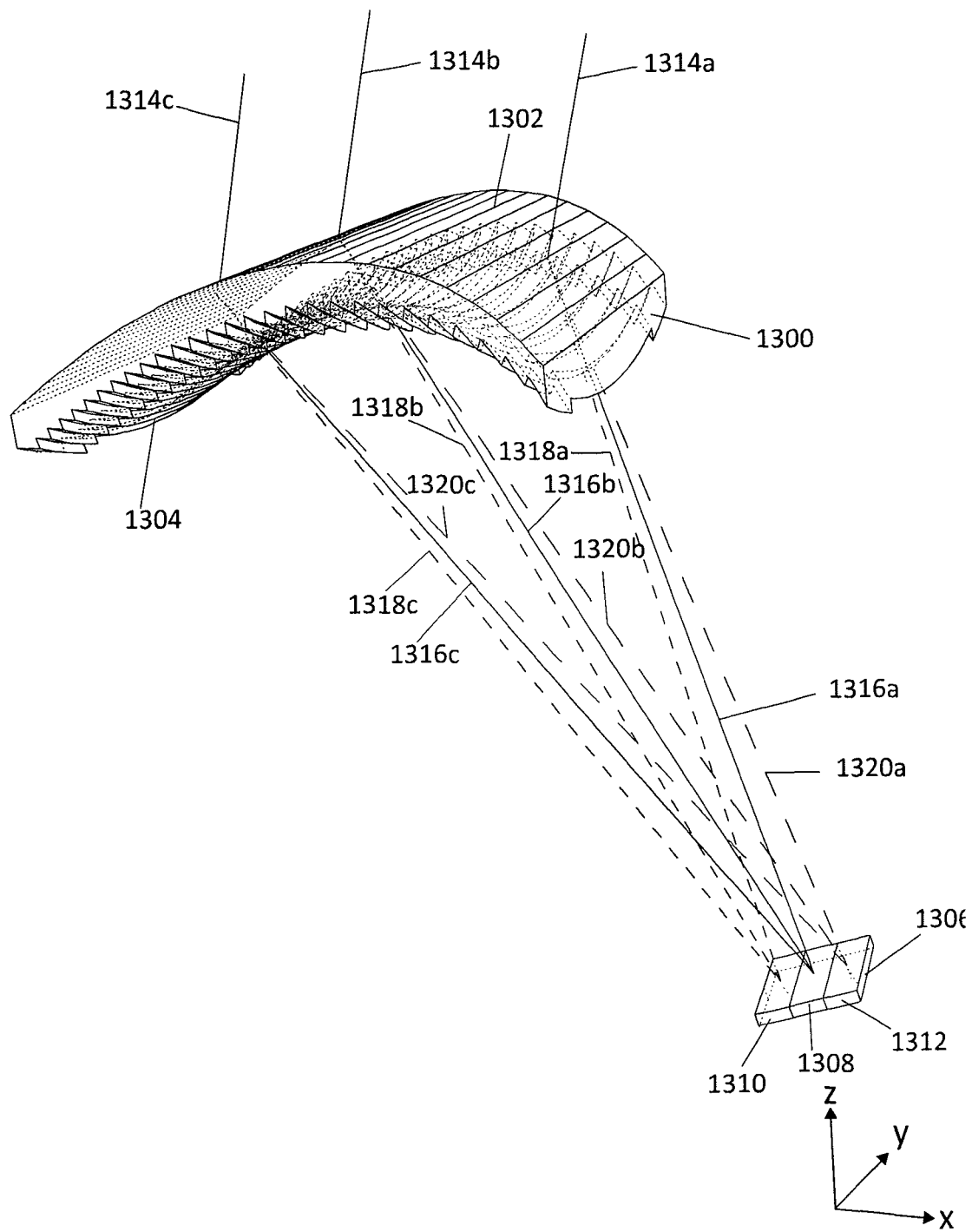
FIG. 13A illustrates a perspective view of an optical device including multiple discontinuous refractive surfaces along two axes and two interfaces according to some embodiments.
Figure 13B:
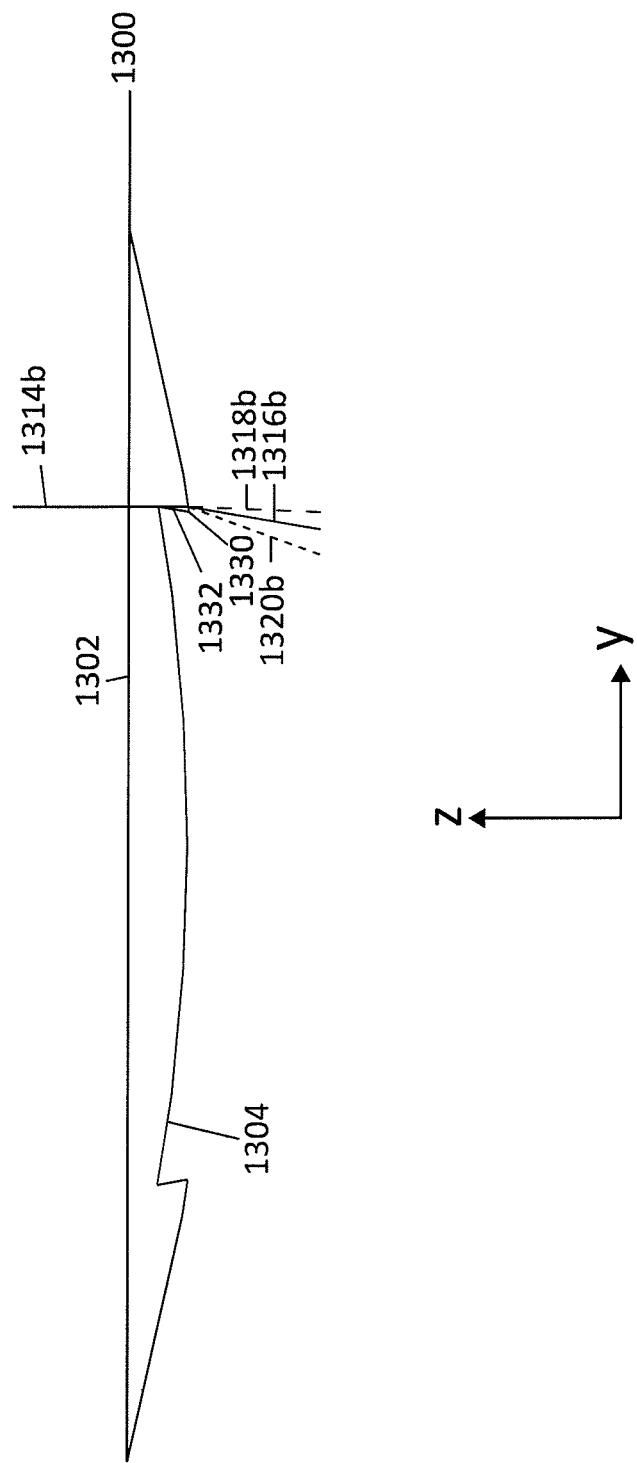
FIG. 13B illustrates a cross section of an optical device of FIG. 13A

An alternative embodiment is shown in FIG. 13A and FIG. 13B.

FIG. 13A illustrates a perspective view of an optical device 1300 including multiple discontinuous refractive surfaces along two axes and two interfaces, according to some embodiments. FIG. 13B illustrates a cross section of the optical device 1300 of FIG. 13A. FIG. 13A shows a view of an optical device 1300 including a material that is transparent to electromagnetic radiation (such as glass or plastic), which concentrates and disperses electromagnetic radiation in the x-axis and concentrates electromagnetic radiation in the y-axis. The optical device 1300 includes a concentrating and chromatically dispersive first interface 1302, made up of multiple flat surfaces, with each surface having a different angle along the x-axis, and is flat along the y-axis, and a second interface 1304, which has a curvature made up of multiple discontinuous surfaces along the x-axis and a convex curvature made up of multiple discontinuous surfaces along the y-axis. Reverse ray tracing may be used to find the exact shape of the first interface 1302 and the second interface 1304. The first interface 1302 disperses the electromagnetic radiation in the x-axis and concentrates electromagnetic radiation in the x-axis, and the second interface 1304 disperses electromagnetic radiation in the x-axis and concentrates the electromagnetic radiation in the x-axis and the y-axis such that rays of refracted electromagnetic radiation 1316a, 1318a, 1320a, 1316b, 1318b, 1320b, 1316c, 1318c, and 1320c converge at a target device 1306.

The target device 1306 is tilted about the y-axis and includes multiple target areas 1308, 1310, and 1312. The target device 1306, shown in FIG. 13A, includes three target areas: first target area 1308, second target area 1310, and third target area 1312. The target areas 1308, 1310, and 1312 have a width along the y-axis less than the width of the optical device 1300 along the y-axis, since there is concentration along the y-axis. The target device 1306 has a width along the x-axis less than the width of the optical device 1300 along the x-axis, since there is concentration in the x-axis. While three target areas 1308, 1310, and 1312 are shown, any number of target areas may be used in the embodiment.

Incident electromagnetic radiation 1314a, 1314b, and 1314c intersects the first interface 1302 at an angle from the z-axis. The rays are dispersed into multiple wavelengths. Only three discrete wavelengths are shown: first wavelength refracted radiation 1316a, 1316b, and 1316c, second wavelength refracted radiation 1318a, 1318b, and 1318c, and third wavelength refracted radiation 1320a, 1320b, and 1320c.

Positioning of the target device 1306 may be set so that the first wavelength refracted radiation rays 1316a, 1316b, and 1316c intersect with the first target area 1308, the second wavelength refracted radiation rays 1318a, 1318b, and 1318c intersect with the second target area 1310, and the third wavelength refracted radiation rays 1320a, 1320b, and 1320c intersect with the third target area 1312.

The location of the focal points for the first, second, and third wavelengths 1316a, 1316b, 1316c, 1318a, 1318b, 1318c, 1320a, 1320b, and 1320c are different from one another in both the x-axis and the z-axis. The advantage of having the focal points for different wavelengths vary in both the x-axis and the z-axis has been previously discussed.

FIG. 13B shows a close up, cross-sectional view of a portion of the optical device 1300 looking at the optical device 1300 from the direction of the x-axis. FIG. 13B shows a portion of the flat first interface 1302 in the y-axis and three of the curved discontinuous surfaces that make up the second interface 1304 in the y-axis. Incident electromagnetic radiation 1314b is perpendicular to the flat first interface 1302 when viewed from along the x-axis and therefore incident electromagnetic radiation 1314b is not refracted or dispersed in the direction of the y-axis at the first interface 1302. The second interface 1304 of the optical device 1300 refracts and concentrates the refracted rays of electromagnetic radiation 1316b, 1318b, and 1320b. Refracted rays of electromagnetic radiation 1316b, 1318b, and 1320b travel toward the target device 1106, which is not shown in FIG. 13B. The target device 1306 is located below the optical device 1300. The draft surfaces 1332, which connect the multiple discontinuous surfaces that make up the second interface 1304 along the y-axis, are flat surfaces and are angled such that no electromagnetic radiation of selected wavelengths is incident upon the draft surfaces 1332. The angle of the draft surfaces 1332 may be constant or the angles of the draft surfaces 1332 may vary depending upon their location along the y-axis. By ensuring that no electromagnetic radiation of selected wavelengths is incident upon the draft surfaces 1332, shading losses, which are losses of electromagnetic radiation due to reflection or refraction of electromagnetic radiation at the draft surfaces 1332, are minimized. Additionally, losses due to the outside corners 1330 at the edges of the discontinuous surfaces that make up the second interface 1304 along the y-axis are minimized due to the angles of the draft surfaces 1332.

The embodiment in FIG. 13A and 13B is similar to the embodiment in FIG. 12. A difference between the embodiment in FIG. 13A and FIG. 13B and the embodiment in FIG.

12 is the second interface 1304 of the optical device 1300. The second interface 1304 has a curvature along the x-direction made up of multiple discontinuous surfaces and a convex surface along the y-axis made up of multiple discontinuous surfaces. The use of multiple discontinuous surfaces along both the x-axis and the y-axis of the second interface 1304 allows for a smaller thickness in the z-axis of the optical device 1300.

The advantage of having a smaller thickness in the z-axis of the optical device 1300 has been previously discussed. Also, the advantage of having concentration in 2 axes has been previously discussed. Additionally, shading losses along the y-axis are reduced due to the angles of the draft surfaces 1332, which connect the multiple discontinuous surfaces that make up the convex surface of the second interface 1304 along the y-axis, being chosen such that no electromagnetic radiation of selected wavelengths is incident upon the draft surfaces 1332 or the outside corners 1330 at the edges of the discontinuous surfaces that make up the second interface 1304 along the y-axis.

Figure 14A:
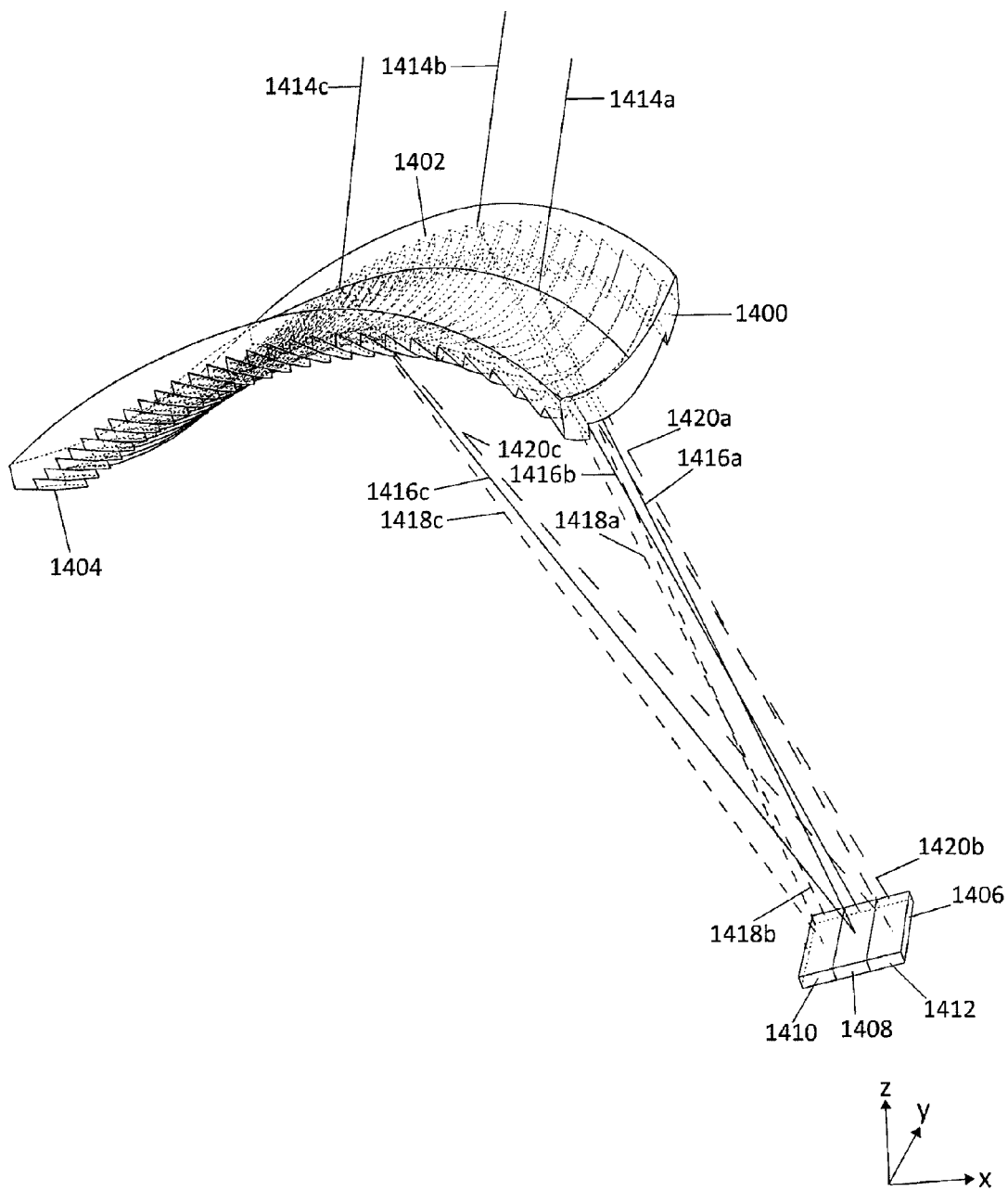
FIG. 14A illustrates a perspective view of an optical device including a concave first interface in one axis and multiple discontinuous refractive surfaces along two axes according to some embodiments.
Figure 14B:
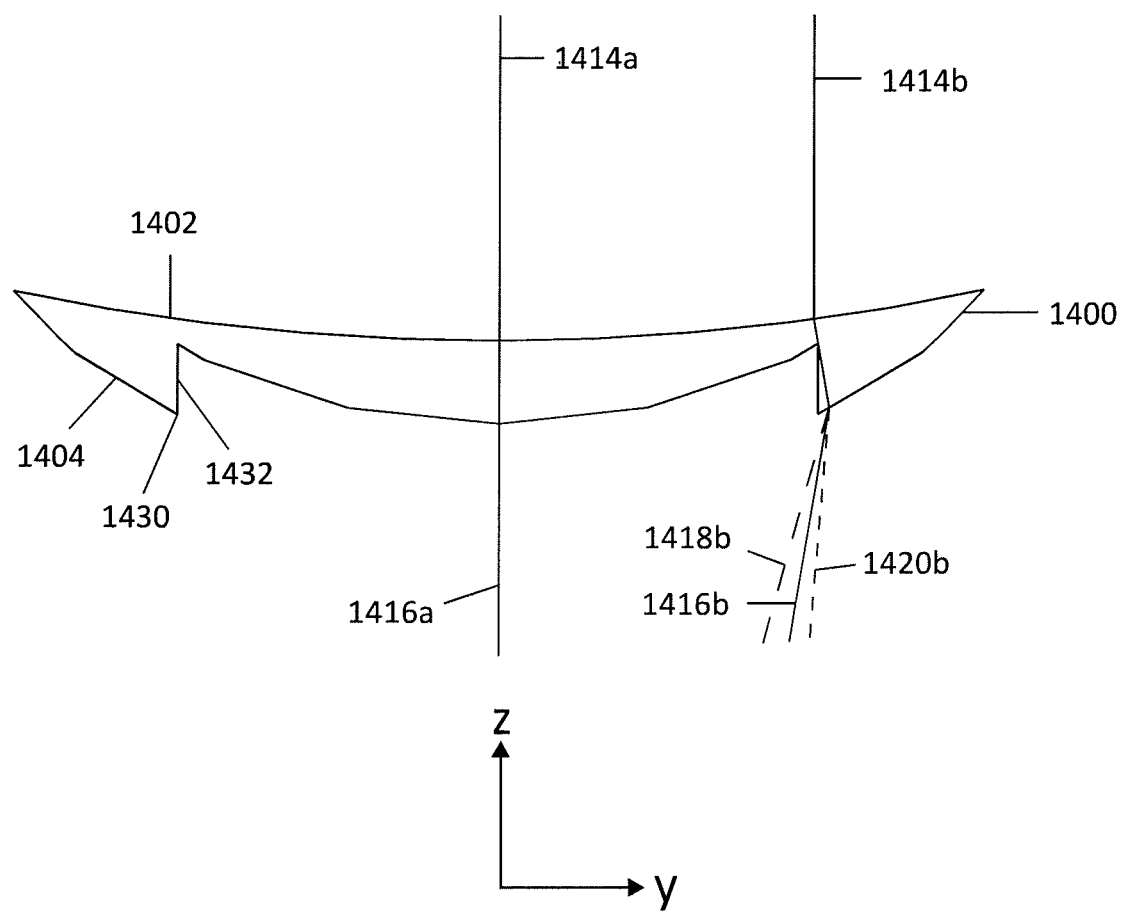
FIG. 14B illustrates a cross section of an optical device of FIG. 14A

An alternative embodiment is shown in FIG. 14A and FIG. 14B.

FIG. 14A illustrates a perspective view of an optical device 1400 including a concave first interface in one axis and multiple discontinuous refractive surfaces along two axes according to some embodiments. FIG. 14B illustrates a cross section of an optical device of FIG. 14A. FIG. 14A shows a view of an optical device 1400 including a material that is transparent to electromagnetic radiation (such as glass or plastic), which concentrates and disperses electromagnetic radiation in the x-axis and concentrates electromagnetic radiation in the y-axis. The optical device 1400 includes a concentrating and dispersive first interface 1402 that has a convex curvature along the x-axis and a concave curvature along the y-axis, and a second interface 1404, which has a curvature made up of multiple discontinuous surfaces along the x-axis and a convex curvature made up of multiple discontinuous surfaces along the y-axis. Reverse ray tracing may be used to find the exact shape of the first interface 1402 and the second interface 1404. The first interface 1402 disperses the electromagnetic radiation in the x-axis, concentrates electromagnetic radiation in the x-axis, and also refracts the electromagnetic radiation in the y-axis and the second interface 1404 disperses electromagnetic radiation in the x-axis and concentrates the electromagnetic radiation in the x-axis and the y-axis such that rays of refracted electromagnetic radiation 1416a, 1418a, 1420a, 1416b, 1418b, 1420b, 1416c, 1418c, and 1420c converge at a target device 1406.

The target device 1406 is tilted about the y-axis and includes multiple target areas 1408, 1410, and 1412. The target device 1406, shown in FIG. 14A, includes three target areas: first target area 1408, second target area 1410, and third target area 1412. The target areas 1408, 1410, and 1412 have a width along the y-axis less than the width of the optical device 1400 along the y-axis, since there is concentration along the y-axis. The target device 1406 has a width along the x-axis less than the width of the optical device 1400 along the x-axis, since there is concentration in the x-axis. While three target areas 1408, 1410, and 1412 are shown, any number of target areas may be used in the embodiment.

Incident electromagnetic radiation 1414a, 1414b, and 1414c intersect the first interface 1402 at an angle from the z-axis. The rays are dispersed into multiple wavelengths. Only three discrete wavelengths are shown: first wavelength refracted radiation 1416a, 1416b, and 1416c, second wavelength refracted radiation 1418a, 1418b, and 1418c, and third wavelength refracted radiation 1420a, 1420b, and 1420c.

Positioning of the target device 1406 may be set so that the first wavelength refracted radiation rays 1416a, 1416b, and 1416c intersect with the first target area 1408, the second wavelength refracted radiation rays 1418a, 1418b, and 1418c intersect with the second target area 1410, and the third wavelength refracted radiation rays 1420a, 1420b, and 1420c intersect with the third target area 1412.

The location of the focal points for the first, second, and third wavelengths 1416a, 1416b, 1416c, 1418a, 1418b, 1418c, 1420a, 1420b, and 1420c are different from one another in both the x-axis and the z-axis. The advantage of having the focal points for different wavelengths vary in both the x-axis and the z-axis has been previously discussed.

FIG. 14B shows a cross-sectional view of the optical device 1400 looking at the optical device 1400 from the direction of the x-axis. FIG. 14B shows a portion of the concave first interface 1402 along the y-axis and the convex discontinuous surfaces that make up the second interface 1404 along the y-axis. Incident electromagnetic radiation 1414a is perpendicular to the center of first interface 1402 and the center of the second interface 1404 along the y-axis when viewed from along the x-axis and therefore incident electromagnetic radiation 1414a is not refracted or dispersed in the direction of the y-axis at the center of first interface 1402 and the center of the second interface 1404 along the y-axis. The optical axis, viewed from the direction of the x-axis, of the optical device 1400 intersects the center of the first interface 1402 and the center of the second interface 1404 along the y-axis. Rays of incident electromagnetic radiation 1414a and rays of electromagnetic radiation 1416a that passed through the center of the optical device 1400 along the y-axis are parallel to each other and parallel to the optical axis along the y-axis. Incident electromagnetic radiation 1414b is not perpendicular to the concave first interface 1402 at locations other than the center of the first interface 1402 along the y-axis when viewed from along the x-axis and therefore incident electromagnetic radiation 1414b is refracted away from the optical axis at the first interface 1402 in the direction of the y-axis at locations other than the center of first interface 1402 along the y-axis. The second interface 1404 of the optical device 1400 refracts and concentrates the refracted rays of electromagnetic radiation 1416b, 1418b, and 1420b. Refracted rays of electromagnetic radiation 1416b, 1418b, and 1420b and rays of electromagnetic radiation 1416a that pass through the center of the optical device 1400 along the y-axis travel toward the target device 1406, which is not shown in FIG. 14B. The target device 1406 is located below the optical device 1400. The draft surfaces 1432, which connect the multiple discontinuous surfaces that make up the second interface 1404 along the y-axis, are flat surfaces and are angled such that no electromagnetic radiation of selected wavelengths is incident upon the draft surfaces 1432. The angle of the draft surfaces 1432 may be constant or the angles of the draft surfaces 1432 may vary depending upon their location along the y-axis. By ensuring that no electromagnetic radiation of selected wavelengths is incident upon the draft surfaces 1432, shading losses, which are losses of electromagnetic radiation due to reflection or refraction of electromagnetic radiation at the draft surfaces 1432, are minimized. Additionally, losses due to the outside corners 1430 at the edges of the discontinuous surfaces that make up the convex second interface 1404 along the y-axis are minimized due to the angles of the draft surfaces 1432.

The embodiment in FIG. 14A and 14B is similar to the embodiment in FIG. 13A and FIG. 13B. A difference between the embodiment in FIG. 14A and FIG. 14B and the embodiment in FIG. 13A and FIG. 13B is the first interface 1402 of the optical device 1400 along the y-axis. The first interface 1402 has a convex surface along the x-axis and concave surface along the y-axis. The use of a concave curved surface along the y-axis of the first interface 1402 refracts the rays of electromagnetic radiation away from the optical axis along the y-axis at the first interface 1402.

The advantage of having a smaller width in the z-axis due to the use of multiple discontinuous surfaces to make up the second interface 1402, along the x-axis and along the y-axis, of the optical device 1400 has been previously discussed. Also, the advantage of having concentration in 2 axes has been previously discussed. Shading losses along the y-axis are reduced due to the angles of the draft surfaces 1432, which connect the multiple discontinuous surfaces that make up the convex surface of the second interface 1404 along the y-axis, being chosen such that selected wavelengths of refracted electromagnetic radiation 1416*b,* 1418*b,* and 1420*b* are not reflected by the draft surfaces 1432 and do not pass through the draft surfaces 1432 or the outside corners 1430 at the edges of the discontinuous surfaces that make up the convex second interface 1404 along the y-axis. Additionally, because the first interface 1402 has a concave curved surface along the y-axis, refracting rays of electromagnetic radiation away from the optical axis along the y-axis at the first interface 1402, shading losses can be reduced using the methods previously described while using draft surfaces 1432 along the y-axis of the second interface 1404 that are parallel with the optical axis or have a positive draft angle. Draft surfaces that are parallel with the optical axis or have a positive draft angle are easier to manufacture in the optical device 1400 using molding or machining processes than draft surfaces that have a negative draft. In engineering, draft is the amount of taper for molded or cast parts perpendicular to the parting line. The parting line is usually parallel to the optical axis.

Figure 15:
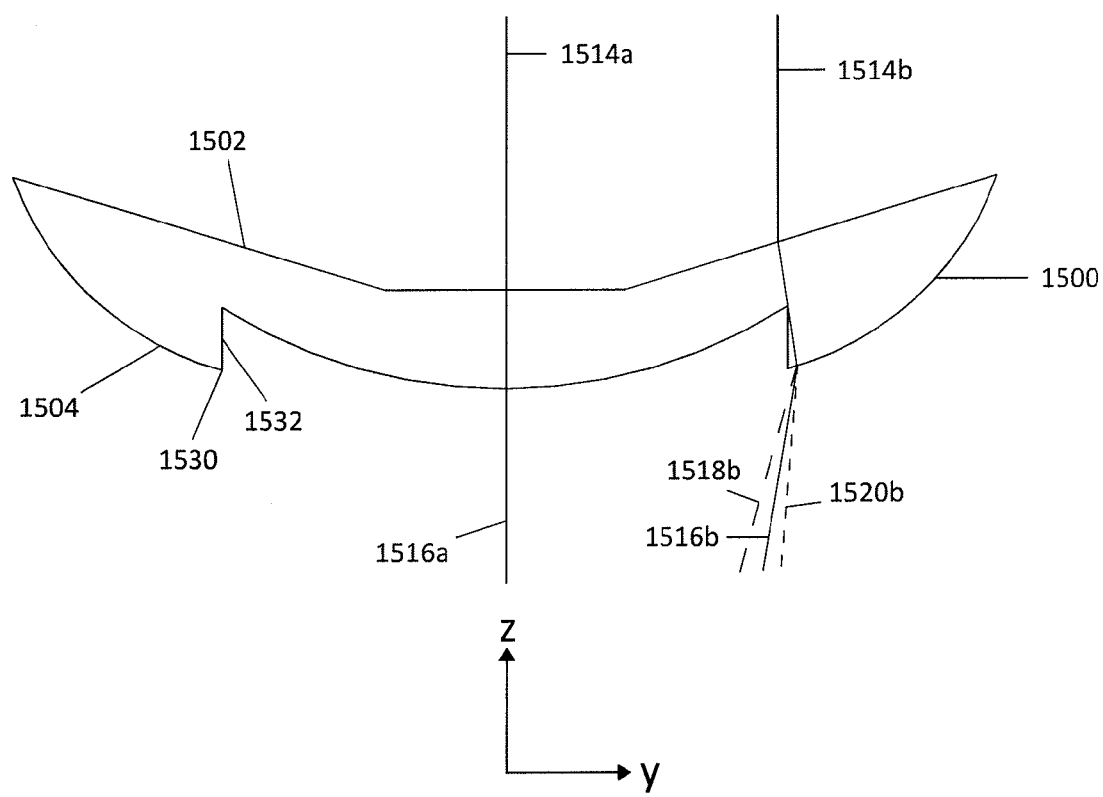
FIG. 15 illustrates a cross section of an optical device including multiple flat surfaces and multiple discontinuous refractive surfaces according to some embodiments.

An alternative embodiment is shown in FIG. 15.

FIG. 15 shows a cross-sectional view of an optical device 1500 looking at the optical device 1500 from the direction of the x-axis. FIG. 15 shows a portion of the first interface 1502, including multiple flat surfaces, with each surface having a different angle along the y-axis and the convex discontinuous surfaces that make up the second interface 1504 along the y-axis. Incident electromagnetic radiation 1514*a* is perpendicular to the center of first interface 1502 and the center of the second interface 1504 along the y-axis when viewed from along the x-axis and therefore incident electromagnetic radiation 1514*a* is not refracted or dispersed in the direction of the y-axis at the center of first interface 1502 and the center of the second interface 1504 along the y-axis. The optical axis, when viewed from the direction of the x-axis, of the optical device 1500 intersects the center of the first interface 1502 and the center of the second interface 1504 along the y-axis. Rays of incident electromagnetic radiation 1514*a* and rays of electromagnetic radiation 1516*a* that passed through the center of the optical device 1500 along the y-axis are parallel to each other and parallel to the optical axis along the y-axis. Incident electromagnetic radiation 1514*b* is not perpendicular to the first interface 1502 at some locations that are not at the center of the first interface 1502 along the y-axis when viewed from along the x-axis and therefore incident electromagnetic radiation 1514*b* is refracted away from the optical axis at the first interface 1502 in the direction of the y-axis at some locations that are not at the center of first interface 1502 along the y-axis. The second interface 1504 of the optical device 1500 refracts and concentrates the refracted rays of electromagnetic radiation 1516*b,* 1518*b,* and 1520*b.* Refracted rays of electromagnetic radiation 1516*b,* 1518*b,* and 1520*b* and electromagnetic radiation 1516*a,* that passes through the center of the optical device 1500 along the y-axis, travel toward a target device, which is not shown in FIG. 15. The target device is located below the optical device 1500. The draft surfaces 1532, which connect the multiple discontinuous surfaces that make up the second interface 1504 along the y-axis, are flat surfaces and are angled such that no electromagnetic radiation of selected wavelengths is incident upon the target device pass through or are reflected by the draft surfaces 1532. The angle of the draft surfaces 1532 may be constant or the angles of the draft surfaces 1532 may vary depending upon their location along the y-axis. By ensuring that no electromagnetic radiation of selected wavelengths is incident upon the target device pass through or are reflected by the draft surfaces 1532, shading losses, which are losses of electromagnetic radiation due to reflection or refraction of electromagnetic radiation at the draft surfaces 1532, are minimized. Additionally, losses due to the outside corners 1530 at the edges of the discontinuous surfaces that make up the convex second interface 1504 along the y-axis are minimized due to the angles of the draft surfaces 1532.

The embodiment in FIG. 15 is similar to the embodiment in FIG. 14A and FIG. 14B. A difference between the embodiment in FIG. 15 and the embodiment in FIG. 14A and FIG. 14B is the first interface 1502 of the optical device 1500 along the y-axis. The first interface 1502 is made up of multiple flat surfaces, with each flat surface having a different angle, along the y-axis. The use of multiple flat surfaces, with each flat surface having a different angle, along the y-axis of the first interface 1502 refracts the rays of electromagnetic radiation away from the optical axis at some locations along the y-axis at the first interface 1502.

The advantage of having a smaller width in the z-axis due to the use of multiple discontinuous surfaces to make up the second interface 1502, has been previously discussed. Shading losses along the y-axis may be reduced due to the angle at which electromagnetic radiation 1516*b,* 1518*b,* and 1520*b* is refracted away from the optical axis in the direction of the y-axis at some locations at the first interface, such that selected wavelengths of refracted electromagnetic radiation 1516*b,* 1518*b,* and 152*b* are not reflected by the draft surfaces 1532 and do not pass through the draft surfaces 1532 or the outside corners 1530 at the edges of the discontinuous surfaces that make up the convex second interface 1504 along the y-axis. Additionally, since the first interface 1502 has multiple flat surfaces, with each flat surface having a different angle, along the y-axis, rays of electromagnetic radiation are refracted away from the optical axis along the y-axis at the first interface 1502, such that shading losses may be reduced using the methods previously described while using draft surfaces 1532 along the y-axis of the second interface 1504 that are parallel with the optical axis or have a positive draft angle. Draft surfaces that are parallel with the optical axis or have a positive draft angle may be easier to manufacture in the optical device 1500 using molding or machining processes than draft surfaces that have a negative draft. In engineering, draft, or draft angle, may be the amount of taper for molded or cast parts perpendicular to the parting line. The parting line may be parallel to the optical axis.

The embodiments previously discussed may be modified by including an additional optical device or optical devices in the path of the electromagnetic radiation before, after, or before and after the optical devices described in the previously discussed embodiments. The additional optical device or devices may disperse, focus, diffract, spread, filter, or otherwise adjust the direction and chromatic composition of the electromagnetic radiation before, after, or before and after it passes through the optical devices described in the previously discussed embodiments.

The features of some, all, or any of the previously discussed embodiments may be combined to form additional alternative embodiments. Any of the shapes, curvatures, pluralities of discontinuous surfaces, or other features may be combined at any of the interfaces to form additional alternative embodiments. Any curvature may be made up of multiple discontinuous surfaces. Any of the techniques to reduce the shading of electromagnetic radiation described in the embodiments may be used with any other embodiments or combined with the features of other embodiments to form additional alternative embodiments. The size, shape, relative position, and composition of the optical device and target device may be varied. Within the optical device itself, different areas may be made of different materials. There may be any number of areas within the optical device. The optical device may be produced using a mold or molds, injection molding, machining, or other production techniques.

The target device may be placed in any position relative to the optical device. The target device may be composed of any number of target areas. Electromagnetic radiation energy conversion devices of any type may be placed at the target areas. Multiple types of electromagnetic radiation energy conversion devices may be placed at different target areas on the target device. The electromagnetic radiation energy conversion devices placed at the target areas of the target device may include solar cells, multi-junction solar cells, solar-thermal conversion units, solar-chemical conversion units, solar-mechanical conversion units, and Sterling engines. The electromagnetic radiation energy conversion devices placed at the target areas may be photovoltaic cells including Si, Ge, GaAs, InGaAs, InGaP, GaSb, AlGaInP, InN, CIGS, AlSb, InGaN, AlAs, AlP, InP, GaP, and GaN.

The optical device may be made of one or more of the following materials: plastic transparent to electromagnetic radiation, glass transparent to electromagnetic radiation, acrylic, polycarbonate, flint glass. The optical device may be made of one or more other types of material that are transparent to electromagnetic radiation.

The optical device may be made of materials with a negative index of refraction, such as negative index metamaterials.

The embodiments may include tracking and positioning systems. The tracking systems may use single axis or multiple axis tracking techniques. The tracking systems and positioning systems may use electromagnetic radiation sensors to adjust the position and angle of the optical device, the target device, and their relative position to one another. The tracking systems may adjust the position of the optical device and target device relative to one another.

Results of conversion efficiency simulations and cost analysis of the previously discussed embodiments will now be presented.

A simulation model of the previously discussed embodiments was created and used to derive cell conversion efficiency and module conversion efficiency. The industry standard terrestrial direct normal spectral irradiance ASTM G173 reference spectrum was used to model the electromagnetic radiation incident upon the optical device. The finite width of the sun was taken into account when performing the simulations and the sun was modeled as a uniform disc with an angular width of 0.5 degrees. A target device with five target areas, where each target area contains a photovoltaic cell of a different band gap, was used for the simulation. The simulation models of the five photovoltaic cells, used for the simulation, were obtained from data sheets of cells available from various vendors. The concentrated and dispersed spectrum produced by the optical device and incident upon the target device was used to obtain cell conversion efficiency. Assuming 1× concentration, the cell conversion efficiency of the combination of the optical device and the target device, consisting of five target areas, was simulated to be 41.5%.

Module efficiencies were simulated using standard assumptions of reflectance and absorption of optical materials. Shading losses were eliminated due to the angle of the draft surfaces and surface corner rounding losses were reduced by a factor of two, also due to the angle of the draft surfaces. Additional module losses, including DC losses and cell boundary losses were also modeled. Assuming 1× concentration, the module conversion efficiency of the combination of the optical device and the target device, consisting of five target areas, was simulated to be approximately 35.9%.

The conversion efficiency of photovoltaic cells typically increases with increased concentration of the incident electromagnetic radiation. Concentration in the order of 100× or more are achievable for the embodiments in this patent. Vendors of photovoltaic cells have published data sheets showing that the cell conversion efficiency increases by about 18% for electromagnetic radiation concentrated at 100× compared to 1×. Assuming 100× concentration, the cell conversion efficiency of the combination of the optical device and the target device, consisting of five target areas, was simulated to be approximately 49%. Assuming 100× concentration, the module conversion efficiency of the combination of the optical device and the target device, consisting of five target areas, was simulated to be approximately 42.4%.

The total cost per installed watt of capacity for the previously discussed embodiments can be lower than that of competing technologies. Low cost single junction photovoltaic cells or other energy conversion devices are used adjacent to one another as opposed to expensive multi junction cells. Common manufacturing techniques including, but not limited to injection molding or machining can be used to manufacture the optical device. Additional components, part of the energy conversion system, such as tracking or positioning devices can be obtained off the shelf. These factors all contribute to lowering the cost of the energy conversion system.

A low cost of the components required to build the previously discussed embodiments contributes to a low installed cost per watt. Additionally, the high conversion efficiency further contributes to lowering the installed cost per watt, since an energy conversion system with a higher conversion efficiency outputs more power than an energy conversion system with a lower conversion efficiency. Hence, the ratio of cost to power produced is lower for a system with a higher conversion efficiency than that of an energy conversion system with a lower conversion efficiency.

Additionally, the average cost of producing energy over the lifetime of the previously discussed embodiments may be further reduced by using tracking to maximize the collected energy over a given time period. Tracking contributes to lowering the average cost of producing energy, since an energy conversion system that uses tracking collects more energy over a given time. Hence, the ratio of cost to energy produced may be lower for a system that collects more energy over a given time period than that of an energy conversion system that collects less energy over the same time period.

The invention claimed is:

1. A single optical device for a solar energy conversion system comprising:
a first interface having a curved shape, the first interface being configured to disperse electromagnetic radiation based on wavelength and concentrate electromagnetic radiation; and a second interface having a curved shape, the second interface being configured to disperse electromagnetic radiation based on wavelength and concentrate electromagnetic radiation such that the focal areas of different wavelengths, relative to one another, are not parallel to the electromagnetic radiation that is incident upon the first interface, wherein the first interface and the second interface are configured to concentrate electromagnetic radiation of different wavelengths upon different target areas of a target device, wherein said target areas have different spectral sensitivity, and wherein said target areas are efficient in converting the electromagnetic radiation incident upon them into another form of energy, and wherein the second interface includes a plurality of draft surfaces having corresponding draft angles, the draft angles configured such that substantially no electromagnetic radiation having wavelengths corresponding to the wavelengths that are incident upon the target areas of the target device is incident upon the draft surfaces.

2. The optical device of claim 1, further comprising a plurality of areas formed of optical materials with different Abbe numbers.

3. The optical device of claim 1, further comprising a tracking mechanism configured to track a moving source of electromagnetic radiation.

4. The optical device of claim 1, wherein the electromagnetic radiation is concentrated in two axes.

5. The optical device of claim 1, wherein the second interface comprises a plurality of discontinuous surfaces.

6. The optical device of claim 5, wherein the draft surfaces are formed in between the plurality of discontinuous surfaces.

7. A single optical device for a solar energy conversion system comprising:
a first interface, comprising a plurality of flat surfaces, the plurality of flat surfaces including at least a first surface along a first plane and a second surface along a second plane that intersects the first plane, the first interface being configured to disperse electromagnetic radiation based on wavelength; and
a second interface configured to disperse electromagnetic radiation based on wavelength and concentrate electromagnetic radiation such that the focal areas of different wavelengths, relative to one another, are not parallel to the electromagnetic radiation that is incident upon the first interface, wherein the first interface and the second interface are configured to concentrate electromagnetic radiation of different wavelengths upon different target areas of a target device, wherein said target areas have different spectral sensitivity, and wherein said target areas are efficient in converting the electromagnetic radiation incident upon them into another form of energy, and wherein the second interface includes a plurality of draft surfaces having corresponding draft angles, the draft angles configured such that substantially no electromagnetic radiation having wavelengths corresponding to the wavelengths that are incident upon the target areas of the target device is incident upon the draft surfaces.

8. The optical device of claim 7, further comprising a plurality of areas formed of optical materials with different Abbe numbers.

9. The optical device of claim 7, further comprising a tracking mechanism configured to track a moving source of electromagnetic radiation.

10. The optical device of claim 7, wherein the electromagnetic radiation is concentrated in two axes.

11. The optical device of claim 7, wherein the second interface comprises a plurality of discontinuous surfaces.

12. The optical device of claim 11, wherein the draft surfaces are formed in between the plurality of discontinuous surfaces.

13. A single optical device for a solar energy conversion system comprising:
a first interface; and
a second interface, wherein the first interface and the second interface are configured to disperse electromagnetic radiation based on wavelength and concentrate electromagnetic radiation such that the focal areas of different wavelengths, relative to one another, are not parallel to the electromagnetic radiation that is incident upon the first interface, wherein the second interface comprises a plurality of discontinuous surfaces and a plurality of draft surfaces formed in between the plurality of discontinuous surfaces, the draft surfaces having corresponding draft angles, the draft angles configured such that substantially no electromagnetic radiation of selected wavelengths is incident upon the draft surfaces.

14. The optical device of claim 13, wherein the optical device is configured to concentrate different wavelengths of electromagnetic radiation onto different target areas of a target device, wherein said target areas have different spectral sensitivity and said target areas are efficient in converting the electromagnetic radiation incident upon them into another form of energy.

15. The optical device of claim 13, further comprising a plurality of areas formed of optical materials with different Abbe numbers.

16. The optical device of claim 13, wherein the optical device is made of a material selected from the group consisting of: Acrylic, Polycarbonate, Polystyrene, Cyclo Olefin Copolymer, and flint glass.

17. The optical device of claim 13, further comprising a tracking mechanism configured to track a moving source of electromagnetic radiation.

18. The optical device of claim 17, further comprising a target device positioning unit configured to adjust the position and angle of the target device relative to the optical device, and wherein the tracking mechanism is configured to actively adjust the relative position and angle of the optical device and target device.

19. The optical device of claim 13, wherein electromagnetic radiation is concentrated in two axes.

20. The optical device of claim 13, wherein the first interface has a convex shape selected from the group consisting of curves and a plurality of flat surfaces, the plurality of flat surfaces including at least a first surface along a first plane and second surface along a second plane that intersects the first plane, and wherein the second interface has a concave shape.

* * * * *